United States Patent
Luthra

(10) Patent No.: US 8,630,126 B2
(45) Date of Patent: Jan. 14, 2014

(54) TECHNIQUES FOR REFRESHING A SEMICONDUCTOR MEMORY DEVICE

(75) Inventor: Yogesh Luthra, Chavannes-pres-Renens (CH)

(73) Assignee: Micron Technology, Inc., Boise, ID (US)

( * ) Notice: Subject to any disclaimer, the term of this patent is extended or adjusted under 35 U.S.C. 154(b) by 219 days.

(21) Appl. No.: 13/031,906

(22) Filed: Feb. 22, 2011

(65) Prior Publication Data

US 2011/0273941 A1 Nov. 10, 2011

Related U.S. Application Data

(60) Provisional application No. 61/332,037, filed on May 6, 2010.

(51) Int. Cl.
*G11C 7/00* (2006.01)

(52) U.S. Cl.
USPC .................................................. 365/189.011

(58) Field of Classification Search
USPC .................................................. 365/189.011
See application file for complete search history.

(56) References Cited

U.S. PATENT DOCUMENTS

| | | | |
|---|---|---|---|
| 3,439,214 A | 4/1969 | Kabell | |
| 3,997,799 A | 12/1976 | Baker | |
| 4,032,947 A | 6/1977 | Kesel et al. | |
| 4,250,569 A | 2/1981 | Sasaki et al. | |
| 4,262,340 A | 4/1981 | Sasaki et al. | |
| 4,298,962 A | 11/1981 | Hamano et al. | |
| 4,371,955 A | 2/1983 | Sasaki | |
| 4,527,181 A | 7/1985 | Sasaki | |
| 4,630,089 A | 12/1986 | Sasaki et al. | |
| 4,658,377 A | 4/1987 | McElroy | |
| 4,791,610 A | 12/1988 | Takemae | |
| 4,807,195 A | 2/1989 | Busch et al. | |
| 4,954,989 A | 9/1990 | Auberton-Herve et al. | |
| 4,979,014 A | 12/1990 | Hieda et al. | |

(Continued)

FOREIGN PATENT DOCUMENTS

| CA | 272437 | 7/1927 |
|---|---|---|
| EP | 0 030 856 | 6/1981 |

(Continued)

OTHER PUBLICATIONS

International search report and Written Opinion mailed on Nov. 28, 2011, for International Application No. PCT/US11/034924 filed May 3, 2011 (6 pages).

(Continued)

*Primary Examiner* — Hoai V Ho
*Assistant Examiner* — Pablo Huerta
(74) *Attorney, Agent, or Firm* — Wilmer Cutler Pickering Hale and Dorr LLP

(57) ABSTRACT

Techniques for refreshing a semiconductor memory device are disclosed. In one particular exemplary embodiment, the techniques may be realized as a semiconductor memory device including a plurality of memory cells arranged in an array of rows and columns. Each memory cell may include a first region coupled to a source line and a second region coupled to a carrier injection line. Each memory cell may also include a body region capacitively coupled to at least one word line and disposed between the first region and the second region and a decoupling resistor coupled to at least a portion of the body region.

35 Claims, 15 Drawing Sheets

(56) References Cited

U.S. PATENT DOCUMENTS

| | | | |
|---|---|---|---|
| 5,010,524 | A | 4/1991 | Fifield et al. |
| 5,144,390 | A | 9/1992 | Matloubian |
| 5,164,805 | A | 11/1992 | Lee |
| 5,258,635 | A | 11/1993 | Nitayama et al. |
| 5,313,432 | A | 5/1994 | Lin et al. |
| 5,315,541 | A | 5/1994 | Harari et al. |
| 5,350,938 | A | 9/1994 | Matsukawa et al. |
| 5,355,330 | A | 10/1994 | Hisamoto et al. |
| 5,388,068 | A | 2/1995 | Ghoshal et al. |
| 5,397,726 | A | 3/1995 | Bergemont et al. |
| 5,432,730 | A | 7/1995 | Shubat et al. |
| 5,446,299 | A | 8/1995 | Acovic et al. |
| 5,448,513 | A | 9/1995 | Hu et al. |
| 5,466,625 | A | 11/1995 | Hsieh et al. |
| 5,489,792 | A | 2/1996 | Hu et al. |
| 5,506,436 | A | 4/1996 | Hayashi et al. |
| 5,515,383 | A | 5/1996 | Katoozi |
| 5,526,307 | A | 6/1996 | Yiu et al. |
| 5,528,062 | A | 6/1996 | Hsieh et al. |
| 5,568,356 | A | 10/1996 | Schwartz |
| 5,583,808 | A | 12/1996 | Brahmbhatt |
| 5,593,912 | A | 1/1997 | Rajeevakumar |
| 5,606,188 | A | 2/1997 | Bronner et al. |
| 5,608,250 | A | 3/1997 | Kalnitsky |
| 5,627,092 | A | 5/1997 | Alsmeier et al. |
| 5,631,186 | A | 5/1997 | Park et al. |
| 5,677,867 | A | 10/1997 | Hazani |
| 5,696,718 | A | 12/1997 | Hartmann |
| 5,740,099 | A | 4/1998 | Tanigawa |
| 5,754,469 | A | 5/1998 | Hung et al. |
| 5,774,411 | A | 6/1998 | Hsieh et al. |
| 5,778,243 | A | 7/1998 | Aipperspach et al. |
| 5,780,906 | A | 7/1998 | Wu et al. |
| 5,784,311 | A | 7/1998 | Assaderaghi et al. |
| 5,798,968 | A | 8/1998 | Lee et al. |
| 5,811,283 | A | 9/1998 | Sun |
| 5,847,411 | A | 12/1998 | Morii |
| 5,877,978 | A | 3/1999 | Morishita et al. |
| 5,886,376 | A | 3/1999 | Acovic et al. |
| 5,886,385 | A | 3/1999 | Arisumi et al. |
| 5,897,351 | A | 4/1999 | Forbes |
| 5,929,479 | A | 7/1999 | Oyama |
| 5,930,648 | A | 7/1999 | Yang |
| 5,936,265 | A | 8/1999 | Koga |
| 5,939,745 | A | 8/1999 | Park et al. |
| 5,943,258 | A | 8/1999 | Houston et al. |
| 5,943,581 | A | 8/1999 | Lu et al. |
| 5,960,265 | A | 9/1999 | Acovic et al. |
| 5,968,840 | A | 10/1999 | Park et al. |
| 5,977,578 | A | 11/1999 | Tang |
| 5,982,003 | A | 11/1999 | Hu et al. |
| 5,986,914 | A | 11/1999 | McClure |
| 6,018,172 | A | 1/2000 | Hidaka et al. |
| 6,048,756 | A | 4/2000 | Lee et al. |
| 6,081,443 | A | 6/2000 | Morishita |
| 6,096,598 | A | 8/2000 | Furukawa et al. |
| 6,097,056 | A | 8/2000 | Hsu et al. |
| 6,097,624 | A | 8/2000 | Chung et al. |
| 6,111,778 | A | 8/2000 | MacDonald et al. |
| 6,121,077 | A | 9/2000 | Hu et al. |
| 6,133,597 | A | 10/2000 | Li et al. |
| 6,157,216 | A | 12/2000 | Lattimore et al. |
| 6,171,923 | B1 | 1/2001 | Chi et al. |
| 6,177,300 | B1 | 1/2001 | Houston et al. |
| 6,177,698 | B1 | 1/2001 | Gruening et al. |
| 6,177,708 | B1 | 1/2001 | Kuang et al. |
| 6,214,694 | B1 | 4/2001 | Leobandung et al. |
| 6,222,217 | B1 | 4/2001 | Kunikiyo |
| 6,225,158 | B1 | 5/2001 | Furukawa et al. |
| 6,245,613 | B1 | 6/2001 | Hsu et al. |
| 6,252,281 | B1 | 6/2001 | Yamamoto et al. |
| 6,262,935 | B1 | 7/2001 | Parris et al. |
| 6,292,424 | B1 | 9/2001 | Ohsawa |
| 6,297,090 | B1 | 10/2001 | Kim |
| 6,300,649 | B1 | 10/2001 | Hu et al. |
| 6,320,227 | B1 | 11/2001 | Lee et al. |
| 6,333,532 | B1 | 12/2001 | Davari et al. |
| 6,333,866 | B1 | 12/2001 | Ogata |
| 6,350,653 | B1 | 2/2002 | Adkisson et al. |
| 6,351,426 | B1 | 2/2002 | Ohsawa |
| 6,359,802 | B1 | 3/2002 | Lu et al. |
| 6,384,445 | B1 | 5/2002 | Hidaka et al. |
| 6,391,658 | B1 | 5/2002 | Gates et al. |
| 6,403,435 | B1 | 6/2002 | Kang et al. |
| 6,421,269 | B1 | 7/2002 | Somasekhar et al. |
| 6,424,011 | B1 | 7/2002 | Assaderaghi et al. |
| 6,424,016 | B1 | 7/2002 | Houston |
| 6,429,477 | B1 | 8/2002 | Mandelman et al. |
| 6,432,769 | B1 | 8/2002 | Fukuda et al. |
| 6,440,872 | B1 | 8/2002 | Mandelman et al. |
| 6,441,435 | B1 | 8/2002 | Chan |
| 6,441,436 | B1 | 8/2002 | Wu et al. |
| 6,466,511 | B2 | 10/2002 | Fujita et al. |
| 6,479,862 | B1 | 11/2002 | King et al. |
| 6,480,407 | B1 | 11/2002 | Keeth |
| 6,492,211 | B1 | 12/2002 | Divakaruni et al. |
| 6,518,105 | B1 | 2/2003 | Yang et al. |
| 6,531,754 | B1 | 3/2003 | Nagano et al. |
| 6,537,871 | B2 | 3/2003 | Forbes |
| 6,538,916 | B2 | 3/2003 | Ohsawa |
| 6,544,837 | B1 | 4/2003 | Divakauni et al. |
| 6,548,848 | B2 | 4/2003 | Horiguchi et al. |
| 6,549,450 | B1 | 4/2003 | Hsu et al. |
| 6,552,398 | B2 | 4/2003 | Hsu et al. |
| 6,552,932 | B2 | 4/2003 | Cernea |
| 6,556,477 | B2 | 4/2003 | Hsu et al. |
| 6,560,142 | B1 | 5/2003 | Ando |
| 6,563,733 | B2 | 5/2003 | Liu et al. |
| 6,566,177 | B1 | 5/2003 | Radens et al. |
| 6,567,330 | B2 | 5/2003 | Fujita et al. |
| 6,573,566 | B2 | 6/2003 | Ker et al. |
| 6,574,135 | B1 | 6/2003 | Komatsuzaki |
| 6,590,258 | B2 | 7/2003 | Divakauni et al. |
| 6,590,259 | B2 | 7/2003 | Adkisson et al. |
| 6,617,651 | B2 | 9/2003 | Ohsawa |
| 6,621,725 | B2 | 9/2003 | Ohsawa |
| 6,632,723 | B2 | 10/2003 | Watanabe et al. |
| 6,650,565 | B1 | 11/2003 | Ohsawa |
| 6,653,175 | B1 | 11/2003 | Nemati et al. |
| 6,686,624 | B2 | 2/2004 | Hsu |
| 6,703,673 | B2 | 3/2004 | Houston |
| 6,707,118 | B2 | 3/2004 | Muljono et al. |
| 6,714,436 | B1 | 3/2004 | Burnett et al. |
| 6,721,222 | B2 | 4/2004 | Somasekhar et al. |
| 6,825,524 | B1 | 11/2004 | Ikehashi et al. |
| 6,861,689 | B2 | 3/2005 | Burnett |
| 6,870,225 | B2 | 3/2005 | Bryant et al. |
| 6,882,566 | B2 | 4/2005 | Nejad et al. |
| 6,888,770 | B2 | 5/2005 | Ikehashi |
| 6,894,913 | B2 | 5/2005 | Yamauchi |
| 6,897,098 | B2 | 5/2005 | Hareland et al. |
| 6,903,984 | B1 | 6/2005 | Tang et al. |
| 6,909,151 | B2 | 6/2005 | Hareland et al. |
| 6,912,150 | B2 | 6/2005 | Portmann et al. |
| 6,913,964 | B2 | 7/2005 | Hsu |
| 6,936,508 | B2 | 8/2005 | Visokay et al. |
| 6,967,358 | B2 | 11/2005 | Nemati et al. |
| 6,969,662 | B2 | 11/2005 | Fazan et al. |
| 6,975,536 | B2 | 12/2005 | Maayan et al. |
| 6,982,902 | B2 | 1/2006 | Gogl et al. |
| 6,987,041 | B2 | 1/2006 | Ohkawa |
| 7,030,436 | B2 | 4/2006 | Forbes |
| 7,037,790 | B2 | 5/2006 | Chang et al. |
| 7,041,538 | B2 | 5/2006 | Ieong et al. |
| 7,042,765 | B2 | 5/2006 | Sibigtroth et al. |
| 7,061,806 | B2 | 6/2006 | Tang et al. |
| 7,085,153 | B2 | 8/2006 | Ferrant et al. |
| 7,085,156 | B2 | 8/2006 | Ferrant et al. |
| 7,170,807 | B2 | 1/2007 | Fazan et al. |
| 7,177,175 | B2 | 2/2007 | Fazan et al. |
| 7,187,581 | B2 | 3/2007 | Ferrant et al. |
| 7,195,959 | B1 * | 3/2007 | Plummer et al. ............... 438/133 |
| 7,209,384 | B1 | 4/2007 | Kim |
| 7,230,846 | B2 | 6/2007 | Keshavarzi et al. |

(56) References Cited

U.S. PATENT DOCUMENTS

| | | | |
|---|---|---|---|
| 7,233,024 B2 | 6/2007 | Scheuerlein et al. | |
| 7,256,459 B2 | 8/2007 | Shino | |
| 7,301,803 B2 | 11/2007 | Okhonin et al. | |
| 7,301,838 B2 | 11/2007 | Waller | |
| 7,317,641 B2 | 1/2008 | Scheuerlein | |
| 7,324,387 B1 | 1/2008 | Bergemont et al. | |
| 7,335,934 B2 | 2/2008 | Fazan | |
| 7,341,904 B2 | 3/2008 | Willer | |
| 7,416,943 B2 | 8/2008 | Figura et al. | |
| 7,456,439 B1 | 11/2008 | Horch | |
| 7,477,540 B2 | 1/2009 | Okhonin et al. | |
| 7,492,632 B2 | 2/2009 | Carman | |
| 7,517,744 B2 | 4/2009 | Mathew et al. | |
| 7,539,041 B2 | 5/2009 | Kim et al. | |
| 7,542,340 B2 | 6/2009 | Fisch et al. | |
| 7,542,345 B2 | 6/2009 | Okhonin et al. | |
| 7,545,694 B2 | 6/2009 | Srinivasa Raghavan et al. | |
| 7,606,066 B2 | 10/2009 | Okhonin et al. | |
| 7,696,032 B2 | 4/2010 | Kim et al. | |
| 7,894,256 B1 * | 2/2011 | Nemati et al. | 365/180 |
| 8,139,418 B2 | 3/2012 | Carman | |
| 8,315,099 B2 * | 11/2012 | Van Buskirk et al. | 365/185.18 |
| 2001/0055859 A1 | 12/2001 | Yamada et al. | |
| 2002/0030214 A1 | 3/2002 | Horiguchi | |
| 2002/0034855 A1 | 3/2002 | Horiguchi et al. | |
| 2002/0036322 A1 | 3/2002 | Divakauni et al. | |
| 2002/0051378 A1 | 5/2002 | Ohsawa | |
| 2002/0064913 A1 | 5/2002 | Adkisson et al. | |
| 2002/0070411 A1 | 6/2002 | Vermandel et al. | |
| 2002/0072155 A1 | 6/2002 | Liu et al. | |
| 2002/0076880 A1 | 6/2002 | Yamada et al. | |
| 2002/0086463 A1 | 7/2002 | Houston et al. | |
| 2002/0089038 A1 | 7/2002 | Ning | |
| 2002/0098643 A1 | 7/2002 | Kawanaka et al. | |
| 2002/0110018 A1 | 8/2002 | Ohsawa | |
| 2002/0114191 A1 | 8/2002 | Iwata et al. | |
| 2002/0130341 A1 | 9/2002 | Horiguchi et al. | |
| 2002/0160581 A1 | 10/2002 | Watanabe et al. | |
| 2002/0180069 A1 | 12/2002 | Houston | |
| 2003/0003608 A1 | 1/2003 | Arikado et al. | |
| 2003/0015757 A1 | 1/2003 | Ohsawa | |
| 2003/0035324 A1 | 2/2003 | Fujita et al. | |
| 2003/0042516 A1 | 3/2003 | Forbes et al. | |
| 2003/0047784 A1 | 3/2003 | Matsumoto et al. | |
| 2003/0057487 A1 | 3/2003 | Yamada et al. | |
| 2003/0057490 A1 | 3/2003 | Nagano et al. | |
| 2003/0102497 A1 | 6/2003 | Fried et al. | |
| 2003/0112659 A1 | 6/2003 | Ohsawa | |
| 2003/0123279 A1 | 7/2003 | Aipperspach et al. | |
| 2003/0146474 A1 | 8/2003 | Ker et al. | |
| 2003/0146488 A1 | 8/2003 | Nagano et al. | |
| 2003/0151112 A1 | 8/2003 | Yamada et al. | |
| 2003/0231521 A1 | 12/2003 | Ohsawa | |
| 2004/0021137 A1 | 2/2004 | Fazan et al. | |
| 2004/0021179 A1 | 2/2004 | Lee | |
| 2004/0029335 A1 | 2/2004 | Lee et al. | |
| 2004/0075143 A1 | 4/2004 | Bae et al. | |
| 2004/0108532 A1 | 6/2004 | Forbes et al. | |
| 2004/0188714 A1 | 9/2004 | Scheuerlein et al. | |
| 2004/0217420 A1 | 11/2004 | Yeo et al. | |
| 2005/0001257 A1 | 1/2005 | Schloesser et al. | |
| 2005/0001269 A1 | 1/2005 | Hayashi et al. | |
| 2005/0017240 A1 | 1/2005 | Fazan | |
| 2005/0047240 A1 | 3/2005 | Ikehashi et al. | |
| 2005/0062088 A1 | 3/2005 | Houston | |
| 2005/0063224 A1 | 3/2005 | Fazan et al. | |
| 2005/0064659 A1 | 3/2005 | Willer | |
| 2005/0105342 A1 | 5/2005 | Tang et al. | |
| 2005/0111255 A1 | 5/2005 | Tang et al. | |
| 2005/0121710 A1 | 6/2005 | Shino | |
| 2005/0135169 A1 | 6/2005 | Somasekhar et al. | |
| 2005/0141262 A1 | 6/2005 | Yamada et al. | |
| 2005/0141290 A1 | 6/2005 | Tang et al. | |
| 2005/0145886 A1 | 7/2005 | Keshavarzi et al. | |
| 2005/0145935 A1 | 7/2005 | Keshavarzi et al. | |
| 2005/0167751 A1 | 8/2005 | Nakajima et al. | |
| 2005/0189576 A1 | 9/2005 | Ohsawa | |
| 2005/0208716 A1 | 9/2005 | Takaura et al. | |
| 2005/0226070 A1 | 10/2005 | Ohsawa | |
| 2005/0232043 A1 | 10/2005 | Ohsawa | |
| 2005/0242396 A1 | 11/2005 | Park et al. | |
| 2005/0265107 A1 | 12/2005 | Tanaka | |
| 2006/0011940 A1 * | 1/2006 | Nemati et al. | 257/133 |
| 2006/0043484 A1 | 3/2006 | Cabral et al. | |
| 2006/0084247 A1 | 4/2006 | Liu | |
| 2006/0091462 A1 | 5/2006 | Okhonin et al. | |
| 2006/0098481 A1 | 5/2006 | Okhonin et al. | |
| 2006/0126374 A1 | 6/2006 | Waller et al. | |
| 2006/0131650 A1 | 6/2006 | Okhonin et al. | |
| 2006/0223302 A1 | 10/2006 | Chang et al. | |
| 2006/0279985 A1 | 12/2006 | Keshavarzi et al. | |
| 2007/0008811 A1 | 1/2007 | Keeth et al. | |
| 2007/0023833 A1 | 2/2007 | Okhonin et al. | |
| 2007/0045709 A1 | 3/2007 | Yang | |
| 2007/0058427 A1 | 3/2007 | Okhonin et al. | |
| 2007/0064489 A1 | 3/2007 | Bauser | |
| 2007/0085140 A1 | 4/2007 | Bassin | |
| 2007/0097751 A1 | 5/2007 | Popoff et al. | |
| 2007/0114599 A1 | 5/2007 | Hshieh | |
| 2007/0133330 A1 | 6/2007 | Ohsawa | |
| 2007/0138524 A1 | 6/2007 | Kim et al. | |
| 2007/0138530 A1 | 6/2007 | Okhonin | |
| 2007/0187751 A1 | 8/2007 | Hu et al. | |
| 2007/0187775 A1 | 8/2007 | Okhonin et al. | |
| 2007/0200176 A1 | 8/2007 | Kammler et al. | |
| 2007/0211535 A1 | 9/2007 | Kim | |
| 2007/0252205 A1 | 11/2007 | Hoentschel et al. | |
| 2007/0263466 A1 | 11/2007 | Morishita et al. | |
| 2007/0278578 A1 | 12/2007 | Yoshida | |
| 2008/0049486 A1 | 2/2008 | Gruening-von Schwerin | |
| 2008/0083949 A1 | 4/2008 | Zhu et al. | |
| 2008/0099808 A1 | 5/2008 | Burnett et al. | |
| 2008/0130379 A1 | 6/2008 | Ohsawa | |
| 2008/0133849 A1 | 6/2008 | Demi et al. | |
| 2008/0165577 A1 | 7/2008 | Fazan et al. | |
| 2008/0253179 A1 | 10/2008 | Slesazeck | |
| 2008/0258206 A1 | 10/2008 | Hofmann | |
| 2009/0080244 A1 | 3/2009 | Carman et al. | |
| 2009/0086535 A1 | 4/2009 | Ferrant et al. | |
| 2009/0121269 A1 | 5/2009 | Caillat et al. | |
| 2009/0127592 A1 | 5/2009 | El-Kareh et al. | |
| 2009/0201723 A1 | 8/2009 | Okhonin et al. | |
| 2010/0008164 A1 * | 1/2010 | Murayama et al. | 365/189.011 |
| 2010/0085813 A1 | 4/2010 | Shino | |
| 2010/0091586 A1 | 4/2010 | Carman | |
| 2010/0110816 A1 | 5/2010 | Nautiyal et al. | |
| 2010/0259964 A1 * | 10/2010 | Van Buskirk et al. | 365/63 |
| 2010/0271858 A1 | 10/2010 | Carman et al. | |
| 2010/0271880 A1 * | 10/2010 | Carman | 365/185.18 |
| 2011/0089419 A1 * | 4/2011 | Yamazaki et al. | 257/43 |
| 2012/0275215 A1 * | 11/2012 | Tsukada et al. | 365/149 |

FOREIGN PATENT DOCUMENTS

| | | |
|---|---|---|
| EP | 0 350 057 | 1/1990 |
| EP | 0 354 348 | 2/1990 |
| EP | 0 202 515 | 3/1991 |
| EP | 0 207 619 | 8/1991 |
| EP | 0 175 378 | 11/1991 |
| EP | 0 253 631 | 4/1992 |
| EP | 0 513 923 | 11/1992 |
| EP | 0 300 157 | 5/1993 |
| EP | 0 564 204 | 10/1993 |
| EP | 0 579 566 | 1/1994 |
| EP | 0 362 961 | 2/1994 |
| EP | 0 599 506 | 6/1994 |
| EP | 0 359 551 | 12/1994 |
| EP | 0 366 882 | 5/1995 |
| EP | 0 465 961 | 8/1995 |
| EP | 0 694 977 | 1/1996 |
| EP | 0 333 426 | 7/1996 |
| EP | 0 727 820 | 8/1996 |
| EP | 0 739 097 | 10/1996 |
| EP | 0 245 515 | 4/1997 |

(56) References Cited

FOREIGN PATENT DOCUMENTS

| | | |
|---|---|---|
| EP | 0 788 165 | 8/1997 |
| EP | 0 801 427 | 10/1997 |
| EP | 0 510 607 | 2/1998 |
| EP | 0 537 677 | 8/1998 |
| EP | 0 858 109 | 8/1998 |
| EP | 0 860 878 | 8/1998 |
| EP | 0 869 511 | 10/1998 |
| EP | 0 878 804 | 11/1998 |
| EP | 0 920 059 | 6/1999 |
| EP | 0 924 766 | 6/1999 |
| EP | 0 642 173 | 7/1999 |
| EP | 0 727 822 | 8/1999 |
| EP | 0 933 820 | 8/1999 |
| EP | 0 951 072 | 10/1999 |
| EP | 0 971 360 | 1/2000 |
| EP | 0 980 101 | 2/2000 |
| EP | 0 601 590 | 4/2000 |
| EP | 0 993 037 | 4/2000 |
| EP | 0 836 194 | 5/2000 |
| EP | 0 599 388 | 8/2000 |
| EP | 0 689 252 | 8/2000 |
| EP | 0 606 758 | 9/2000 |
| EP | 0 682 370 | 9/2000 |
| EP | 1 073 121 | 1/2001 |
| EP | 0 726 601 | 9/2001 |
| EP | 0 731 972 | 11/2001 |
| EP | 1 162 663 | 12/2001 |
| EP | 1 162 744 | 12/2001 |
| EP | 1 179 850 | 2/2002 |
| EP | 1 180 799 | 2/2002 |
| EP | 1 191 596 | 3/2002 |
| EP | 1 204 146 | 5/2002 |
| EP | 1 204 147 | 5/2002 |
| EP | 1 209 747 | 5/2002 |
| EP | 0 744 772 | 8/2002 |
| EP | 1 233 454 | 8/2002 |
| EP | 0 725 402 | 9/2002 |
| EP | 1 237 193 | 9/2002 |
| EP | 1 241 708 | 9/2002 |
| EP | 1 253 634 | 10/2002 |
| EP | 0 844 671 | 11/2002 |
| EP | 1 280 205 | 1/2003 |
| EP | 1 288 955 | 3/2003 |
| FR | 2 197 494 | 3/1974 |
| GB | 1 414 228 | 11/1975 |
| JP | H04-176163 A | 6/1922 |
| JP | 55-038664 | 3/1980 |
| JP | S62-007149 A | 1/1987 |
| JP | S62-272561 | 11/1987 |
| JP | 02-294076 | 12/1990 |
| JP | 03-171768 | 7/1991 |
| JP | 05-347419 | 12/1993 |
| JP | 08-213624 | 8/1996 |
| JP | H08-213624 A | 8/1996 |
| JP | 08-274277 | 10/1996 |
| JP | H08-316337 A | 11/1996 |
| JP | 09-046688 | 2/1997 |
| JP | 09-082912 | 3/1997 |
| JP | 10-242470 | 9/1998 |
| JP | 11-087649 | 3/1999 |
| JP | 2000-247735 A | 8/2000 |
| JP | 12-274221 A | 9/2000 |
| JP | 12-389106 A | 12/2000 |
| JP | 13-180633 A | 6/2001 |
| JP | 2002-009081 | 1/2002 |
| JP | 2002-083945 | 3/2002 |
| JP | 2002-094027 | 3/2002 |
| JP | 2002-176154 | 6/2002 |
| JP | 2002-246571 | 8/2002 |
| JP | 2002-329795 | 11/2002 |
| JP | 2002-343886 | 11/2002 |
| JP | 2002-353080 | 12/2002 |
| JP | 2003-031693 | 1/2003 |
| JP | 2003-68877 A | 3/2003 |
| JP | 2003-086712 | 3/2003 |
| JP | 2003-100641 | 4/2003 |
| JP | 2003-100900 | 4/2003 |
| JP | 2003-132682 | 5/2003 |
| JP | 2003-203967 | 7/2003 |
| JP | 2003-243528 | 8/2003 |
| JP | 2004-335553 | 11/2004 |
| WO | WO 01/24268 | 4/2001 |
| WO | WO 2005/008778 | 1/2005 |

OTHER PUBLICATIONS

International search report and Written Opinion mailed on Dec. 19, 2011, for International Application No. PCT/US11/034937 filed May 3, 2011 (6 pages).

Arimoto et al., A Configurable Enhanced T2RAM Macro for System-Level Power Management Unified Memory, 2006, VLSI Symposium.

Arimoto, A High-Density Scalable Twin Transistor RAM (TTRAM) With Verify Control for SOI Platform Memory IPs, Nov. 2007, Solid-State Circuits.

Asian Technology Information Program (ATIP) Scoops™, "Novel Capacitorless 1T-DRAM From Single-Gate PD-SOI to Double-Gate FinDRAM", May 9, 2005, 9 pages.

Assaderaghi et al., "A Dynamic Threshold Voltage MOSFET (DTMOS) for Ultra-Low Voltage Operation", IEEE IEDM, 1994, pp. 809-812.

Assaderaghi et al., "A Dynamic Threshold Voltage MOSFET (DTMOS) for Very Low Voltage Operation", IEEE Electron Device Letters, vol. 15, No. 12, Dec. 1994, pp. 510-512.

Assaderaghi et al., "A Novel Silicon-On-Insulator (SOI) MOSFET for Ultra Low Voltage Operation", 1994 IEEE Symposium on Low Power Electronics, pp. 58-59.

Assaderaghi et al., "Dynamic Threshold-Voltage MOSFET (DTMOS) for Ultra-Low Voltage VLSI", IEEE Transactions on Electron Devices, vol. 44, No. 3, Mar. 1997, pp. 414-422.

Assaderaghi et al., "High-Field Transport of Inversion-Layer Electrons and Holes Including Velocity Overshoot", IEEE Transactions on Electron Devices, vol. 44, No. 4, Apr. 1997, pp. 664-671.

Avci, Floating Body Cell (FBC) Memory for 16-nm Technology with Low Variation on Thin Silicon and 10-nm BOX, Oct. 2008, SOI Conference.

Bae, Evaluation of 1T RAM using Various Operation Methods with SOONO (Silicon-On-ONO) device, Dec. 2008, IEDM.

Ban et al., Integration of Back-Gate Doping for 15-nm Node Floating Body Cell (FBC) Memory, Components Research, Process Technology Modeling, presented in the 2010 VLSI Symposium on Jun. 17, 2010.

Ban, A Scaled Floating Body Cell (FBC) Memory with High-k+Metal Gate on Thin-Silicon and Thin-BOX for 16-nm Technology Node and Beyond, Jun. 2008, VLSI Symposium.

Ban, Ibrahim, et al., "Floating Body Cell with Independently-Controlled Double Gates for High Density Memory," Electron Devices Meeting, 2006. IEDM '06, International, IEEE, Dec. 11-13, 2006.

Bawedin, Maryline, et al., A Capacitorless 1T Dram on SOI Based on Dynamic Coupling and Double-Gate Operation, IEEE Electron Device Letters, vol. 29, No. 7, Jul. 2008.

Blagojevic et al., Capacitorless 1T DRAM Sensing Scheme Automatice Reference Generation, 2006, IEEE J.Solid State Circuits.

Blalock, T., "A High-Speed Clamped Bit-Line Current-Mode Sense Amplifier", IEEE Journal of Solid-State Circuits, vol. 26, No. 4, Apr. 1991, pp. 542-548.

Butt, Scaling Limits of Double Gate and Surround Gate Z-RAM Cells, 2007, IEEE Trans. on El. Dev.

Chan et al., "Effects of Floating Body on Double Polysilicon Partially Depleted SOI Nonvolatile Memory Cell", IEEE Electron Device Letters, vol. 24, No. 2, Feb. 2003, pp. 75-77.

Chan, et al., "SOI MOSFET Design for All-Dimensional Scaling with Short Channel, Narrow Width and Ultra-thin Films", IEEE IEDM, 1995, pp. 631-634.

Chi et al., "Programming and Erase with Floating-Body for High Density Low Voltage Flash EEPROM Fabricated on SOI Wafers", Proceedings 1995 IEEE International SOI Conference, Oct. 1995, pp. 129-130.

(56) References Cited

OTHER PUBLICATIONS

Cho et al., "Novel DRAM Cell with Amplified Capacitor for Embedded Application", IEEE, Jun. 2009.
Cho, A novel capacitor-less DRAM cell using Thin Capacitively-Coupled Thyristor (TCCT), 2005, IEDM.
Choi et al., Current Flow Mechanism in Schottky-Barrier MOSFET and Application to the 1T-DRAM, 2008, SSDM.
Choi, High Speed Flash Memory and 1T-DRAM on Dopant Segregated Schottky Barrier (DSSB) FinFET SONOS Device for Multi-functional SoC Applications, Dec. 2008, IEDM.
Clarke, Junctionless Transistors Could Simply Chip Making, Say Researchers, EE Times, Feb. 2010, www.eetimes.com/showArticle.jhtml?articleID=223100050.
Colinge, J.P., "An SOI voltage-controlled bipolar-MOS device", IEEE Transactions on Electron Devices, vol. ED-34, No. 4, Apr. 1987, pp. 845-849.
Colinge, Nanowire Transistors Without Junctions, Nature NanoTechnology, vol. 5, 2010, pp. 225-229.
Collaert et al., Optimizing the Readout Bias for the Capacitorless 1T Bulk FinFET RAM Cell, 2009, IEEE EDL.
Collaert, Comparison of scaled floating body RAM architectures, Oct. 2008, SOI Conference.
Ershov, Optimization of Substrate Doping for Back-Gate Control in SOI T-RAM Memory Technology, 2005, SOI Conference.
Ertosun et al., A Highly Scalable Capacitorless Double Gate Quantum Well Single Transistor DRAM: 1T-QW DRAM, 2008, IEEE EDL.
Fazan et al., "A Simple 1-Transistor Capacitor-Less Memory Cell for High Performance Embedded DRAMs", IEEE 2002 Custom Integrated Circuits Conference, Jun. 2002, pp. 99-102.
Fazan, A Highly Manufacturable Capacitor-less 1T-DRAM Concept, 2002, SPIE.
Fazan, et al., "Capacitor-Less 1-Transistor DRAM", 2002 IEEE International SOI Conference, Oct. 2002, pp. 10-13.
Fazan, P., "MOSFET Design Simplifies DRAM", EE Times, May 14, 2002 (3 pages).
Fisch, Beffa, Bassin, Soft Error Performance of Z-RAM Floating Body Memory, 2006, SOI Conference.
Fisch, Carman, Customizing SOI Floating Body Memory Architecture for System Performance and Lower Cost, 2006, SAME.
Fisch, Z-Ram® Ultra-Dense Memory for 90nm and Below, 2006, Hot Chips.
Fossum et al., New Insights on Capacitorless Floating Body DRAM Cells, 2007, IEEE EDL.
Fujita, Array Architectureof Floating Body Cell (FBC) with Quasi-Shielded Open Bit Line Scheme for sub-40nm Node, 2008, SOI Conference.
Furuhashi, Scaling Scenario of Floating Body Cell (FBC) Suppressing Vth Variation Due to Random Dopant Fluctuation, Dec. 2008, SOI Conference.
Furuyama et al., "An Experimental 2-bit/Cell Storage DRAM for Macrocell or Memory-on-Logic Application", IEEE Journal of Solid-State Circuits, vol. 24, No. 2, Apr. 1989, pp. 388-393.
Giffard et al., "Dynamic Effects in SOI MOSFET's", IEEE, 1991, pp. 160-161.
Gupta et al., SPICE Modeling of Self Sustained Operation (SSO) to Program Sub-90nm Floating Body Cells, Oct. 2009, Conf on Simulation of Semiconductor Processes & Devices.
Han et al., Bulk FinFET Unified-RAM (URAM) Cell for Multifunctioning NVM and Capacitorless 1T-DRAM, 2008, IEEE EDL.
Han et al., Partially Depleted SONOS FinFET for Unified RAM (URAM) Unified Function for High-Speed 1T DRAM and Nonvolatile Memory, 2008, IEEE EDL.
Han, Energy Band Engineered Unified-RAM (URAM) for Multi-Functioning 1T-DRAM and NVM, Dec. 2008, IEDM.
Han, Parasitic BJT Read Method for High-Performance Capacitorless 1T-DRAM Mode in Unified RAM, Oct. 2009, IEEE EDL.
Hara, Y., "Toshiba's DRAM Cell Piggybacks on SOI Wafer", EE Times, Jun. 2003.

Hu, C., "SOI (Silicon-on-Insulator) for High Speed Ultra Large Scale Integration", Jpn. J. Appl. Phys. vol. 33 (1994) pp. 365-369, Part 1, No. 1B, Jan. 1994.
Idei et al., "Soft-Error Characteristics in Bipolar Memory Cells with Small Critical Charge", IEEE Transactions on Electron Devices, vol. 38, No. 11, Nov. 1991, pp. 2465-2471.
Ikeda et al., "3-Dimensional Simulation of Turn-off Current in Partially Depleted SOI MOSFETs", IEIC Technical Report, Institute of Electronics, Information and Communication Engineers, 1998, vol. 97, No. 557 (SDM97 186-198), pp. 27-34.
Inoh et al., "FBC (Floating Body Cell) for Embedded DRAM on SOI", 2003 Symposium on VLSI Circuits Digest of Technical Papers, Jun. 2003 (2 pages).
Iyer et al., "SOI MOSFET on Low Cost SPIMOX Substrate", IEEE IEDM, Sep. 1998, pp. 1001-1004.
Jang et al., Highly scalable Z-RAM with remarkably long data retention for DRAM application, Jun. 2009, VLSI.
Jeong et al., "A Capacitor-less 1T DRAM Cell Based on a Surrounding Gate MOSFET with Vertical Channel", Technology Development Team, Technology Development Team, Samsung Electronics Co., Ltd., May 2007.
Jeong et al., "A New Capacitorless 1T DRAm Cell: Surrounding Gate MOSFET with Vertical Channel (SGVC Cell)", IEEE Transactions on Nanotechnology, vol. 6, No. 3, May 2007.
Jeong et al., "Capacitorless DRAM Cell with Highly Scalable Surrounding Gate Structure", Extended Abstracts of the 2006 International Conference on Solid State Devices and Materials, pp. 574-575, Yokohama (2006).
Jeong et al., "Capacitorless Dynamic Random Access Memory Cell with Highly Scalable Surrounding Gate Structure", Japanese Journal of Applied Physics, vol. 46, No. 4B, pp. 2143-2147 (2007).
Kedzierski, J.; "Design Analysis of Thin-Body Silicide Source/Drain Devices", 2001 IEEE International SOI Conference, Oct. 2001, pp. 21-22.
Kim et al., "Chip Level Reliability on SOI Embedded Memory", Proceedings 1998 IEEE International SOI Conference, Oct. 1998, pp. 135-139.
Kuo et al., "A Capacitorless Double-Gate DRAM Cell Design for High Density Applications", IEEE IEDM, Feb. 2002, pp. 843-846.
Kuo et al., "A Capacitorless Double-Gate DRAM Cell", IEEE Electron Device Letters, vol. 23, No. 6, Jun. 2002, pp. 345-347.
Kuo et al., A Capacitorless Double Gate DRAM Technology for Sub 100 nm Embedded and Stand Alone Memory Applications, 2003, IEEE Trans. on El. Dev.
Kwon et al., "A Highly Scalable 4F2 DRAm Cell Utilizing a Doubly Gated Vertical Channel", Extended Abstracts of the 2009 International Conference on Solid State Devices and Materials, UC Berkley, pp. 142-143 Sendai (2009).
Lee et al., "A Novel Pattern Transfer Process for Bonded SOI Gigabit DRAMs", Proceedings 1996 IEEE International SOI Conference, Oct. 1996, pp. 114-115.
Leiss et al., dRAM Design Using the Taper-Isolated Dynamic RAM Cell, IEEE Transactions on Electron Devices, vol. ED-29, No. 4, Apr. 1982, pp. 707-714.
Lin et al., "Opposite Side Floating Gate SOI FLASH Memory Cell", IEEE, Mar. 2000, pp. 12-15.
Liu et al., Surface Generation-Recombination Processes of Gate and STI Oxide Interfaces Responsible for Junction Leakage on SOI, Sep. 2009, ECS Transactions, vol. 25.
Liu, Surface Recombination-Generation Processes of Gate, STI and Buried Oxide Interfaces, Responsible for Junction Leakage, ICSI, May 19, 2009.
Lončar et al., "One of Application of SOI Memory Cell—Memory Array", IEEE Proc. 22nd International Conference on Microelectronics (MIEL 2000), vol. 2, NIS, Serbia, May 14-17, 2000, pp. 455-458.
Lu et al., A Novel Two-Transistor Floating Body/Gate Cell for Low Power Nanoscale Embedded DRAM, 2008, IEEE Trans. on El. Dev.
Ma, et al., "Hot-Carrier Effects in Thin-Film Fully Depleted SOI MOSFET's", IEEE Electron Device Letters, vol. 15, No. 6, Jun. 1994, pp. 218-220.

(56) References Cited

OTHER PUBLICATIONS

Malhi et al., "Characteristics and Three-Dimensional Integration of MOSFET's in Small-Grain LPCVD Polycrystalline Silicon", IEEE Transactions on Electron Devices, vol. ED-32, No. 2, Feb. 1985, pp. 258-281.
Malinge, An 8Mbit DRAM Design Using a 1TBulk Cell, 2005, VLSI Circuits.
Mandelman et al, "Floating-Body Concerns for SOI Dynamic Random Access Memory (DRAM)", Proceedings 1996 IEEE International SOI Conference, Oct. 1996, pp. 136-137.
Matsuoka et al., FBC Potential of 6F2 Single Cell Operation in Multi Gbit Memories Confirmed by a Newly Developed Method for Measuring Signal Sense Margin, 2007, IEDM.
Minami, A Floating Body Cell (FBC) fully Compatible with 90nm CMOS Technology(CMOS IV) for 128Mb SOI DRAM, 2005, IEDM.
Mohapatra et al., Effect of Source/Drain Asymmetry on the Performance of Z-RAMO Devices, Oct. 2009, SOI conference.
Morishita, A Capacitorless Twin-Transistor Random Access Memory (TTRAM) on SOI, 2005, CICC.
Morishita, F. et al., "A Configurable Enhanced TTRAM Macro for System-Level Power Management Unified Memory", IEEE Journal of Solid-State Circuits, vol. 42, No. 4, pp. 853, Apr. 2007.
Morishita, F., et al., "A 312-MHz 16-Mb Random-Cycle Embedded DRAM Macro With a Power-Down Data Retention Mode for Mobile Applications", J. Solid-State Circuits, vol. 40, No. 1, pp. 204-212, 2005.
Morishita, F., et al., "Dynamic floating body control SOI CMOS for power managed multimedia ULSIs", Proc. CICC, pp. 263-266, 1997.
Morishita, F., et al., "Leakage Mechanism due to Floating Body and Countermeasure on Dynamic Retention Mode of SOI-DRAM", Symposium on VLSI Technology Digest of Technical Papers, pp. 141-142, 1995.
Nagoga, Studying of Hot Carrier Effect in Floating Body Soi Mosfets by the Transient Charge Pumping Technique, Switzerland 2003.
Nayfeh, A Leakage Current Model for SOI based Floating Body Memory that Includes the Poole-Frenkel Effect, 2008, SOI Conference.
Nemati, A Novel High Density, Low Voltage SRAM Cell with a Vertical NDR Device, 1998, VLSI Tech. Symp.
Nemati, A Novel Thyristor-based SRAM Cell (T-RAM) for High-Speed, Low-Voltage, Giga-scale Memories, 1999, IEDM Conference.
Nemati, Embedded Volatile Memories—Embedded Tutorial: The New Memory Revolution, New Drives Circuits and Systems, ICCAD 2008, Nov. 2008.
Nemati, Fully Planar 0.562µm2 T-RAM Cell in a 130nm SOI CMOS Logic Technology for High-Density High-Performance SRAMs, 2004, IEDM.
Nemati, The New Memory Revolution. New Devices, Circuits and Systems, 2008, ICCAD.
Nemati, Thyristor RAM (T-RAM): A High-Speed High-Density Embedded Memory Technology for Nano-scale CMOS, 2007, Hot Chips.
Nemati, Thyristor-RAM: A Novel Embedded Memory Technology that Outperforms Embedded S RAM/DRAM, 2008, Linley Tech Tour.
Nishiguchi et al., Long Retention of Gain-Cell Dynamic Random Access Memory with Undoped Memory Node, 2007, IEEE EDL.
Oh, Floating Body DRAM Characteristics of Silicon-On-Ono (SOONO) Devices for System-on-Chip (SoC) Applications, 2007, VLSI Symposium.
Ohno et al., "Suppression of Parasitic Bipolar Action in Ultra-Thin-Film Fully-Depleted CMOS/SIMOX Devices by Ar-Ion Implantation into Source/Drain Regions", IEEE Transactions on Electron Devices, vol. 45, No. 5, May 1998, pp. 1071-1076.
Ohsawa et al., "A Memory Using One-Transistor Gain Cell on SOI (FBC) with Performance Suitable for Embedded DRAM's", 2003 Symposium on VLSI Circuits Digest of Technical Papers, Jun. 2003 (4 pages).
Ohsawa et al., "Memory Design Using a One-Transistor Gain Cell on SOI", IEEE Journal of Solid-State Circuits, vol. 37, No. 11, Nov. 2002, pp. 1510-1522.
Ohsawa, A 128Mb Floating Body RAM (FBRAM) on SOI with a Multi-Averaging Scheme of Dummy Cell, 2006 Symposium of VLSI Circuits Digest of Tech Papers, (2006).
Ohsawa, An 18.5ns 128Mb SOI DRAM with a Floating Body Cell, 2005, ISSCC.
Ohsawa, Autonomous Refresh of Floating Body Cell (FBC), Dec. 2008, IEDM.
Ohsawa, Design of a 128-Mb SOI DRAM Using the Floating Body Cell (FBC), Jan. 2006, Solid-State Circuits.
Okhonin, A Capacitor-Less 1T-DRAM Cell, Feb. 2002, Electron Device Letters.
Okhonin, A SOI Capacitor-less 1T-DRAM Concept, 2001, SOI Conference.
Okhonin, Charge Pumping Effects in Partially Depleted SOI MOSFETs, 2003, SOI Conference.
Okhonin, New characterization techniques for SOI and related devices, 2003, ECCTD.
Okhonin, New Generation of Z-RAM, 2007, IEDM.
Okhonin, Principles of Transient Charge Pumping on Partially Depleted SOI MOSFETs, May 2002, Electron Device Letters.
Okhonin, Transient Charge Pumping for Partially and Fully Depleted SOI MOSFETs, 2002, SOI Conference.
Okhonin, Transient effects in PD SOI MOSFETs and potential DRAM applications, 2002, Solid-State Electronics.
Okhonin, Ultra-scaled Z-RAM cell, 2008, SOI Conference.
Okhonin, Z-RAM® (Limits of DRAM), 2009, ESSDERC.
Padilla, Alvaro, et al., "Feedback FET: A Novel Transistor Exhibiting Steep Switching Behavior at Low Bias Voltages," Electron Devices Meeting, 2008. IEDM 2008. IEEE International, Dec. 5-17, 2008.
Park, Fully Depleted Double-Gate 1T-DRAM Cell with NVM Function for High Performance and High Density Embedded DRAM, 2009, IMW.
Pelella et al., "Low-Voltage Transient Bipolar Effect Induced by Dynamic Floating-Body Charging in PD/SOI MOSFETs", Final Camera Ready Art, SOI Conference, Oct. 1995, 2 pages.
Portmann et al., "A SOI Current Memory for Analog Signal Processing at High Temperature", 1999 IEEE International SOI Conference, Oct. 1999, pp. 18-19.
Puget et al., 1T Bulk eDRAM using GIDL Current for High Speed and Low Power applications, 2008, SSDM.
Puget et al., Quantum effects influence on thin silicon film capacitorless DRAM performance, 2006, SOI Conference.
Puget, FDSOI Floating Body Cell eDRAM Using Gate-Induced Drain-Leakage (GIDL) Write Current for High Speed and Low Power Applications, 2009, IMW.
Ranica et al., 1T-Bulk DRAM cell with improved performances: the way to scaling, 2005, ICMTD.
Ranica, A capacitor-less DRAM cell on 75nm gate length, 16nm thin Fully Depleted SOI device for high density embedded memories, 2004, IEDM.
Ranica, A One Transistor Cell on Bulk Substrate (1T-Bulk) for Low-Cost and High Density eDRAM, 2004, VLSI Symposium.
Rodder et al., "Silicon-On-Insulator Bipolar Transistors", IEEE Electron Device Letters, vol. EDL-4, No. 6, Jun. 1983, pp. 193-195.
Rodriguez, Noel, et al., A-RAM Novel Capacitor-less DRAM Memory, SOI Conference, 2009 IEEE International, Oct. 5-8, 2009 pp. 1-2.
Roy, Thyristor-Based Volatile Memory in Nano-Scale CMOS, 2006, ISSCC.
Sailing et al., Reliability of Thyristor Based Memory Cells, 2009, IRPS.
Sasaki et al., Charge Pumping in SOS-MOS Transistors, 1981, IEEE Trans. on El. Dev.
Sasaki et al., Charge Pumping SOS-MOS Transistor Memory, 1978, IEDM.
Schloesser et al., "A 6F2 Buried Wordline DRAM Cell for 40nm and Beyond", IEEE, Qimonda Dresden GmbH & Co., pp. 809-812 (2008).
Shino et al., Floating Body RAM technology and its scalability to 32 nm node and beyond, 2006, IEDM.

(56) References Cited

OTHER PUBLICATIONS

Shino et al., Operation Voltage Dependence of Memory Cell Characteristics in Fully Depleted FBC, 2005, IEEE Trans. on El. Dev.
Shino, Fully-Depleted FBC (Floating Body Cell) with Enlarged Signal Window and Excellent Logic Process Compatibility, 2004, IEDM.
Shino, Highly Scalable FBC (Floating Body Cell) with 25nm BOX Structure for Embedded DRAM Applications, 2004, VLSI Symposium.
Sim et al., "Source-Bias Dependent Charge Accumulation in P+-Poly Gate SOI Dynamic Random Access Memory Cell Transistors", Jpn. J. Appl. Phys. vol. 37 (1998) pp. 1260-1263, Part 1, No. 3B, Mar. 1998.
Singh, A 2ns-Read-Latency 4Mb Embedded Floating-Body Memory Macro in 45nm SOI Technology, Feb. 2009, ISSCC.
Sinha et al., "In-Depth Analysis of Opposite Channel Based Charge Injection in SOI MOSFETs and Related Defect Creation and Annihilation", Elsevier Science, Microelectronic Engineering 28, 1995, pp. 383-386.
Song, 55 nm Capacitor-less 1T DRAM Cell Transistor with Non-Overlap Structure, Dec. 2008, IEDM.
Stanojevic et al., "Design of a SOI Memory Cell", IEEE Proc. 21st International Conference on Microelectronics (MIEL '97), vol. 1, NIS, Yugoslavia, Sep. 14-17, 1997, pp. 297-300.
Su et al., "Studying the Impact of Gate Tunneling on Dynamic Behaviors of Partially-Depleted SOI CMOS Using BSIMPD", IEEE Proceedings of the International Symposium on Quality Electronic Design (ISQED '02), Apr. 2002 (5 pages).
Suma et al., "An SOI-DRAM with Wide Operating Voltage Range by CMOS/SIMOX Technology", 1994 IEEE International Solid-State Circuits Conference, pp. 138-139.
Tack et al., "The Multi-Stable Behaviour of SOI-NMOS Transistors at Low Temperatures", Proc. 1988 SOS/SOI Technology Workshop (Sea Palms Resort, St. Simons Island, GA, Oct. 1988), p. 78.
Tack et al., "The Multistable Charge Controlled Memory Effect in SOI Transistors at Low Temperatures", IEEE Workshop on Low Temperature Electronics, Aug. 7-8, 1989, University of Vermont, Burlington, pp. 137-141.
Tack et al., "The Multistable Charge-Controlled Memory Effect in SOI MOS Transistors at Low Temperatures", IEEE Transactions on Electron Devices, vol. 37, No. 5, May 1990, pp. 1373-1382.
Tack, et al., "An Analytical Model for the Misis Structure in SOI MOS Devices", Solid-State Electronics vol. 33, No. 3, 1990, pp. 357-364.
Tanabe et al., A 30-ns 64-MB DRAM with Built-in-Self-Test and Self-Repair Function, IEEE Journal of Solid State Circuits, vol. 27, No. 11, Nov. 1992, pp. 1525-1533.
Tanaka et al., "Scalability Study on a Capacitorless 1T-DRAM: From Single-gate PD-SOI to Double-gate FINDRAM", 2004 IEEE, 4 pages.
Tang, Poren, Highly Scalable Capacitorless DRAM Cell on Thin-Body with Band-gap Engineered Source and Drain, Extended Abstracts of the 2009 ICSSDM, Sendai, 2009, pp. 144-145.
Terauchi et al., "Analysis of Floating-Body-Induced Leakage Current in 0.15μm SOI DRAM", Proceedings 1996 IEEE International SOI Conference, Oct. 1996, pp. 138-139.
Thomas et al., "An SOI 4 Transistors Self-Refresh Ultra-Low-Voltage Memory Cell", IEEE, Mar. 2003, pp. 401-404.
Tomishima, et al., "A Long Data Retention SOI DRAM with the Body Refresh Function", IEICE Trans. Electron., vol. E80-C, No. 7, Jul. 1997, pp. 899-904.
Tsaur et al., "Fully Isolated Lateral Bipolar-MOS Transistors Fabricated in Zone-Melting-Recrystallized Si Films on SiO2", IEEE Electron Device Letters, vol. EDL-4, No. 8, Aug. 1983, pp. 269-271.

Tu, et al., "Simulation of Floating Body Effect in SOI Circuits Using BSIM3SOI", Proceedings of Technical Papers (IEEE Cat No. 97TH8303), Jun. 1997, pp. 339-342.
Villaret et al., "Mechanisms of Charge Modulation in the Floating Body of Triple-Well nMOSFET Capacitor-less DRAMs", Proceedings of the INFOS 2003, Insulating Films on Semiconductors, 13th Bi-annual Conference, Jun. 18-20, 2003, Barcelona (Spain), (4 pages).
Villaret et al., "Triple-Well nMOSFET Evaluated as a Capacitor-Less DRAM Cell for Nanoscale Low-Cost & High Density Applications", Handout at Proceedings of 2003 Silicon Nanoelectronics Workshop, Jun. 8-9, 2003, Kyoto, Japan (2 pages).
Villaret et al., Further Insight into the Physics and Modeling of Floating Body Capacitorless DRAMs, 2005, IEEE Trans. on El. Dev.
Wang et al., A Novel 4.5F2 Capacitorless Semiconductor Memory Device, 2008, IEEE EDL.
Wann et al., "A Capacitorless DRAM Cell on SOI Substrate", IEEE IEDM, 1993, pp. 635-638.
Wann et al., "High-Endurance Ultra-Thin Tunnel Oxide in MONOS Device Structure for Dynamic Memory Application", IEEE Electron Device Letters, vol. 16, No. 11, Nov. 1995, pp. 491-493.
Wei, A., "Measurement of Transient Effects in SOI DRAM/SRAM Access Transistors", IEEE Electron Device Letters, vol. 17, No. 5, May 1996, pp. 193-195.
Wouters, et al., "Characterization of Front and Back Si—SiO2 Interfaces in Thick- and Thin-Film Silicon-on-Insulator MOS Structures by the Charge-Pumping Technique", IEEE Transactions on Electron Devices, vol. 36, No. 9, Sep. 1989, pp. 1746-1750.
Wu, Dake, "Performance Improvement of the Capacitorless DRAM Cell with Quasi-SOI Structure Based on Bulk Substrate," Extended Abstracts of the 2009 ICSSDM, Sendai, 2009, pp. 146-147.
Yamanaka et al., "Advanced TFT SRAM Cell Technology Using a Phase-Shift Lithography", IEEE Transactions on Electron Devices, vol. 42, No. 7, Jul. 1995, pp. 1305-1313.
Yamauchi et al., "High-Performance Embedded SOI DRAM Architecture for the Low-Power Supply", IEEE Journal of Solid-State Circuits, vol. 35, No. 8, Aug. 2000, pp. 1169-1178.
Yamawaki, M., "Embedded DRAM Process Technology", Proceedings of the Symposium on Semiconductors and Integrated Circuits Technology, 1998, vol. 55, pp. 38-43.
Yang, Optimization of Nanoscale Thyristors on SOI for High-Performance High-Density Memories, 2006, SOI Conference.
Yoshida et al., "A Design of a Capacitorless 1-T-DRAM Cell Using Gate-induced Drain Leakage (GIDL) Current for Low-Power and High-speed Embedded Memory", 2003 IEEE, 4 pages.
Yoshida et al., "A Study of High Scalable Dg-FinDRAM", IEEE Electron Device Letters, vol. 26, No. 9, Sep. 2005, pp. 655-657.
Yoshida et al., A Capacitorless 1T-DRAM Technology Using GIDL Current for Low Power and High Speed Embedded Memory, 2006, IEEE Trans. on El. Dev.
Yu et al., Hot-Carrier Effect in Ultra-Thin-Film (UTF) Fully-Depleted SOI MOSFET's, 54th Annual Device Research Conference Digest (Cat. No. 96TH8193), Jun. 1996, pp. 22-23.
Yu et al., "Hot-Carrier-Induced Degradation in Ultra-Thin-Film Fully-Depleted SOI MOSFETs", Solid-State Electronics, vol. 39, No. 12, 1996, pp. 1791-1794.
Yu et al., "Interface Characterization of Fully-Depleted SOI MOSFET by a Subthreshold I-V Method", Proceedings 1994 IEEE International SOI Conference, Oct. 1994, pp. 63-64.
Yun et al., Analysis of Sensing Margin in SOONO Device for the Capacitor-less RAM Applications, 2007, SOI Conference.
Zhou, Physical Insights on BJT-Based 1T DRAM Cells, IEEE Electron Device Letters, vol. 30, No. 5, May 2009.

\* cited by examiner

TECHNIQUES FOR REFRESHING A SEMICONDUCTOR MEMORY DEVICE

CROSS-REFERENCE TO RELATED APPLICATIONS

This patent application claims priority to U.S. Provisional Patent Application No. 61/332,037, filed May 6, 2010, which is hereby incorporated by reference herein in its entirety.

FIELD OF THE DISCLOSURE

The present disclosure relates generally to semiconductor memory devices and, more particularly, to techniques for refreshing a semiconductor memory device.

BACKGROUND OF THE DISCLOSURE

The semiconductor industry has experienced technological advances that have permitted increases in density and/or complexity of semiconductor memory devices. Also, the technological advances have allowed decreases in power consumption and package sizes of various types of semiconductor memory devices. There is a continuing trend to employ and/or fabricate advanced semiconductor memory devices using techniques, materials, and devices that improve performance, reduce leakage current, and enhance overall scaling. Silicon-on-insulator (SOI) and bulk substrates are examples of materials that may be used to fabricate such semiconductor memory devices. Such semiconductor memory devices may include, for example, partially depleted (PD) devices, fully depleted (FD) devices, multiple gate devices (e.g., double, triple gate, or surrounding gate), and Fin-FET devices.

A semiconductor memory device may include a memory cell having a memory transistor with an electrically floating body region wherein electrical charge may be stored. When excess majority electrical charges carriers are stored in the electrically floating body region, the memory cell may store a logic high (e.g., binary "1" data state). When the electrical floating body region is depleted of majority electrical charge carriers, the memory cell may store a logic low (e.g., binary "0" data state). Also, a semiconductor memory device may be fabricated on silicon-on-insulator (SOI) substrates or bulk substrates (e.g., enabling body isolation). For example, a semiconductor memory device may be fabricated as a three-dimensional (3-D) device (e.g., a multiple gate device, a Fin-FET device, and a vertical pillar device).

In one conventional technique, the memory cell of the semiconductor memory device may be read by applying bias signals to a source/drain region and a gate of the memory transistor. As such, a conventional reading technique may involve sensing an amount of current provided/generated by/in the electrically floating body region of the memory cell in response to the application of the source/drain region and gate bias signals to determine a data state of the memory cell. For example, the memory cell may have two or more different current states corresponding to two or more different logical states (e.g., two different current conditions/states corresponding to two different logic states: a binary "0" data state and a binary "1" data state).

In another conventional technique, the memory cell of the semiconductor memory device may be written to by applying bias signals to the source/drain region(s) and the gate of the memory transistor. As such, a conventional writing technique may result in an increase/decrease of majority charge carriers in the electrically floating body region of the memory cell which, in turn, determines the data state of the memory cell. Such an excess of majority charge carriers may result from channel impact ionization, band-to-band tunneling (gate-induced drain leakage "GIDL"), or direct injection. Majority charge carriers may be removed via drain region hole removal, source region hole removal, or drain and source region hole removal, for example, using back gate pulsing.

Often, conventional reading and/or writing operations may lead to relatively large power consumption and large voltage potential swings which may cause disturbance to unselected memory cells in the semiconductor memory device. Also, pulsing between positive and negative gate biases during read and write operations may reduce a net quantity of majority charge carriers in the electrically floating body region of the memory cell, which, in turn, may result in an inaccurate determination of the data state of the memory cell. Furthermore, in the event that a bias signal having a voltage potential that is below a threshold voltage potential of the memory transistor is applied to the gate of the memory transistor, a channel of minority charge carriers beneath the gate may be eliminated. However, some of the minority charge carriers may remain "trapped" in interface defects. Some of the trapped minority charge carriers may combine with majority charge carriers, which may be attracted to the gate as a result of the applied bias signal. As a result, the net quantity of majority charge carriers in the electrically floating body region may be reduced. This phenomenon, which is typically characterized as charge pumping, is problematic because the net quantity of majority charge carriers may be reduced in the electrically floating body region of the memory cell, which, in turn, may result in an inaccurate determination of the data state of the memory cell.

In view of the foregoing, it may be understood that there may be significant problems and shortcomings associated with conventional techniques for operating a semiconductor memory device.

SUMMARY OF THE DISCLOSURE

Techniques for refreshing a semiconductor memory device are disclosed. In one particular exemplary embodiment, the techniques may be realized as a semiconductor memory device comprising a plurality of memory cells arranged in an array of rows and columns. Each memory cell may comprise a first region coupled to a source line and a second region coupled to a carrier injection line. Each memory cell may also comprise a body region capacitively coupled to at least one word line and disposed between the first region and the second region and a decoupling resistor coupled to at least a portion of the body region.

In accordance with other aspects of this particular exemplary embodiment, the first region may be an N-doped region and the second region may be a P-doped region.

In accordance with further aspects of this particular exemplary embodiment, the body region may be an undoped region.

In accordance with additional aspects of this particular exemplary embodiment, the body region may comprise a first portion and a second portion.

In accordance with other aspects of this particular exemplary embodiment, the first portion of the body region and the second portion of the body region may be different portions of the body region.

In accordance with further aspects of this particular exemplary embodiment, the decoupling resistor may be coupled to the second portion of the body region.

In accordance with additional aspects of this particular exemplary embodiment, the decoupling resistor may be coupled to the second portion of the body region via a bit line.

In accordance with other aspects of this particular exemplary embodiment, a plurality of word lines may be capacitively coupled to the body region.

In accordance with further aspects of this particular exemplary embodiment, the plurality of word lines may be capacitively coupled to a plurality of side portions of the body region.

In accordance with additional aspects of this particular exemplary embodiment, each of the plurality of word lines may be capacitively coupled to different portions on a common side of the body region.

In accordance with other aspects of this particular exemplary embodiment, each of the plurality of word lines may be capacitively coupled to opposite side portions of the body region.

In accordance with further aspects of this particular exemplary embodiment, the plurality of word lines may comprise a first word line and a second word line.

In accordance with additional aspects of this particular exemplary embodiment, the first word line may be capacitively coupled to a first portion of the body region and the second word line may be capacitively coupled to a second portion of the body region.

In accordance with other aspects of this particular exemplary embodiment, the decoupling resistor may have a resistance that causes a current flow through the decoupling resistor between a current that may represent a logic low and a current that may represent a logic high.

In another particular exemplary embodiment, the techniques may be realized as a method for biasing a semiconductor memory device comprising the steps of applying a plurality of voltage potentials to a plurality of memory cells arranged in an array of rows and columns. The method may also comprise applying a first voltage potential to a first region via a respective source line of the array and applying a second voltage potential to a second region via a respective carrier injection line of the array. The method may further comprise applying a third voltage potential to a first portion of a body region via at least one respective word line of the array that is capacitively coupled to the body region and applying a fourth voltage potential to a second portion of the body region via a respective bit line of the array and a decoupling resistor.

In accordance with other aspects of this particular exemplary embodiment, the respective source line may be coupled to an electrical ground.

In accordance with further aspects of this particular exemplary embodiment, the fourth voltage potential applied to the second portion of the body region may be a constant voltage potential.

In accordance with additional aspects of this particular exemplary embodiment, the method may further comprise increasing the third voltage potential applied to the at least one respective word line during a hold operation in order to perform a write logic low operation.

In accordance with other aspects of this particular exemplary embodiment, the method may further comprise maintaining the second voltage potential applied to the respective carrier injection line during a hold operation in order to perform a write logic low operation.

In accordance with further aspects of this particular exemplary embodiment, the method further comprise increasing the second voltage potential applied to the respective carrier injection line and the third voltage potential applied to the at least one respective word line during a hold operation in order to perform a write logic high operation.

In accordance with additional aspects of this particular exemplary embodiment, the method further comprise increasing the second voltage potential applied to the respective carrier injection line and the third voltage potential applied to the at least one respective word line during a hold operation in order to perform a read operation.

In accordance with other aspects of this particular exemplary embodiment, the decoupling resistor and the respective bit line may be coupled to the respective carrier injection line.

In accordance with further aspects of this particular exemplary embodiment, the method may further comprise increasing the third voltage potential applied to the at least one respective word line during a hold operation in order to perform a write logic low operation.

In accordance with additional aspects of this particular exemplary embodiment, the method may further comprise maintaining the second voltage potential applied to the respective carrier injection line during a hold operation in order to perform a write logic low operation.

In accordance with other aspects of this particular exemplary embodiment, the method may further comprise increasing the second voltage potential applied to the respective carrier injection line and the third voltage potential applied to the at least one respective word line during a hold operation in order to perform a write logic high operation.

In accordance with further aspects of this particular exemplary embodiment, the method may further comprise increasing the second voltage potential applied to the respective carrier injection line and the third voltage potential applied to the at least one respective word line during a hold operation in order to perform a read operation.

In accordance with additional aspects of this particular exemplary embodiment, the second voltage potential applied to the second region may be a constant voltage potential.

In accordance with other aspects of this particular exemplary embodiment, the method may further comprise increasing the third voltage potential applied to the at least one respective word line and the fourth voltage potential applied to the respective bit line during a hold operation in order to perform a write logic low operation.

In accordance with further aspects of this particular exemplary embodiment, the method may further comprise maintaining the fourth voltage potential applied to the respective bit line during a hold operation in order to perform a write logic high operation.

In accordance with additional aspects of this particular exemplary embodiment, the method may further comprise increasing the third voltage potential applied to the at least one respective bit line during a hold operation to perform a write logic high operation.

In accordance with other aspects of this particular exemplary embodiment, the method may further comprise increasing the third voltage potential applied to the at least one respective word line and the fourth voltage potential applied to the respective bit line during a hold operation in order to perform a read operation.

In accordance with further aspects of this particular exemplary embodiment, the method may further comprise increasing the second voltage potential applied to the respective carrier injection line, the third voltage potential applied to the at least one respective word line, and the fourth voltage potential applied to the respective bit line during a hold operation in order to perform a write logic low operation.

In accordance with additional aspects of this particular exemplary embodiment, the method may further comprise increasing the second voltage potential applied to the respective carrier injection line and the third voltage potential applied to the at least one respective word line during a hold operation in order to perform a write logic high operation.

In accordance with other aspects of this particular exemplary embodiment, the method may further comprise increasing the second voltage potential applied to the respective carrier injection line and the third voltage potential applied to the at least one respective word line during a hold operation in order to perform a write logic high operation.

In accordance with further aspects of this particular exemplary embodiment, the method may further comprise increasing the second voltage potential applied to the respective carrier injection line, the third voltage potential applied to the at least one respective word line, and the fourth voltage potential applied to the respective bit line during a hold operation in order to perform a read operation.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

DETAILED DESCRIPTION OF EXEMPLARY EMBODIMENTS

Figure 1:
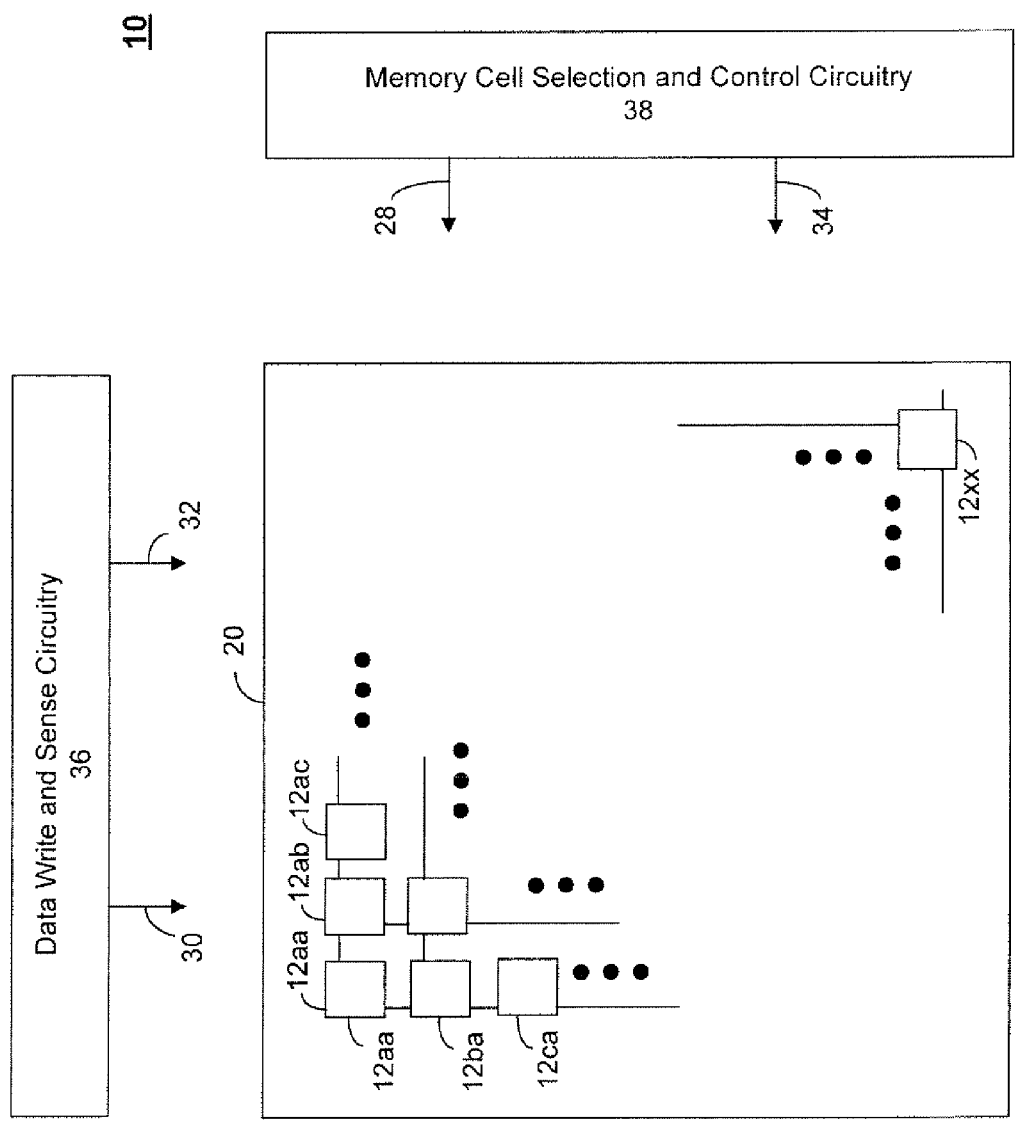
FIG. 1 shows a block diagram of a semiconductor memory device including a memory cell array, data write and sense circuitry, and memory cell selection and control circuitry in accordance with an embodiment of the present disclosure.

Referring to FIG. 1, there is shown a block diagram of a semiconductor memory device 10 comprising a memory cell array 20, data write and sense circuitry 36, and memory cell selection and control circuitry 38 in accordance with an embodiment of the present disclosure. The memory cell array 20 may comprise a plurality of memory cells 12 each coupled to the memory cell selection and control circuitry 38 via a word line (WL) 28 and a carrier injection line (EP) 34, and to the data write and sense circuitry 36 via a bit line (CN) 30 and a source line (EN) 32. It may be appreciated that the bit line (CN) 30 and the source line (EN) 32 are designations used to distinguish between two signal lines and they may be used interchangeably.

The data write and sense circuitry 36 may read data from and may write data to selected memory cells 12. In an exemplary embodiment, the data write and sense circuitry 36 may include a plurality of data sense amplifier circuits. Each data sense amplifier circuit may receive at least one bit line (CN) 30 and a current or voltage reference signal. For example, each data sense amplifier circuit may be a cross-coupled type sense amplifier to sense a data state stored in a memory cell 12. The data write and sense circuitry 36 may include at least one multiplexer that may couple to a data sense amplifier circuit to at least one bit line (CN) 30. In an exemplary embodiment, the multiplexer may couple a plurality of bit lines (CN) 30 to a data sense amplifier circuit.

Each data sense amplifier circuit may employ voltage and/or current sensing circuitry and/or techniques. In an exemplary embodiment, each data sense amplifier circuit may employ current sensing circuitry and/or techniques. For example, a current sense amplifier may compare current from a selected memory cell to a reference current (e.g., the current of one or more reference cells). From that comparison, it may be determined whether the selected memory cell 12 stores a logic high (e.g., binary "1" data state) or a logic low (e.g., binary "0" data state). It may be appreciated by one having ordinary skill in the art that various types or forms of the data write and sense circuitry 36 (including one or more sense amplifiers, using voltage or current sensing techniques, to sense a data state stored in a memory cell 12) may be employed to read data stored in the memory cells 12.

The memory cell selection and control circuitry 38 may select and/or enable one or more predetermined memory cells 12 to facilitate reading data therefrom by applying control signals on one or more word lines (WL) 28 and/or carrier injection lines (EP) 34. The memory cell selection and control circuitry 38 may generate such control signals from address signals, for example, row address signals. Moreover, the memory cell selection and control circuitry 38 may include a word line decoder and/or driver. For example, the memory cell selection and control circuitry 38 may include one or more different control/selection techniques (and circuitry therefrom) to select and/or enable one or more predetermined memory cells 12. Notably, all such control/selection techniques, and circuitry therefrom, whether now known or later developed, are intended to fall within the scope of the present disclosure.

In an exemplary embodiment, the semiconductor memory device may implement a two step write operation whereby all the memory cells 12 in a row of memory cells 12 may be written to a predetermined data state by first executing a "clear" or a logic low (e.g., binary "0" data state) write operation, whereby all of the memory cells 12 in the row of memory cells 12 are written to logic low (e.g., binary "0" data state). Thereafter, selected memory cells 12 in the row of memory cells 12 may be selectively written to the predetermined data state (e.g., logic high (binary "1" data state)). The semiconductor memory device 10 may also implement a one step write operation whereby selected memory cells 12 in a row of memory cells 12 may be selectively written to either a logic high (e.g., binary "1" data state) or a logic low (e.g., binary "0" data state) without first implementing a "clear" operation. The semiconductor memory device 10 may employ any of the exemplary writing, preparation, holding, refresh, and/or reading techniques described herein.

The memory cells 12 may comprise N-type, P-type and/or both types of transistors. Circuitry that is peripheral to the memory cell array 20 (for example, sense amplifiers or comparators, row and column address decoders, as well as line drivers (not illustrated herein)) may also include P-type and/or N-type transistors. Regardless of whether P-type or N-type transistors are employed in memory cells 12 in the memory cell array 20, suitable voltage potentials (for example, positive or negative voltage potentials) for reading from the memory cells 12 will be described further herein.

Figure 2:
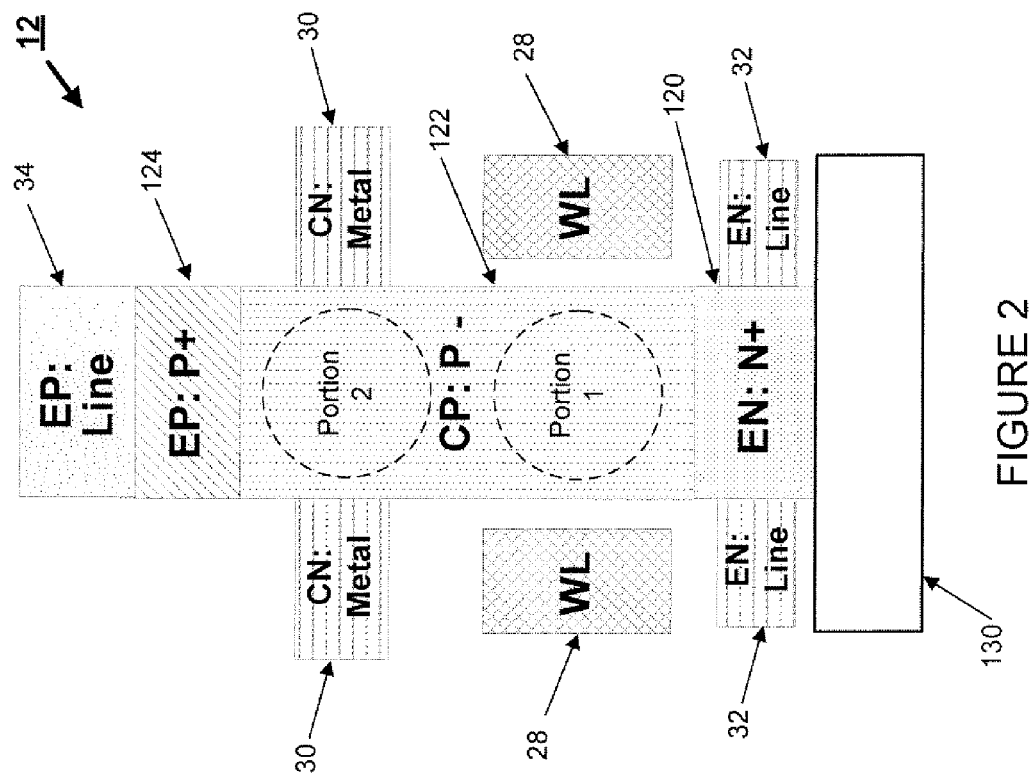
FIG. 2 shows a cross-sectional view of a memory cell of the memory cell array in accordance with an embodiment of the present disclosure.

Referring to FIG. 2, there is shown a cross-sectional view of a memory cell 12 of the memory cell array 20 in accordance with an embodiment of the present disclosure. The memory cell 12 may be implemented in a vertical configuration having various regions. For example, the memory cell 12 may comprise an N+ source region 120, a P− body region 122, and a P+ drain region 124. The N+ source region 120, the P− body region 122, and/or the P+ drain region 124 may be disposed in a sequential contiguous relationship, and may extend vertically from a plane defined by a P− substrate 130. In an exemplary embodiment, the P− body region 122 may be an electrically floating body region of the memory cell 12 configured to accumulate/store charges, and may be spaced apart from and capacitively coupled to the plurality of word lines (WL) 28.

The N+ source region 120 of the memory cell 12 may be coupled to a corresponding source line (EN) 32. In an exemplary embodiment, the N+ source region 120 may be formed of a semiconductor material (e.g., silicon) comprising donor impurities. For example, the N+ source region 120 may be formed of a silicon material doped with phosphorous or arsenic impurities. In an exemplary embodiment, the N+ source region 120 may be formed of a silicon material doped with phosphorous or arsenic having a concentration of $10^{20}$ atoms/cm$^3$.

In an exemplary embodiment, the source line (EN) 32 may be formed of a metal material. In another exemplary embodiment, the source line (EN) 32 may be formed of a polycide material (e.g., a combination of a metal material and a silicon material). In other exemplary embodiments, the source line (EN) 32 may be formed of an N+ doped silicon layer. The source line (EN) 32 may provide a predetermined voltage potential to the memory cells 12 of the memory cell array 20. For example, the source line (EN) 32 may be coupled to a plurality of memory cells 12 (e.g., a column or a row of memory cell array 20). The source line (EN) 32 may be configured on sides of the N+ source region 120.

The P− body region 122 of the memory cell 12 may be capacitively coupled to a corresponding word lines (WL) 28. In an exemplary embodiment, the P− body region 122 may have a first portion and a second portion formed of an undoped semiconductor material (e.g., intrinsic silicon). In an exemplary embodiment, the P− body region 122 may be formed of a semiconductor material (e.g., silicon) comprising acceptor impurities. The P− body region 122 may be formed of a silicon material doped with boron impurities. In an exemplary embodiment, the P− body region 122 may be formed of a silicon material with acceptor impurities having a concentration of $10^{15}$ atoms/cm$^3$.

The word lines (WL) 28 may be capacitively coupled the P− body region 122. The word lines (WL) 28 may be oriented in a row direction of the memory cell array 20 and coupled to a plurality of memory cells 12. The word lines (WL) 28 may be arranged on the sides of the memory cells 12 (e.g., memory cells 12 located on a row direction of the memory cell array 20). The word lines (WL) 28 may be capacitively coupled to the first portion of the P− body region 122. The first portion and the second portion of the P− body region 122 may be different portions of the P− body region 122. For example, the word lines (WL) 28 may be arranged on at least two side portions of the memory cells 12.

For example, the word lines (WL) 28 may be formed of a polycide material (e.g., a combination of a metal material and a silicon material), a metal material, and/or a combination of a polycide material and a metal material. In another exemplary embodiment, the word lines (WL) 28 may be formed of a P+ doped silicon material. In an exemplary embodiment, each of the word lines (WL) 28 may include a plurality of layers formed of different materials. For example, each of the word lines (WL) 28 may include a layer formed above the polycide layer to couple the polycide layer to a voltage/current source of the memory cell selection and control circuitry 38.

The bit line (CN) 30 may be coupled to a second portion of the P− body region 122. The bit line (CN) 30 may be formed of a metal material. In another exemplary embodiment, the bit line (CN) 30 may be formed of a polycide material (e.g., a combination of a metal material and a silicon material). In other exemplary embodiments, the bit line (CN) 30 may be formed of an N+ doped silicon layer. For example, the source line (EN) 32 may be coupled to a plurality of memory cells 12. The bit line (CN) 30 may be configured on sides of the second portion of the P− body region 122.

The P+ drain region 124 of the memory cell 12 may be coupled to a corresponding carrier injection line (EP) 34. In an exemplary embodiment, the P+ drain region 124 of the memory cell 12 may be formed of semiconductor material (e.g., silicon) comprising acceptor impurities. For example, the P+ drain region 124 may be formed of a silicon material doped with boron impurities. In an exemplary embodiment, the P+ drain region 124 may be doped with acceptor impurities having a concentration of $10^{20}$ atom/cm$^3$.

In an exemplary embodiment, the carrier injection line (EP) 34 may be formed of a polycide material. In another exemplary embodiment, the carrier injection line (EP) 34 may be formed of a metal material. The carrier injection line (EP) 34 may extend vertically in a column direction of the memory cell array 20 and may couple to a plurality of memory cells 12 (e.g., a column of memory cells 12). The carrier injection line (EP) 34 may be formed of a metal material. In another exemplary embodiment, the carrier injection line (EP) 34 may be formed of a polycide material (e.g., a combination of a metal material and a silicon material). In other exemplary embodiments, the carrier injection line (EP) 34 may be formed of an N+ doped silicon layer.

In an exemplary embodiment, the P– substrate 130 may be made of a semiconductor material (e.g., silicon) comprising acceptor impurities and may form a base of the memory cell array 20. For example, the P– substrate 130 may be made of a semiconductor material comprising boron impurities. In an exemplary embodiment, the P– substrate 130 may be made of silicon comprising boron impurities having a concentration of $10^{15}$ atoms/cm$^3$. In alternative exemplary embodiments, a plurality of P– substrates 130 may form the base of the memory cell array 20 or a single P– substrate 130 may form the base of the memory cell array 20. Also, the P– substrate 130 may be made in the form of a P-well substrate.

Figure 3:
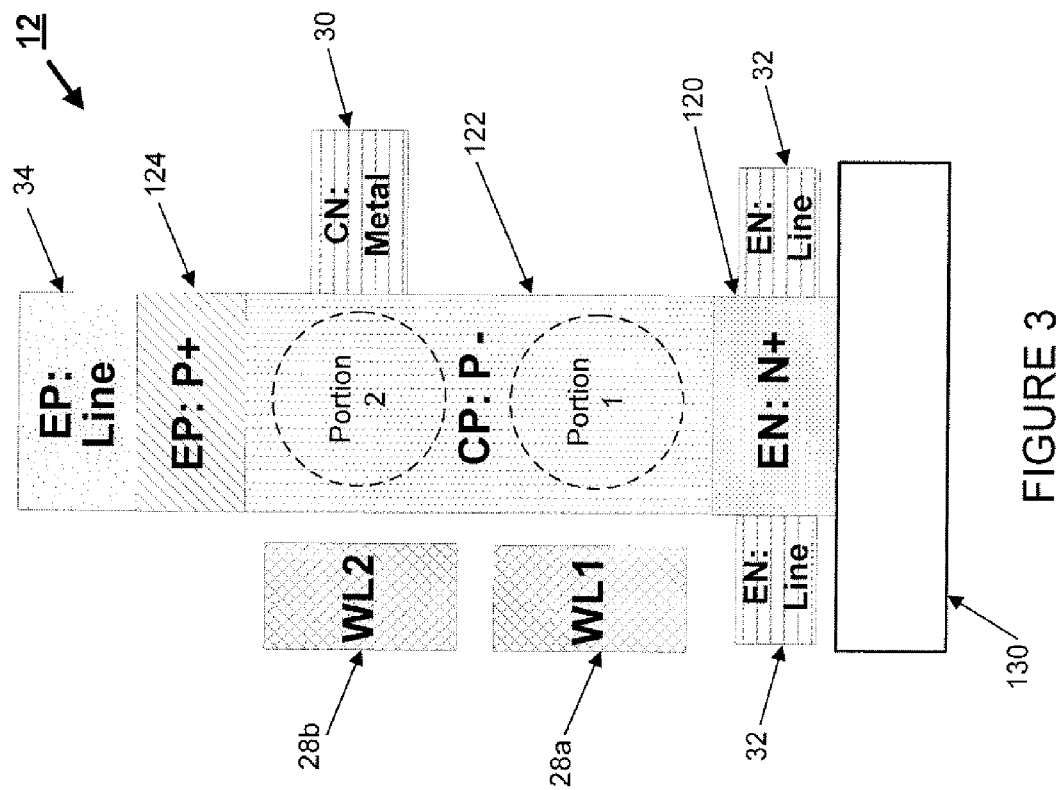
FIG. 3 shows a cross-sectional view of a memory cell of the memory cell array in accordance with an alternative embodiment of the present disclosure.

Referring to FIG. 3, there is shown a cross-sectional view of a memory cell 12 of the memory cell array 20 in accordance with an alternative embodiment of the present disclosure. The memory cell 12 may comprise an N+ source region 120 coupled to a corresponding source line (EN) 32, a P– body region 122 capacitively coupled to a plurality of word lines (WL) 28, and a P+ drain region 124 coupled to a corresponding carrier injection line (EP) 34. The N+ source region 120, the P– body region 122, and/or the P+ drain region 124 may be disposed in a sequential contiguous relationship, and may extend vertically from a plane defined by a P– substrate 130. In an exemplary embodiment, the P– body region 122 may be an electrically floating body region of the memory cell 12 configured to accumulate/store charges, and may be spaced apart from and capacitively coupled to the plurality of word lines (WL) 28.

The N+ source region 120 of the memory cell 12 may be coupled to a corresponding source line (EN) 32. In an exemplary embodiment, the N+ source region 120 may be formed of a semiconductor material (e.g., silicon) comprising donor impurities. For example, the N+ source region 120 may be formed of a silicon material doped with phosphorous or arsenic impurities. In an exemplary embodiment, the N+ source region 120 may be formed of a silicon material doped with phosphorous or arsenic having a concentration of $10^{20}$ atoms/cm$^3$.

In an exemplary embodiment, the source line (EN) 32 may be formed of a metal material. In another exemplary embodiment, the source line (EN) 32 may be formed of a polycide material (e.g., a combination of a metal material and a silicon material). In other exemplary embodiments, the source line (EN) 32 may be formed of an N+ doped silicon layer. The source line (EN) 32 may provide a predetermined voltage potential to the memory cells 12 of the memory cell array 20. For example, the source line (EN) 32 may be coupled to a plurality of memory cells 12 (e.g., a column or a row of memory cell array 20). The source line (EN) 32 may be configured on sides of the N+ source region 120.

The P– body region 122 of the memory cell 12 may be capacitively coupled to a plurality of corresponding word lines (WL) 28. In an exemplary embodiment, the P– body region 122 may have a first portion and a second portion formed of an undoped semiconductor material (e.g., intrinsic silicon). In an exemplary embodiment, the P– body region 122 may be formed of a semiconductor material (e.g., silicon) comprising acceptor impurities. The P– body region 122 may be formed of a silicon material doped with boron impurities. In an exemplary embodiment, the P– body region 122 may be formed of a silicon material with acceptor impurities having a concentration of $10^{15}$ atoms/cm$^3$.

The plurality of word lines (WL) 28 may be capacitively coupled the P– body region 122. The plurality of word lines (WL) 28 may be oriented in a row direction of the memory cell array 20 and coupled to a plurality of memory cells 12. The plurality of word lines (WL) 28 may include a first word line (WL1) 28a capacitively coupled to a first portion of the P– body region 122 and a second word line (WL2) 28b capacitively coupled to a second portion of the P– body region 122. The first portion and the second portion of the P– body region 122 may be different portions of the P– body region 122. The plurality of word lines (WL) 28 may be arranged on a side portion of the memory cells 12 (e.g., memory cells 12 located on a row direction of the memory cell array 20). In an exemplary embodiment, the first word line (WL1) 28a and the second word line (WL2) 28b may be configured on the same side of the P– body region 122. In another exemplary embodiment, the first word line (WL1) 28a and the second word line (WL2) 28b may be configured on opposite sides of the P– body region 122.

For example, the word lines (WL) 28 may be formed of a polycide material (e.g., a combination of a metal material and a silicon material), a metal material, and/or a combination of a polycide material and a metal material. In another exemplary embodiment, the word lines (WL) 28 may be formed of a P+ doped silicon material. In an exemplary embodiment, each of the word lines (WL) 28 may include a plurality of layers formed of different materials. For example, each of the word lines (WL) 28 may include a layer formed above the polycide layer to couple the polycide layer to a voltage/current source of the memory cell selection and control circuitry 38.

The bit line (CN) 30 may be coupled to a second portion of the P– body region 122. The bit line (CN) 30 may be configured on a side of the second portion of the P– body region 122. For example, the bit line (CN) 30 may be configured on the opposite side of the second portion of the P– body region 122 from the second word line (WL2) 28b. The bit line (CN) 30 may be formed of a metal material. In another exemplary embodiment, the bit line (CN) 30 may be formed of a polycide material (e.g., a combination of a metal material and a silicon material). In other exemplary embodiments, the bit line (CN) 30 may be formed of an N+ doped silicon layer. For example, the source line (EN) 32 may be coupled to a plurality of memory cells 12.

The P+ drain region 124 of the memory cell 12 may be coupled to a corresponding carrier injection line (EP) 34. In an exemplary embodiment, the P+ drain region 124 of the memory cell 12 may be formed of a semiconductor material (e.g., silicon) comprising acceptor impurities. For example, the P+ drain region 124 may be formed of a silicon material doped with boron impurities. In an exemplary embodiment, the P+ drain region 124 may be doped with acceptor impurities having a concentration of $10^{20}$ atom/cm$^3$.

In an exemplary embodiment, the carrier injection line (EP) 34 may be formed of a polycide material. In another exemplary embodiment, the carrier injection line (EP) 34 may be formed of a metal material. The carrier injection line (EP) 34 may extend vertically in a column direction of the memory cell array 20 and may couple to a plurality of memory cells 12 (e.g., a column of memory cells 12). The carrier injection line (EP) 34 may be formed of a metal material. In another exemplary embodiment, the carrier injection line (EP) 34 may be formed of a polycide material (e.g., a combination of a metal material and a silicon material). In other exemplary embodiments, the carrier injection line (EP) 34 may be formed of an N+ doped silicon layer.

In an exemplary embodiment, the P– substrate 130 may be made of a semiconductor material (e.g., silicon) comprising acceptor impurities and may form a base of the memory cell array 20. For example, the P– substrate 130 may be made of a semiconductor material comprising boron impurities. In an exemplary embodiment, the P– substrate 130 may be made of silicon comprising boron impurities having a concentration of $10^{15}$ atoms/cm$^3$. In alternative exemplary embodiments, a plurality of P– substrates 130 may form the base of the memory cell array 20 or a single P– substrate 130 may form the base of the memory cell array 20. Also, the P– substrate 130 may be made in the form of a P-well substrate.

Figure 4:
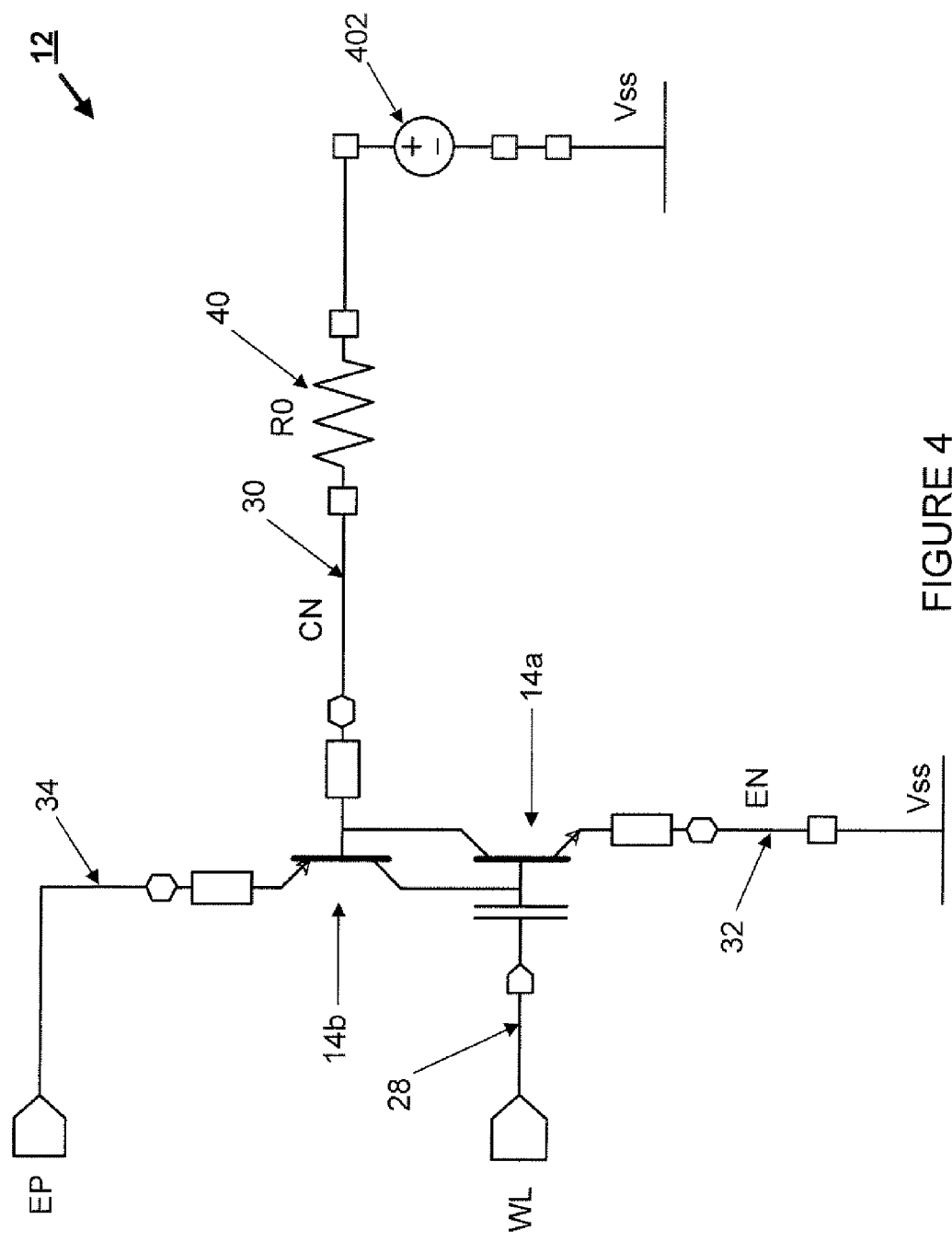
FIG. 4 shows a schematic diagram of a memory cell of the memory cell array in accordance with an embodiment of the present disclosure.

Referring to FIG. 4, there is shown a schematic diagram of a memory cell 12 of the memory cell array 20 in accordance with an embodiment of the present disclosure. The memory cell may comprise a first bipolar transistor 14a and a second bipolar transistor 14b coupled to each other. For example, the first bipolar transistor 14a and/or the second bipolar transistor 14b may be an NPN bipolar transistor or a PNP bipolar transistor. The first bipolar transistor 14a may be an NPN bipolar transistor and the second bipolar transistor 14b may be a PNP bipolar transistor. In another exemplary embodiment, the first memory transistor 14a may be a PNP bipolar transistor and the second memory transistor 14b may be an NPN bipolar transistor. The memory cell 12 may be coupled to a respective word line (WL) 28, a respective bit line (CN) 30, a respective source line (EN) 32, and/or a respective carrier injection line (EP) 34. Data may be written to or read from a selected memory cell 12 by applying suitable control signals to a selected word line (WL) 28, a selected bit line (CN) 30, a selected source line (EN) 32, and/or a selected carrier injection line (EP) 34. In an exemplary embodiment, the word line (WL) 28 may extend horizontally parallel to the carrier injection line (EP) 34.

The respective bit line (CN) 30 may be coupled to a data sense amplifier circuit of the data write and sense circuitry 36 and/or a constant power source 402 (e.g., a voltage potential source and a current source). For example, the respective bit line (CN) 30 may be coupled to the data write and sense circuitry 36 via a decoupling resistor 40. The decoupling resistor 40 may have a predetermined resistance in order to lower a barrier voltage potential of the junction between the second portion of the P– body region 122 and the P+ drain region 124 during various operations (e.g., read or write operations). In an exemplary embodiment, the decoupling resistor 40 may have a predetermined resistance to generate a current between a current that may represent a logic low (e.g., binary "0" data state) and a current that may represent a logic high (e.g., binary "1" data state). In another exemplary embodiment, the decoupling resistor 40 may have a predetermined resistance to generate a 0.5 voltage potential drop. One or more control signals may be applied to one or more selected memory cells 12 via a selected word line (WL) 28, a selected bit line (CN) 30, a selected source line (EN) 32, and/or a selected carrier injection line (EP) 34. A voltage potential and/or a current may be generated by the one or more selected memory cells 12 and outputted to the data sense amplifier circuit of the data write and sense circuitry 36 via a corresponding bit line (CN) 30 and the decoupling resistor 40.

Also, a data state may be written to one or more selected memory cells 12 by applying one or more control signals via one or more corresponding word line (WL) 28, source line (EN) 32, and/or carrier injection line (EP) 34. The one or more control signals applied via the corresponding word line (WL) 28 and/or carrier injection line (EP) 34 may control the second bipolar transistor 14b of the memory cell 12 in order to write a desired data state to the memory cell 12. In the event that a data state is read from and/or written to the memory cell 12 via the word line (WL) and/or the carrier injection line (EP) 34, then the bit line (CN) 30 may be coupled to the data sense amplifier circuit of the data write and sense circuitry 36 while the source line (EN) 32 may be separately coupled to an electrical ground (Vss) of the data write and sense circuitry 36. In an exemplary embodiment, the data sense amplifier circuit of the data write and sense circuitry 36 and the voltage/current source of the data write and sense circuitry 36 may be configured on opposite sides of the memory cell array 20. In another exemplary embodiment, the data write and sense circuitry 36 may include a plurality of data sense amplifier circuits configured on opposite sides of the memory cell array 20.

Figure 5:
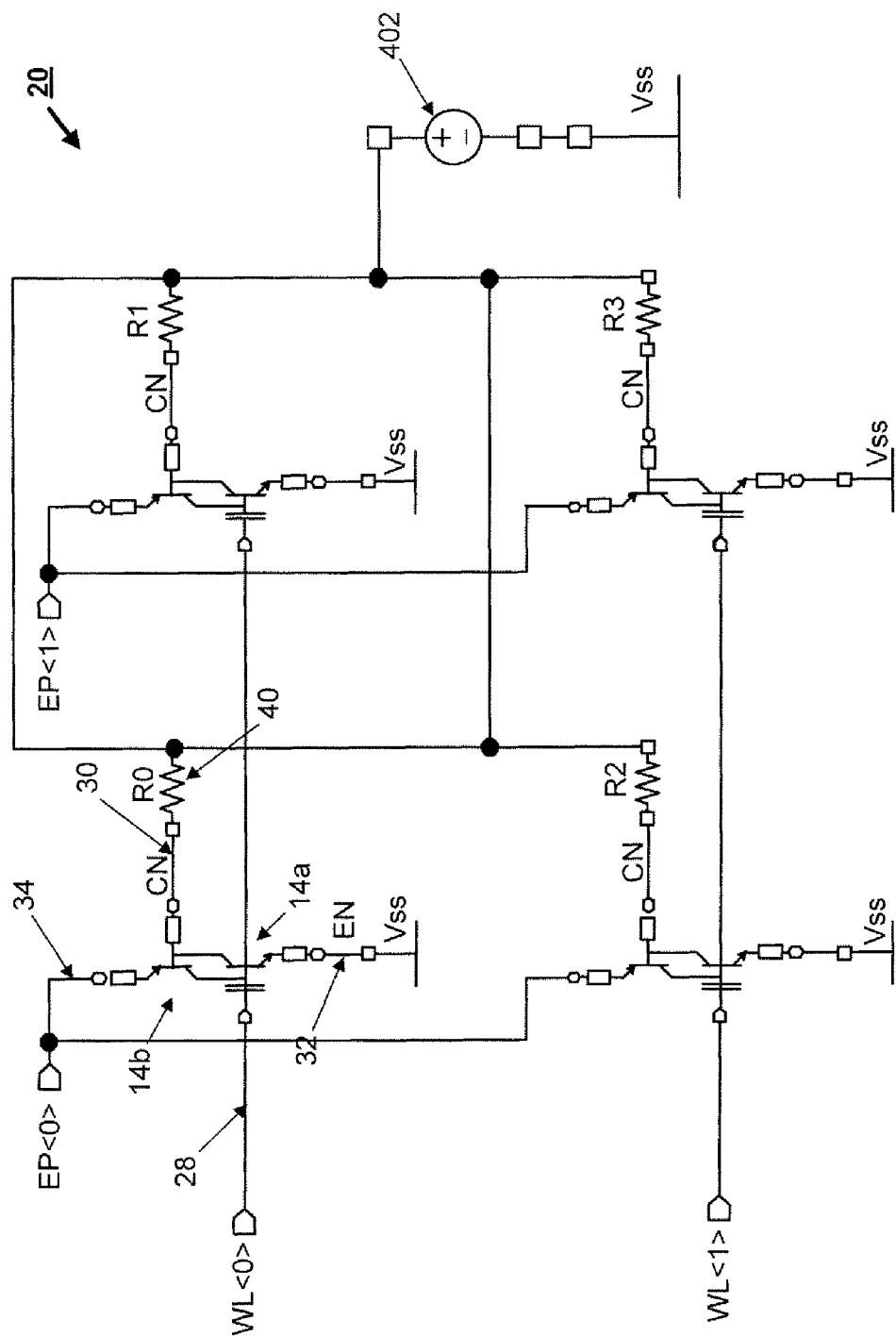
FIG. 5 shows a schematic diagram of at least a portion of a memory cell array having a plurality of memory cells as shown in FIG. 4 in accordance with an embodiment of the present disclosure.

Referring to FIG. 5, there is shown a schematic diagram of at least a portion of a memory cell array 20 having a plurality of memory cells 12 as shown in FIG. 4 in accordance with an embodiment of the present disclosure. As discussed above, the memory cell 12 may comprise a first bipolar transistor 14a and a second bipolar transistor 14b coupled to each other. The first bipolar transistor 14a may be an NPN bipolar transistor and the second bipolar transistor 14b may be a PNP bipolar transistor. The memory cell 12 may be coupled to a respective word line (WL) 28, a respective bit line (CN) 30, a respective source line (EN) 32, and/or a respective carrier injection line (EP) 34. The respective bit line (CN) 30 may be coupled to a data sense amplifier circuit of the data write and sense circuitry 36. For example, the respective bit line (CN) 30 may be coupled to the data write and sense circuitry 36 via a decoupling resistor 40.

As illustrated in FIG. 5, the plurality of memory cells 12 may be coupled to a constant power source 402 (e.g., voltage potential source or current source) via the bit line (CN) 30 and the decoupling resistor 40. In an exemplary embodiment, a plurality of rows and columns of memory cells 12 of the memory cell array 20 may be coupled to the constant power source 402. It may be appreciated by one skilled in the art that the number of rows and columns of memory cells 12 coupled to the constant power source 402 may vary, for example symmetrical, but not limited to, four rows by four columns, sixteen rows by sixteen columns, thirty-two rows by thirty-two columns, sixty-four rows by sixty-four columns, etc. Also, the number of rows and columns of memory cells 12 coupled to the constant power source 402 may be asymmetrical, for example, but not limited to, four rows by two columns, eight rows by four columns, sixteen rows by thirty-two columns, etc.

In an exemplary embodiment, memory cells 12 may be written using a two step operation wherein a given row of memory cells are written to a first predetermined data state by first executing a "clear" operation (e.g., all the memory cells 12 of a selected row are written or programmed to logic low (binary "0" date state)). In particular, the first portion of the P– body region 122 of each memory cell 12 of a selected row is controlled to store a majority charge carrier having a concentration that corresponds to a logic low (binary "0" data state). Thereafter selected memory cells 12 may be written to a second predetermined data state (e.g., a selective write operation to the second predetermined data state, logic high (binary "1" data state)). For example, the first portion of the P– body region 122 of the memory cell 12 may be controlled to store a majority charge carrier having a concentration that corresponds to a logic high (e.g., binary "1" data state).

Figure 6:
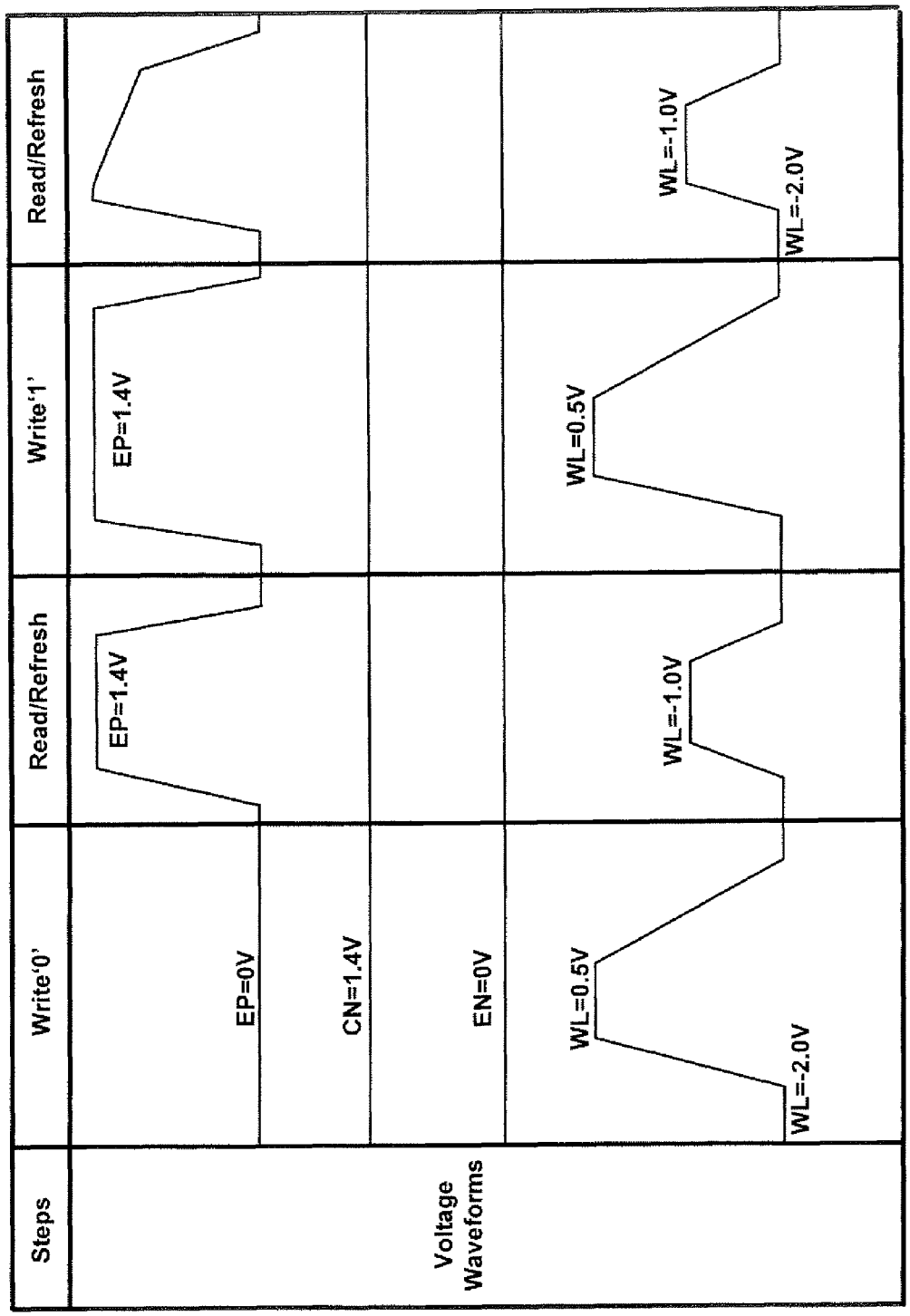
FIG. 6 shows control signal voltage waveforms for performing various operations on memory cells as shown in FIG. 5 in accordance with an embodiment of the present disclosure.

Referring to FIG. 6, there are shown control signal voltage waveforms for performing various operations on memory cells 12 as shown in FIG. 5 in accordance with an embodiment of the present disclosure. For example, the various operations may include control signals configured to perform a write logic low (e.g., binary "0" data state) operation, a read operation, a write logic high (e.g., binary "1" data state) operation, and/or a refresh operation. Prior to performing various operations, the control signals may be configured to perform a hold operation in order to maintain a data state (e.g., a logic high (binary "1" data state) or a logic low (binary "0" data state)) stored in the memory cell 12. In particular, the control signals may be configured to perform a hold operation in order to maximize a retention time of a data state (e.g., a logic low (binary "0" data state) and/or a logic high (binary "1" data state)) stored in the memory cell 12. Also, the control signals for the hold operation may be configured to eliminate or reduce activities or field (e.g., electrical fields between junctions which may lead to leakage of charges) within the memory cell 12. In an exemplary embodiment, during a hold operation, a negative voltage potential may be applied to the word line (WL) 28 that may be capacitively coupled to one or more portions of the P– body region 122 of the memory cell 12 while a constant voltage potential may be applied to the second portion of the P– body region 122 via the bit line (CN) 30 and the decoupling resistor 40. The voltage potentials applied to other regions (e.g., the N+ source region 120 and/or P+ drain region 124) may be maintained at 0V.

For example, the negative voltage potential applied to the word line (WL) 28 (e.g., capacitively coupled to the P– region 122 of the memory cell 12) may be −2.0V. The constant voltage potential applied to the second portion of the P– body region 122 via the bit line (CN) 30 and the decoupling resistor 40 may be 1.4V. During the hold operation, the junction between the N+ source region 120 and first portion of the P– body region 122 and the junction between the P+ drain region 124 and the second portion of the P– body region 122 may be reverse biased in order to retain a data state (e.g., a logic high (binary "1" data state) or a logic low (binary "0" data state)) stored in the memory cell 12.

In an exemplary embodiment, control signals may be configured to perform one or more write logic low (e.g., binary "0" data state) operations to one or more selected memory cells 12. For example, the write logic low (e.g., binary "0" data state) operation may be performed to one or more selected memory cells 12 in order to deplete charge carriers that may have accumulated/stored in the P– body regions 122 of the one or more selected memory cells 12. Various voltage potentials may be applied to the various regions of the memory cell 12. In an exemplary embodiment, the voltage potentials applied to the N+ source region 120 may be coupled to an electrical ground (Vss) and the P+ drain region 124 may be maintained at 0V. The constant voltage potential of 1.4V may be applied to the second portion of the P– body region 122 via the decoupling resistor 40. The voltage potential applied to the word line (WL) 28 that may be capacitively coupled to a first portion of the P– body region 122 may be raised from a voltage potential applied during the hold operation. In an exemplary embodiment, the voltage potential applied to the word line (WL) 28 that may be capacitively coupled to the first portion of the P– body region 122 may be raised to 0.5V.

Under such biasing, the junction between the N+ source region 120 and the first portion of the P– body region 122 and the junction between the first portion of the P– body region 122 and the second portion of the P– body region 122 may be forward biased. The junction between the second portion of the P– body region 122 and the P+ drain region 124 may be reverse biased. The majority charge carriers (e.g., holes) that may have accumulated/stored in the first portion of the P– body region 122 may flow to the second portion of the P– body region 122 and lower a voltage potential barrier at the junction between the second portion of the P– body region 122 and the P+ drain region 124. Also, the majority charge carrier (e.g., holes) that may have accumulated/stored in the first portion of the P– body region 122 may flow to the N+ source region 120. Thus, the majority charge carriers (e.g., hole) that may have accumulated/stored in first portion of the P– body region 122 may be depleted via the second portion of the P– body region 122 and/or the N+ source region 120. By removing the majority charge carriers that may have accumulated/stored in first portion of the P– body region 122, a logic low (e.g., binary "0" data state) may be written to the memory cell 12.

In an exemplary embodiment, control signals may be configured to perform a read operation of a data state (e.g., a logic low (binary "0" data state) and/or a logic high (binary "1" data state)) stored in one or more selected memory cells 12 of one or more selected rows of the memory cell array 20. The controls signals may be also configured to perform a refresh operation of a data state (e.g., a logic low (binary "0" data state) and/or a logic high (binary "1" data state)) stored in one or more selected memory cells 12 of the one or more selected rows of the memory cell array 20. In an exemplary embodiment, the control signals may be configured to perform a read operation and a refresh operation simultaneously.

The control signals may be configured to a predetermined voltage potential to implement a read operation via the bit line (CN) 30 and/or a refresh operation. In an exemplary embodiment, the N+ source region 120 may be coupled to an electrical ground (Vss) via the source line (EN) 32 and the constant voltage potential applied to bit line (CN) 30 to the second portion of the P– body region 122 via the decoupling resistor 40 (e.g., a 0.5V drop) may be maintained at 1.4V. The voltage potential applied to the word line (WL) 28 that may be capacitively coupled to the first portion of the P– body region 122 and the voltage potential applied to the P+ drain region 124 may be raised from the voltage potentials applied during the hold operation. In an exemplary embodiment, the voltage potential applied to the word line (WL) 28 that may be capacitively coupled to the first portion of the P– body region 122 may be raised to −1.0V. The voltage potential applied to the P+ drain region 124 via the carrier injection line (EP) 34 may be raised to 1.4V.

Under such biasing, when a logic low (e.g., binary "0" data state) is stored in the memory cell 12, the predetermined amount of majority charge carriers (e.g., holes) accumulated/stored in the first portion of the P– body region 122 may flow toward the second portion of the P– body region 122. The predetermined amount of majority charge carriers flown to the second portion of the P– body region 122 may lower a voltage potential at the second portion of the P– body region 122. Also, the predetermined amount of majority charge carriers flown to the second portion of the P– body region 122 may lower the voltage potential barrier at the junction between the second portion of the P− body region 122 and the P+ drain region 124. However, the junction between the second portion of the P− body region 122 and the P+ drain region 124 may remain reverse biased or become weakly forward biased (e.g., above a reverse bias voltage and below a forward bias threshold voltage potential). A small amount of voltage potential and current or no voltage potential and current (e.g., compared to a reference voltage potential or current) may be generated when the junction between the second portion of the P− body region 122 and the P+ drain region 124 is reverse biased or weakly forward biased. A data sense amplifier in the data write and sense circuitry 36 may detect the small amount of voltage potential or current (e.g., compared to a reference voltage potential or current) or no voltage potential or current via the bit line (CN) 30 coupled to the second portion of the P− body region 122.

Simultaneously to the read operation, the control signals may be configured to perform a refresh operation. Under the biasing during the read operation, the junction between the first portion of the P− body region 122 and the N+ source region 120 may be forward biased. A predetermined amount of residual majority charge carriers (e.g., holes) accumulated/stored in the first portion of the P− body region 122 may be depleted from the first portion of the P− body region 122. Also, as discussed above, a predetermined amount of majority charge carriers (e.g., holes) accumulated/stored in the first portion of the P− body region 122 may flow from the first portion of the P− body region 122 to the second portion of the P− body region 122 and thus lowering the voltage potential at the second portion of the P− body region 122. Thus, the majority charge carriers (e.g., holes) accumulated/stored in the first portion of the P− body region 122 may be depleted from the first portion of the P− body region 122 and a logic low (e.g., binary "0" data state) may be refreshed.

In an exemplary embodiment, control signals may be configured to write a logic high (e.g., binary "1" data state) to one or more selected memory cells 12 of one or more selected rows of the memory cell array 20. For example, the write logic high (e.g., binary "1" data state) operation may be performed on one or more selected rows of the memory cell array 20 or the entire memory cell array 20. In another exemplary embodiment, a write logic high (e.g., binary "1" data state) operation may have control signals configured to cause accumulation/storage of majority charge carriers in the P− body region 122.

In an exemplary embodiment, a voltage potential applied to the N+ source region 120 of the memory cell 12 may be coupled to an electrical ground (Vss) via the source line (EN) 32 and a constant voltage potential applied to the bit line (CN) 30 to the second portion of the P− body region 122 of the memory cells via the decoupling resistor 40 (e.g., 0.5V drop) may be maintained at the same voltage potential as the voltage potential during the hold operation. For example, a voltage potential applied to the bit line (CN) 30 to the second portion of the P− body region 122 may be maintained at 1.4V.

The voltage potential applied to the word line (WL) 28 that may be capacitively coupled to the first portion of the P− body region 122 and the voltage potential applied to P+ drain region 124 may be raised from the voltage potentials applied during the hold operation. For example, the voltage potential applied to the word line (WL) 28 that may be capacitively coupled to the first portion of the P− body region 122 may be raised to 0.5V from −2.0V. The voltage potential applied to the P+ drain region 124 via the carrier injection line (EP) 34 may be raised to 1.4V from 0V.

Under such biasing, the junction between the N+ source region 120 and the first portion of the P− body region 122, the junction between the first portion of the P− body region 122 and the second portion of the P− body region 122, and the junction between the second portion of the P− body region 122 and the P+ drain region 124 may become forward biased. For example, the majority charge carriers (e.g., holes) at the first portion of the P− body region 122 may flow toward the second portion of the P− body region 122. The flow of majority charge carriers to the second portion of the P− body region 122 may lower a voltage potential at the second portion of the P− body region 122 and thus lowering a voltage potential barrier at the junction between the second portion of the P− body region 122 and the P+ drain region 124. The junction between the second portion of the P− body region 122 and the P+ drain region 124 may become forward biased (e.g., above a forward bias threshold voltage potential). Additional majority charge carriers (e.g., holes) may flow through the forward biased junction between the P+ drain region 124 and the second portion of the P− body region 122 toward the first portion of the P− body region 122. Subsequently, the voltage potential applied on the word line (WL) 28 that may be capacitively coupled to the first portion of the P− body region 122 may be lowered to −2.0V from 0.5V. Thu, a predetermined amount of majority charge carriers (e.g., holes) may be accumulated/stored in the first portion of the P− body region 122 via the P+ drain region 124 and the second portion of the P− body region 122. The predetermined amount of charge carriers accumulated/stored in the first portion (e.g., capacitively coupled to word line (WL) 28) of the P− body region 122 may represent that a logic high (e.g., binary "1" data state) may be written in the memory cell 12.

Again, the control signals may be configured to perform a second read operation of a data state (e.g., a logic low (binary "0" data state) and/or a logic high (binary "1" data state)) stored in one or more selected memory cells 12 of one or more selected rows of the memory cell array 20. The controls signals may be also configured to perform a refresh operation of a data state (e.g., a logic low (binary "0" data state) and/or a logic high (binary "1" data state)) stored in one or more selected memory cells 12 of the one or more selected rows of the memory cell array 20. In an exemplary embodiment, the control signals may be configured to perform a read operation and a refresh operation simultaneously.

The control signals may be configured to a predetermined voltage potential to implement a read operation via the bit line (CN) 30 and/or a refresh operation. In an exemplary embodiment, the N+ source region 120 may be coupled to an electrical ground (Vss) via the source line (EN) 32 and the constant voltage potential applied to the bit line (CN) 30 to second portion of the P− body region 122 via the decoupling resistor 40 (e.g., a 0.5V drop) may be maintained at 1.4V. The voltage potential applied to the word line (WL) 28 that may be capacitively coupled to the first portion of the P− body region 122 and the voltage potential applied to the P+ drain region 124 may be raised from the voltage potentials applied during the hold operation. In an exemplary embodiment, the voltage potential applied to the word line (WL) 28 that may be capacitively coupled to the first portion of the P− body region 122 may be raised to −1.0V. The voltage potential applied to the P+ drain region 124 via the carrier injection line (EP) 34 may be raised to 1.4V.

Under such biasing, when a logic high (e.g., binary "1" data state) is stored in the memory cell 12, the predetermined amount of majority charge carriers (e.g., that may represent a logic high (e.g., binary "1" data state)) accumulated/stored in the first portion of the P− body region 122 may flow toward the second portion of the P− body region 122. The predetermined amount of majority charge carriers flown to the second portion of the P– body region 122 may lower a voltage potential at the second portion of the P– body region 122. The predetermined amount of majority charge carriers flown to the second portion of the P– body region 122 may lower the voltage potential barrier at the junction between the second portion of the P– body region 122 and the P+ drain region 124. The junction between the second portion of the P– body region 122 and the P+ drain region 124 may be forward biased (e.g., above a forward bias threshold voltage potential). A predetermined amount of voltage potential and/or current may be generated when the junction between the second portion of the P– body region 122 and the P+ drain region 124 is forward biased. A data sense amplifier in the data write and sense circuitry 36 may detect the generated voltage potential or current (e.g., compared to a reference voltage potential or current) via the bit line (CN) 30 and the decoupling resistor 40 coupled to the second portion of the P– body region 122.

Simultaneously to the read operation, the control signals may be configured to perform a refresh operation. Under the biasing during the read operation, the junction between the second portion of the P– body region 122 and the P+ drain region 124 may be forward biased. A predetermined amount of majority charge carriers (e.g., holes) may flow from the P+ drain region 124 to the first portion of the P– body region 122 via the second portion of the P– body region 122. The flow of predetermined amount of majority charge carriers from the P+ drain region 124 may gradually lower the voltage potential at the P+ drain region 124. Also, the junction between first portion of the P– body region 122 and the N+ source region 120 may be forward biased and thus a predetermined amount of electrons may flow from the N+ source region 120 to the first portion of the P– body region 122. The flow of electrons may facilitate the flow of majority charge carriers (e.g., holes) to the first portion of the P– body region 122. The voltage potential applied to the word line (WL) 28 (e.g., that may be capacitively coupled to the first portion of the P– body region 122) may be lowered from –1.0V to –2.0V and thus a predetermined amount of majority charge carriers may be accumulated/stored in the first portion of the P– body region 122. Thus, the predetermined amount of majority charge carriers (e.g., holes) accumulated/stored in the first portion of the P– body region 122 may be restored to the first portion of the P– body region 122 and a logic low (e.g., binary "0" data state) may be refreshed.

Figure 7:
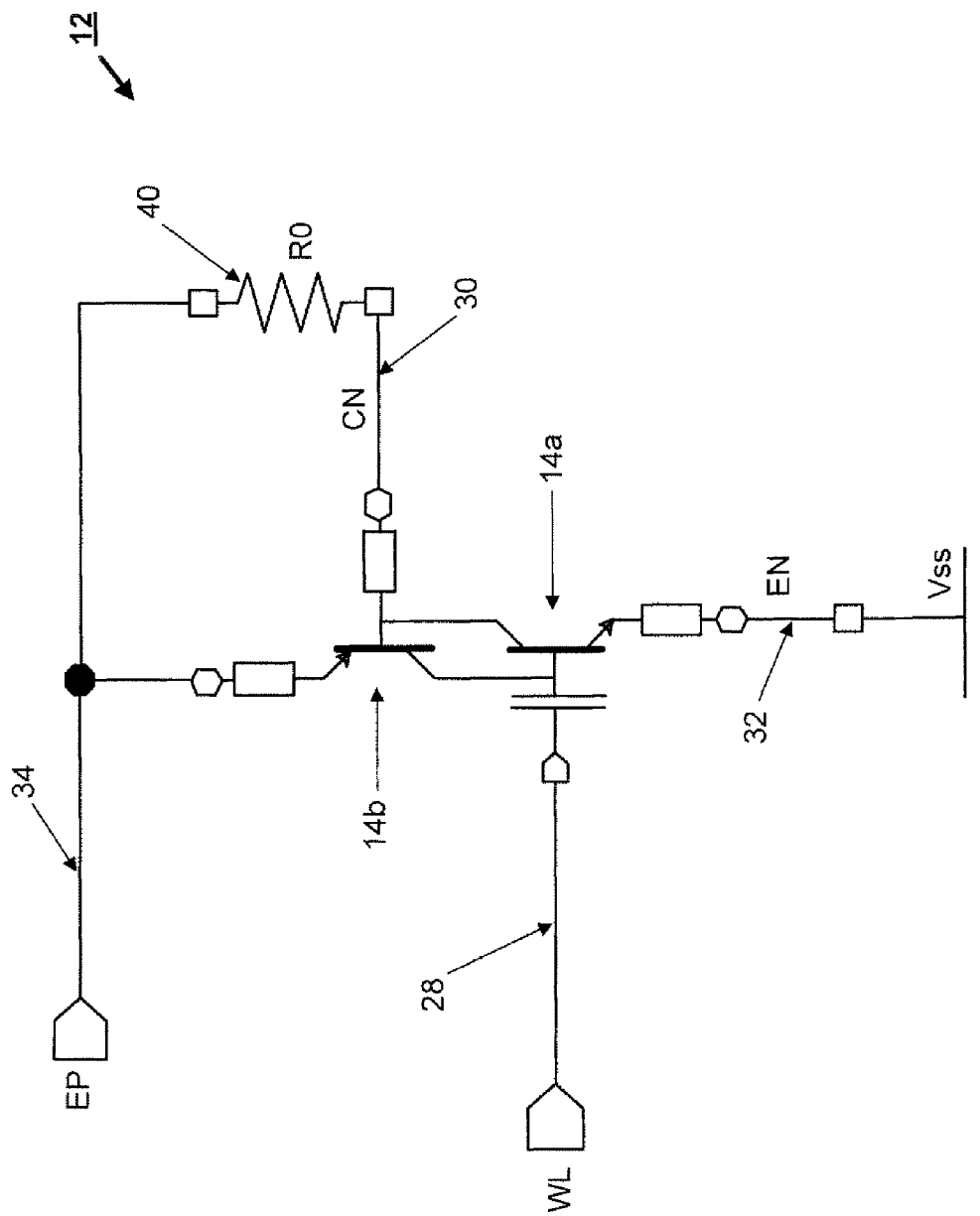
FIG. 7 shows a schematic diagram of a memory cell of the memory cell array in accordance with an alternate embodiment of the present disclosure.

Referring to FIG. 7, there is shown a schematic diagram of a memory cell 12 of the memory cell array 20 in accordance with an alternate embodiment of the present disclosure. The memory cell 12 illustrated in FIG. 7 may be similar to the memory cell 12 illustrated in FIG. 4, except that the bit line (CN) 30 may be coupled to the carrier injection line (EP) 34 via the decoupling resistor 40. The voltage potential applied to the bit line (CN) 30 may be associated with the voltage potential applied to the carrier injection line (EP) 34. For example, the voltage potential applied to the bit line (CN) 30 may be equal to the voltage potential applied to the carrier injection line (EP) 34 minus the voltage potential drop at the decoupling resistor (RO) 40.

The respective bit line (CN) 30 may be coupled to a data sense amplifier circuit of the data write and sense circuitry 36. For example, the respective bit line (CN) 30 may be coupled to the data write and sense circuitry 36 via a decoupling resistor 40. The decoupling resistor 40 may have a predetermined resistance in order to lower a barrier voltage potential of the junction between the second portion of the P– body region 122 and the P+ drain region 124 during various operations (e.g., read or write operations). In an exemplary embodiment, the decoupling resistor 40 may have a resistance so that the voltage potential and/or current generated by the selected memory cells 12 may lower an energy barrier at the junction between the second portion of the P– body region 122 and the P+ drain region 124.

Figure 8:
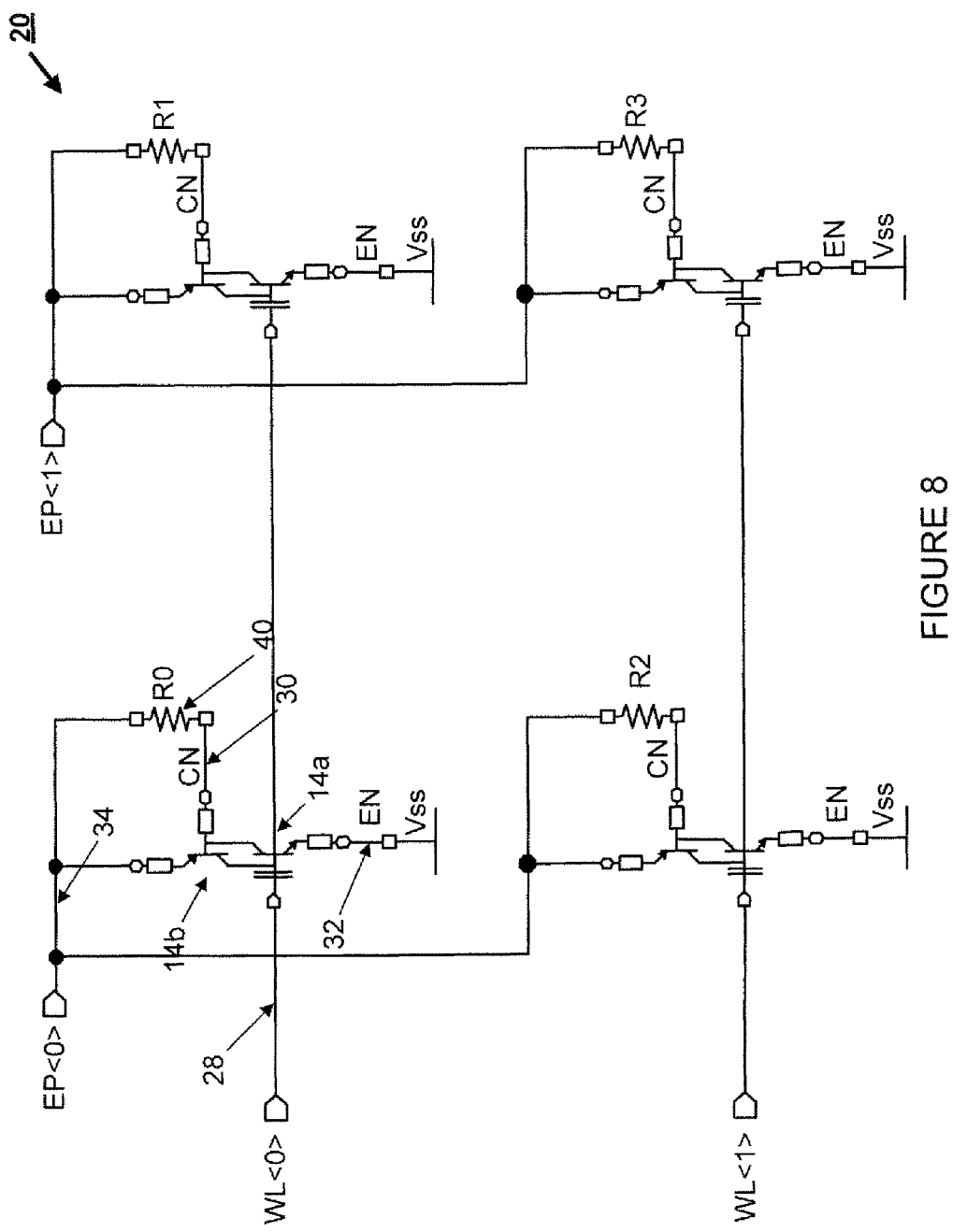
FIG. 8 shows a schematic diagram of at least a portion of a memory cell array having a plurality of memory cells as shown in FIG. 7 in accordance with an alternate embodiment of the present disclosure.

Referring to FIG. 8, there is shown a schematic diagram of at least a portion of a memory cell array 20 having a plurality of memory cells 12 as shown in FIG. 7 in accordance with an alternative embodiment of the present disclosure. The memory cell array 20 illustrated in FIG. 8 may be similar to the memory cell array 20 illustrated in FIG. 5, except that the bit line (CN) 30 may be coupled to the carrier injection line (EP) 34 via the decoupling resistor 40. As discussed above, the memory cell 12 may be coupled to a respective word line (WL) 28, a respective bit line (CN) 30, a respective source line (EN) 32, and/or a respective carrier injection line (EP) 34. The respective bit line (CN) 30 may be coupled to a data sense amplifier circuit of the data write and sense circuitry 36. For example, the respective bit line (CN) 30 may be coupled to the data write and sense circuitry 36 via the decoupling resistor 40.

As illustrated in FIG. 8, the plurality of memory cells 12 configured in a column direction of the memory cell array 20 may be coupled to the respective carrier injection line (EP) 34. The bit lines (CN) 30 of the plurality of memory cells 12 configured in a column direction of the memory cell array 20 may be coupled to a respective carrier injection line (EP) 34 via the respective decoupling resistors 40.

Figure 9:
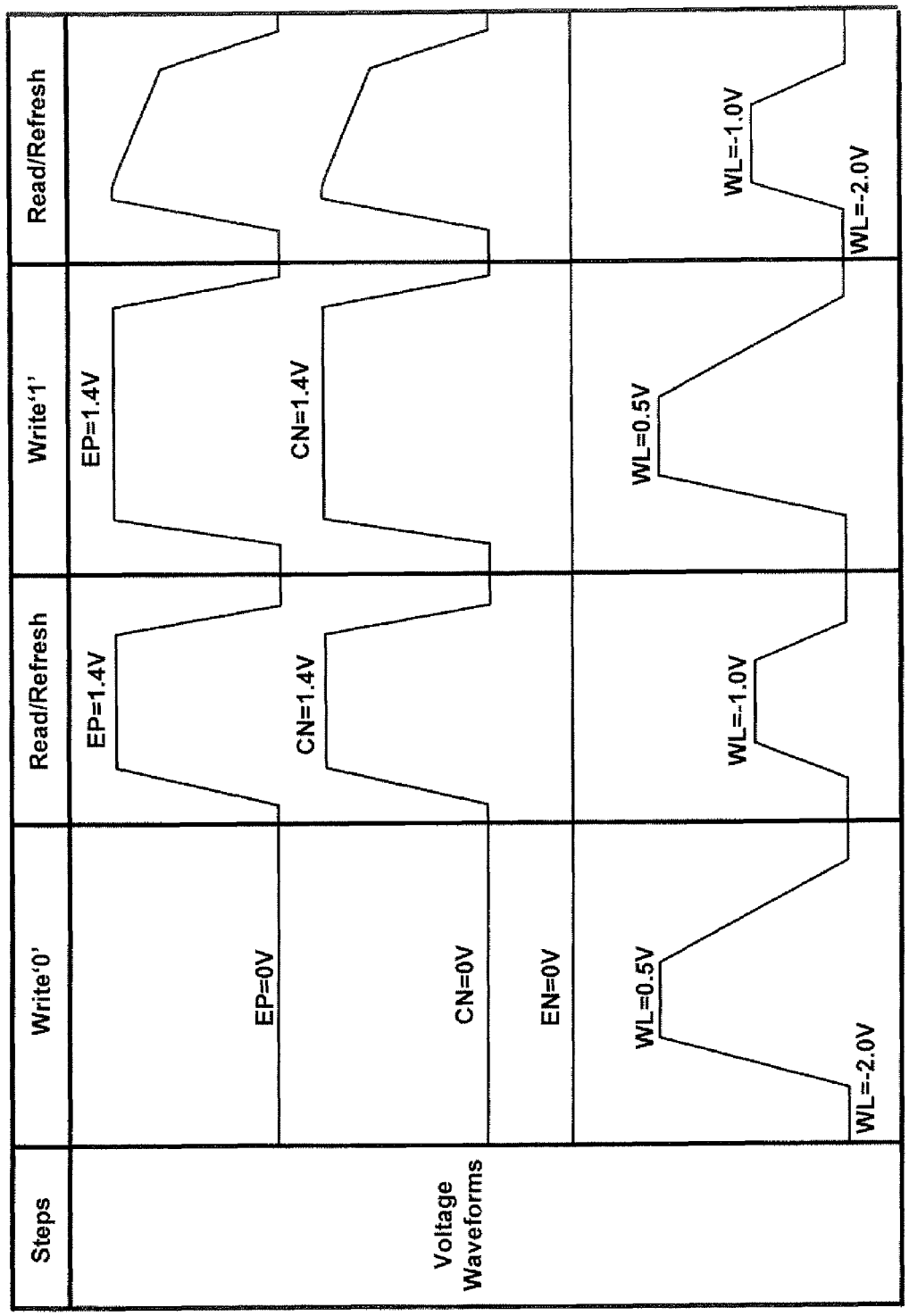
FIG. 9 shows control signal voltage waveforms for performing various operations on memory cells as shown in FIG. 8 in accordance with an embodiment of the present disclosure.

Referring to FIG. 9, there are shown control signal voltage waveforms for performing various operations on memory cells 12 as shown in FIG. 8 in accordance with an embodiment of the present disclosure. For example, the various operations may include control signals configured to perform a write logic low (e.g., binary "0" data state) operation, a read operation, a write logic high (e.g., binary "1" data state) operation, and/or a refresh operation. Prior to performing various operations, the control signals may be configured to perform a hold operation in order to maintain a data state (e.g., a logic high (binary "1" data state) or a logic low (binary "0" data state)) stored in the memory cell 12. In particular, the control signals may be configured to perform a hold operation in order to maximize a retention time of a data state (e.g., a logic low (binary "0" data state) and/or a logic high (binary "1" data state)) stored in the memory cell 12. Also, the control signals for the hold operation may be configured to eliminate or reduce activities or field (e.g., electrical fields between junctions which may lead to leakage of charges) within the memory cell 12. In an exemplary embodiment, during a hold operation, a negative voltage potential may be applied to the word line (WL) 28 that may be capacitively coupled to one or more portions of the P– body region 122 of the memory cell 12 while a constant voltage potential may be applied to the bit line (CN) 30 to the second portion of the P– body region 122 via the decoupling resistor 40. The voltage potentials applied to other regions (e.g., the N+ source region 120 and/or P+ drain region 124) may be maintained at 0V.

For example, the negative voltage potential applied to the word line (WL) 28 (e.g., capacitively coupled to the P– region 122 of the memory cell 12) may be –2.0V. The constant voltage potential applied to the bit line (CN) 30 to the second portion of the P– body region 122 may be 1.4V. During the hold operation, the junction between the N+ source region 120 and first portion of the P– body region 122 and the junction between the P+ drain region 124 and the second portion of the P– body region 122 may be reverse biased in order to retain a data state (e.g., a logic high (binary "1" data state) or a logic low (binary "0" data state)) stored in the memory cell 12.

In an exemplary embodiment, control signals may be configured to perform one or more write logic low (e.g., binary "0" data state) operations to one or more selected memory cells 12. For example, the write logic low (e.g., binary "0" data state) operation may be performed to one or more selected memory cells 12 in order to deplete charge carriers that may have accumulated/stored in the P− body regions 122 of the one or more selected memory cells 12. Various voltage potentials may be applied to the various regions of the memory cell 12. In an exemplary embodiment, the voltage potentials applied to the N+ source region 120 may be coupled to an electrical ground (Vss) and voltage potential applied to the bit line (CN) 30 to the second portion of the P− body region 122 and the P+ drain region 124 may be maintained the same as the voltage potential applied during the hold operation. The voltage potential applied to the word line (WL) 28 that may be capacitively coupled to a first portion of the P− body region 122 may be raised from a voltage potential applied during the hold operation. In an exemplary embodiment, the voltage potential applied to the P+ drain region 124 and the bit line (CN) 30 to the second portion of the P-body region 122 may be maintained at 0V. The voltage potential applied to the word line (WL) 28 that may be capacitively coupled to the first portion of the P− body region 122 may be raised to 0.5V from −2.0V.

Under such biasing, the junction between the N+ source region 120 and the first portion of the P− body region 122 and the junction between the first portion of the P− body region 122 and the second portion of the P− body region 122 may be forward biased. The junction between the second portion of the P− body region 122 and the P+ drain region 124 may be reverse biased. The majority charge carriers (e.g., holes) that may have accumulated/stored in the first portion of the P− body region 122 may flow to the second portion of the P− body region 122 and lower a voltage potential barrier at the junction between the second portion of the P− body region 122 and the P+ drain region 124. Also, the majority charge carrier (e.g., holes) that may have accumulated/stored in the first portion of the P− body region 122 may flow to the N+ source region 120. Thus, the majority charge carriers (e.g., hole) that may have accumulated/stored in first portion of the P− body region 122 may be depleted via the second portion of the P− body region 122 and/or the N+ source region 120. By removing the majority charge carriers that may have accumulated/stored in first portion of the P− body region 122, a logic low (e.g., binary "0" data state) may be written to the memory cell 12.

In an exemplary embodiment, control signals may be configured to perform a read operation of a data state (e.g., a logic low (binary "0" data state) and/or a logic high (binary "1" data state)) stored in one or more selected memory cells 12 of one or more selected rows of the memory cell array 20. The controls signals may be also configured to perform a refresh operation of a data state (e.g., a logic low (binary "0" data state) and/or a logic high (binary "1" data state)) stored in one or more selected memory cells 12 of the one or more selected rows of the memory cell array 20. In an exemplary embodiment, the control signals may be configured to perform a read operation and a refresh operation simultaneously.

The control signals may be configured to a predetermined voltage potential to implement a read operation via the bit line (CN) 30 and/or a refresh operation. In an exemplary embodiment, the N+ source region 120 may be coupled to an electrical ground (Vss) via the source line (EN) 32. The voltage potential applied to the word line (WL) 28 that may be capacitively coupled to the first portion of the P− body region 122, the voltage potential applied to the P+ drain region 124, the voltage potential applied to the bit line (CN) 30 to the second portion of the P− body region 122 may be raised from the voltage potentials applied during the hold operation. The voltage potential applied to the bit line (CN) 30 to the second portion of the P− body region 122 via the decoupling resistor 40 may be based at least in part on the voltage potential applied to the P+ drain region 124. In an exemplary embodiment, the voltage potential applied to the word line (WL) 28 that may be capacitively coupled to the first portion of the P− body region 122 may be raised to −1.0V. The voltage potential applied to the P+ drain region 124 via the carrier injection line (EP) 34 may be raised to 1.4V. The voltage potential applied to the bit line (CN) 30 may be 1.4V or 0.9V at the second portion of the P− body region 122 after a 0.5V drop across the decoupling resistor 40.

Under such biasing, when a logic low (e.g., binary "0" data state) is stored in the memory cell 12, the predetermined amount of majority charge carriers (e.g., holes) accumulated/stored in the first portion of the P− body region 122 may flow toward the second portion of the P− body region 122. The predetermined amount of majority charge carriers (e.g., represent a logic low (e.g., binary "0" data state)) flown to the second portion of the P− body region 122 may lower a voltage potential at the second portion of the P− body region 122. Also, the predetermined amount of majority charge carriers flown to the second portion of the P− body region 122 may lower the voltage potential barrier at the junction between the second portion of the P− body region 122 and the P+ drain region 124. However, the junction between the second portion of the P− body region 122 and the P+ drain region 124 may remain reverse biased or become weakly forward biased (e.g., above a reverse bias voltage and below a forward bias threshold voltage potential). A small amount of voltage potential and current or no voltage potential and current (e.g., compared to a reference voltage potential or current) may be generated when the junction between the second portion of the P− body region 122 and the P+ drain region 124 is reverse biased or weakly forward biased. A data sense amplifier in the data write and sense circuitry 36 may detect the small amount of voltage potential or current (e.g., compared to a reference voltage potential or current) or no voltage potential or current via the bit line (CN) 30 coupled to the second portion of the P− body region 122.

Simultaneously to the read operation, the control signals may be configured to perform a refresh operation. Under the biasing during the read operation, the junction between the first portion of the P− body region 122 and the N+ source region 120 may be forward biased. A predetermined amount of residual majority charge carriers (e.g., holes) accumulated/stored in the first portion of the P− body region 122 may be depleted from the first portion of the P− body region 122 via the N+ source region 120. Also, as discussed above, a predetermined amount of majority charge carriers (e.g., holes) accumulated/stored in the first portion of the P− body region 122 may flow from the first portion of the P− body region 122 to the second portion of the P− body region 122 and thus lowering the voltage potential at the second portion of the P− body region 122. Thus, the majority charge carriers (e.g., holes) accumulated/stored in the first portion of the P− body region 122 may be depleted from the first portion of the P− body region 122 and a logic low (e.g., binary "0" data state) may be refreshed.

In an exemplary embodiment, control signals may be configured to write a logic high (e.g., binary "1" data state) to one or more selected memory cells 12 of one or more selected rows of the memory cell array 20. For example, the write logic high (e.g., binary "1" data state) operation may be performed on one or more selected rows of the memory cell array 20 or the entire memory cell array 20. In another exemplary embodiment, a write logic high (e.g., binary "1" data state) operation may have control signals configured to cause accumulation/storage of majority charge carriers in the P− body region 122.

In an exemplary embodiment, a voltage potential applied to the N+ source region 120 of the memory cell 12 may be coupled to an electrical ground (Vss) via the source line (EN) 32. The voltage potential applied to the word line (WL) 28 that may be capacitively coupled to the first portion of the P− body region 122, the voltage potential applied to the bit line (CN) 30 to the second portion of the P− body region 122, the voltage potential applied to P+ drain region 124 may be raised from the voltage potentials applied during the hold operation. For example, the voltage potential applied to the word line (WL) 28 that may be capacitively coupled to the first portion of the P− body region 122 may be raised to 0.5V from −2.0V. The voltage potential applied to the P+ drain region 124 via the carrier injection line (EP) 34 may be raised to 1.4V from 0V. The voltage potential applied to the bit line (CN) 30 may be raised to 1.4V or 0.9V at the second portion of the P− body region 122 after a 0.5V drop across the decoupling resistor 40.

Under such biasing, the junction between the N+ source region 120 and the first portion of the P− body region 122, the junction between the first portion of the P− body region 122 and the second portion of the P− body region 122 and the junction between the second portion of the P− body region 122 and the P+ drain region 124 may become forward biased. For example, the majority charge carriers (e.g., holes) at the first portion of the P− body region 122 may flow toward the second portion of the P− body region 122. The flow of majority charge carriers to the second portion of the P− body region 122 may lower a voltage potential at the second portion of the P− body region 122 and thus lowering a voltage potential barrier at the junction between the second portion of the P− body region 122 and the P+ drain region 124. The junction between the second portion of the P− body region 122 and the P+ drain region 124 may become forward biased (e.g., above a forward bias threshold voltage potential). Additional majority charge carriers (e.g., holes) may flow through the forward biased junction between the P+ drain region 124 and the second portion of the P− body region 122 toward the first portion of the P− body region 122. Subsequently, the voltage potential applied on the word line (WL) 28 that may be capacitively coupled to the first portion of the P− body region 122 may be lowered to −2.0V from 0.5V. Thu, a predetermined amount of majority charge carriers (e.g., holes) may be accumulated/stored in the first portion of the P− body region 122 via the P+ drain region 124 and the second portion of the P− body region 122. The predetermined amount of charge carriers accumulated/stored in the first portion of the P− body region 122 may represent that a logic high (e.g., binary "1" data state) may be written in the memory cell 12.

Again, the control signals may be configured to perform a second read operation of a data state (e.g., a logic low (binary "0" data state) and/or a logic high (binary "1" data state)) stored in one or more selected memory cells 12 of one or more selected rows of the memory cell array 20. The controls signals may be also configured to perform a refresh operation of a data state (e.g., a logic low (binary "0" data state) and/or a logic high (binary "1" data state)) stored in one or more selected memory cells 12 of the one or more selected rows of the memory cell array 20. In an exemplary embodiment, the control signals may be configured to perform a read operation and a refresh operation simultaneously.

The control signals may be configured to a predetermined voltage potential to implement a read operation via the bit line (CN) 30 and/or a refresh operation. In an exemplary embodiment, the N+ source region 120 may be coupled to an electrical ground (Vss) via the source line (EN) 32. The voltage potential applied to the word line (WL) 28 that may be capacitively coupled to the first portion of the P− body region 122, the voltage potential applied to the P+ drain region 124, and the voltage potential applied to the first portion of the P− body region 122 may be raised from the voltage potentials applied during the hold operation. In an exemplary embodiment, the voltage potential applied to the word line (WL) 28 that may be capacitively coupled to the first portion of the P− body region 122 may be raised to −1.0V. The voltage potential applied to the P+ drain region 124 via the carrier injection line (EP) 34 may be raised to 1.4V. The voltage potential applied to the bit line (CN) 30 may be raised to 1.4V or 0.9V at the second portion of the P− body region 122 after a 0.5V drop across the decoupling resistor 40.

Under such biasing, when a logic high (e.g., binary "1" data state) is stored in the memory cell 12, the predetermined amount of majority charge carriers (e.g., that may represent a logic high (e.g., binary "1" data state)) accumulated/stored in the first portion of the P− body region 122 may flow toward the second portion of the P− body region 122. The predetermined amount of majority charge carriers flown to the second portion of the P− body region 122 may lower a voltage potential at the second portion of the P− body region 122. The predetermined amount of majority charge carriers flown to the second portion of the P− body region 122 may lower the voltage potential barrier at the junction between the second portion of the P− body region 122 and the P+ drain region 124. The junction between the second portion of the P− body region 122 and the P+ drain region 124 may be forward biased (e.g., above a forward bias threshold voltage potential). A predetermined amount of voltage potential and/or current may be generated when the junction between the second portion of the P− body region 122 and the P+ drain region 124 is forward biased. A data sense amplifier in the data write and sense circuitry 36 may detect the generated voltage potential or current (e.g., compared to a reference voltage potential or current) at the second portion of the P− body region 122 via the bit line (CN) 30 and the decoupling resistor 40 coupled to the second portion of the P− body region 122.

Simultaneously to the read operation, the control signals may be configured to perform a refresh operation. Under the biasing during the read operation, the junction between the second portion of the P− body region 122 and the P+ drain region 124 may be forward biased. A predetermined amount of majority charge carriers (e.g., holes) may flow from the P+ drain region 124 to the first portion of the P− body region 122 via the second portion of the P− body region 122. The flow of predetermined amount of majority charge carriers from the P+ drain region 124 may gradually lower the voltage potential at the P+ drain region 124. The voltage potential at the second portion of the P− body region 122 may be also gradually lowered. Also, the junction between first portion of the P− body region 122 and the N+ source region 120 may be forward biased and thus a predetermined amount of electrons may flow from the N+ source region 120 to the first portion of the P− body region 122. The flow of electrons may facilitate the flow of majority charge carriers (e.g., holes) to the first portion of the P− body region 122. The voltage potential applied to the word line (WL) 28 (e.g., that may be capacitively coupled to the first portion of the P− body region 122) may be lowered from −1.0V to −2.0V and thus a predetermined amount of majority charge carriers may be accumulated/stored in the first portion of the P− body region 122. Thus, the predetermined amount of majority charge carriers (e.g., holes) accumulated/stored in the first portion of the P− body region 122 may be restored to the first portion of the P− body region 122 and a logic low (e.g., binary "0" data state) may be refreshed.

Figure 10:
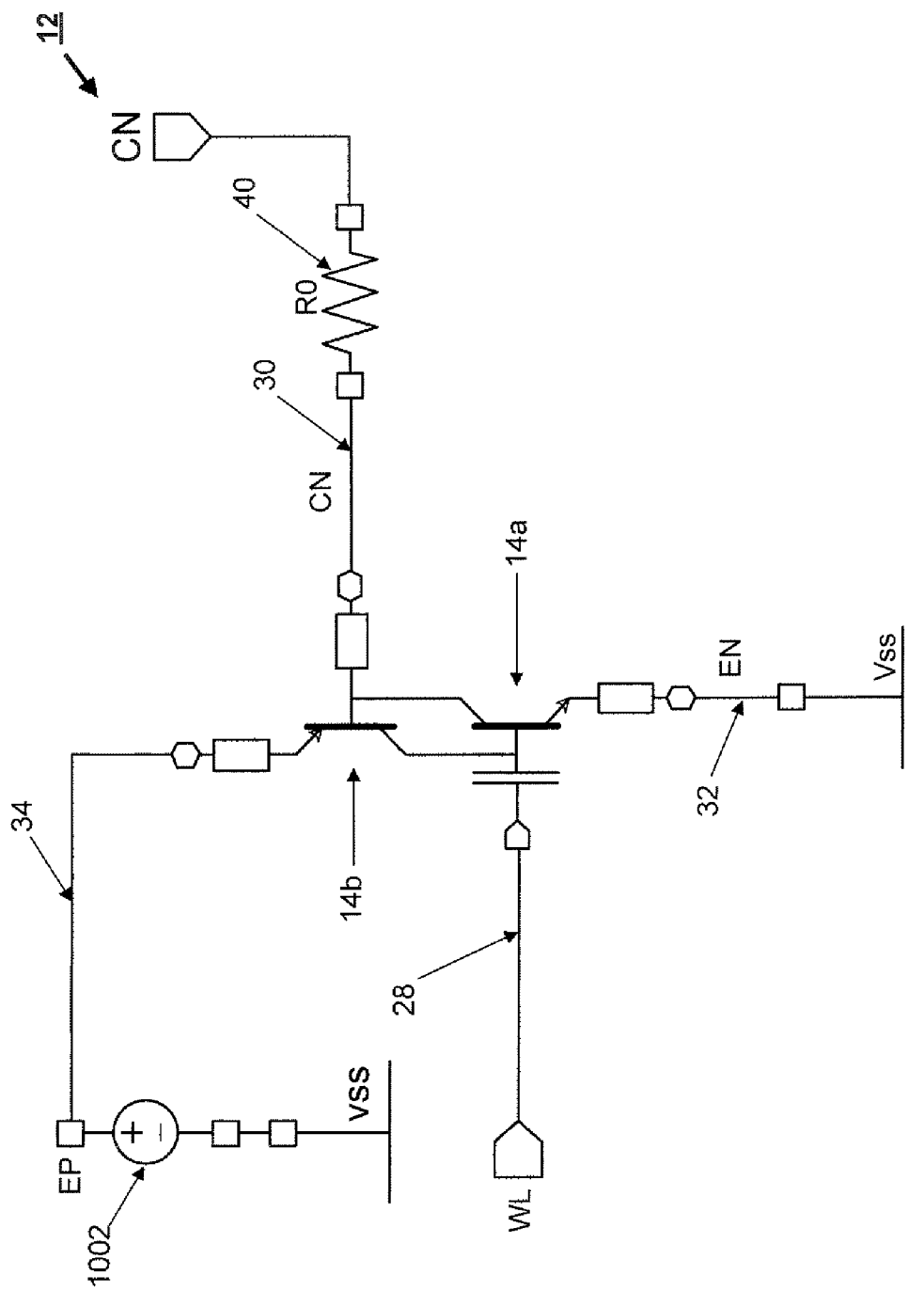
FIG. 10 shows a schematic diagram of a memory cell of the memory cell array in accordance with an alternate embodiment of the present disclosure.

Referring to FIG. 10, there is shown a schematic diagram of a memory cell 12 of the memory cell array 20 in accordance with an alternate embodiment of the present disclosure. The memory cell 12 illustrated in FIG. 10 may be similar to the memory cell 12 illustrated in FIG. 4, except that the carrier injection line (EP) 34 may be coupled to a constant power source 1002 (e.g., a voltage potential source and/or a current source). Various control signals may be applied to the memory cell 12 via the bit line (CN) 30 and the decoupling resistor 40 in order to properly bias the memory cell 12 to perform various operations (e.g., read or write operations).

The respective bit line (CN) 30 may be coupled to a data sense amplifier circuit of the data write and sense circuitry 36. For example, the respective bit line (CN) 30 may be coupled to the data write and sense circuitry 36 via a decoupling resistor 40. The decoupling resistor 40 may have a predetermined resistance in order to lower a barrier voltage potential of the junction between the second portion of the P− body region 122 and the P+ drain region 124 during various operations (e.g., read or write operations). In an exemplary embodiment, the decoupling resistor 40 may have a resistance so that the voltage potential and/or current generated by the selected memory cells 12 may lower an energy barrier at the junction between the second portion of the P− body region 122 and the P+ drain region 124.

Figure 11:
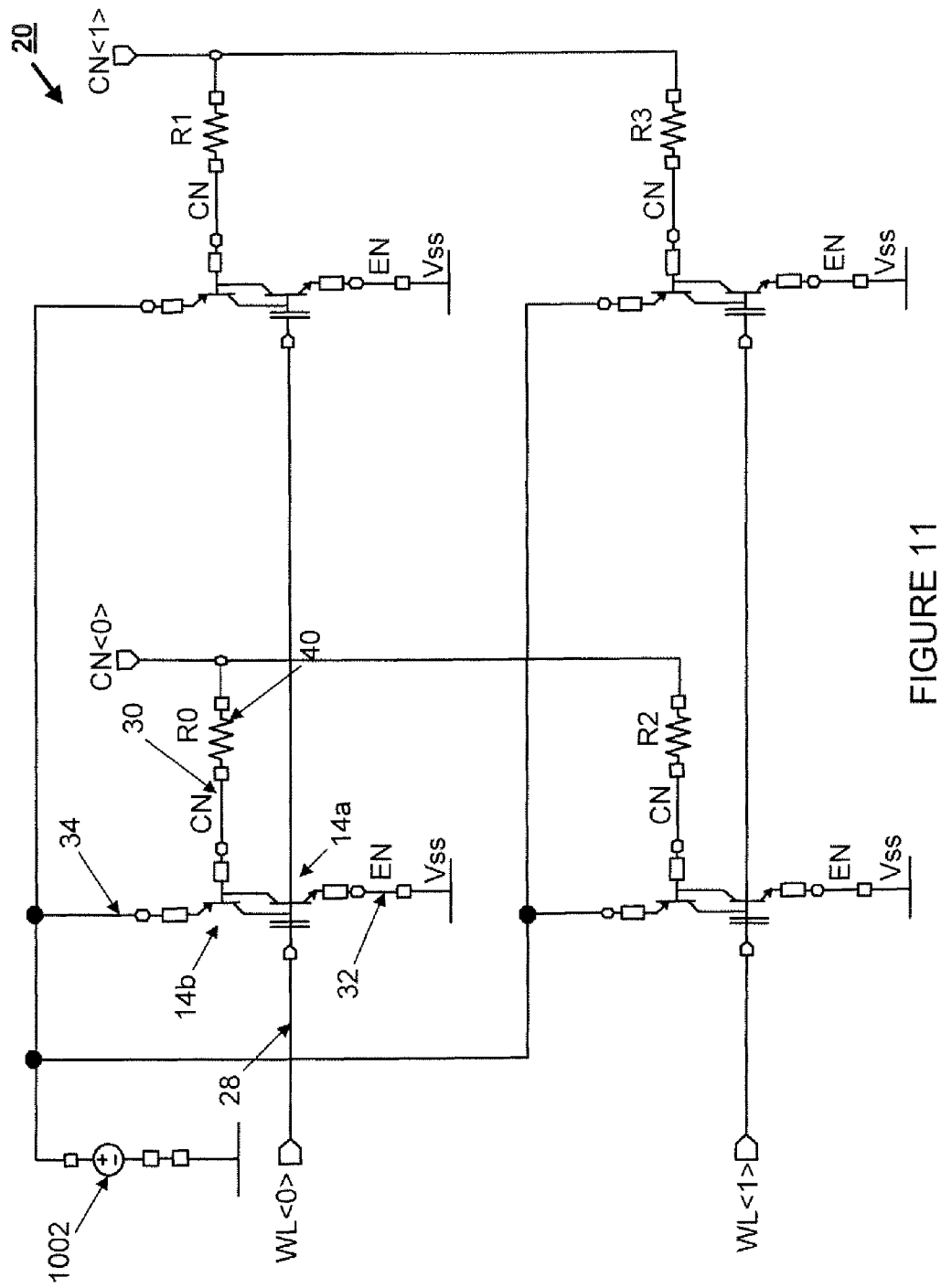
FIG. 11 shows a schematic diagram of at least a portion of a memory cell array having a plurality of memory cells as shown in FIG. 10 in accordance with an alternative embodiment of the present disclosure.

Referring to FIG. 11, there is shown a schematic diagram of at least a portion of a memory cell array 20 having a plurality of memory cells 12 as shown in FIG. 10 in accordance with an alternative embodiment of the present disclosure. The memory cell array 20 illustrated in FIG. 11 may be similar to the memory cell array 20 illustrated in FIG. 5, except that the carrier injection line (EP) 34 may be coupled to the constant power source 1002. In an exemplary embodiment, a plurality of rows and columns of memory cells 12 of the memory cell array 20 may be coupled to the constant power source 1002. It may be appreciated by one skilled in the art that the number of rows and columns of memory cells 12 coupled to the constant power source 1002 may vary, for example symmetrical, but not limited to, four rows by four columns, sixteen rows by sixteen columns, thirty-two rows by thirty-two columns, sixty-four rows by sixty-four columns, etc. Also, the number of rows and columns of memory cells 12 coupled to the constant power source 1002 may be asymmetrical, for example, but not limited to, four rows by two columns, eight rows by four columns, sixteen rows by thirty-two columns, etc.

As discussed above, the memory cell 12 may be coupled to a respective word line (WL) 28, a respective bit line (CN) 30, a respective source line (EN) 32, and/or a respective carrier injection line (EP) 34. The respective bit line (CN) 30 may be coupled to a data sense amplifier circuit of the data write and sense circuitry 36. For example, the respective bit line (CN) 30 may be coupled to the data write and sense circuitry 36 via the decoupling resistor 40. Also, various control signals may be applied to the memory cells 12 via the bit line (CN) 30 in order to properly bias the memory cells 12 to perform various operations.

Figure 12:
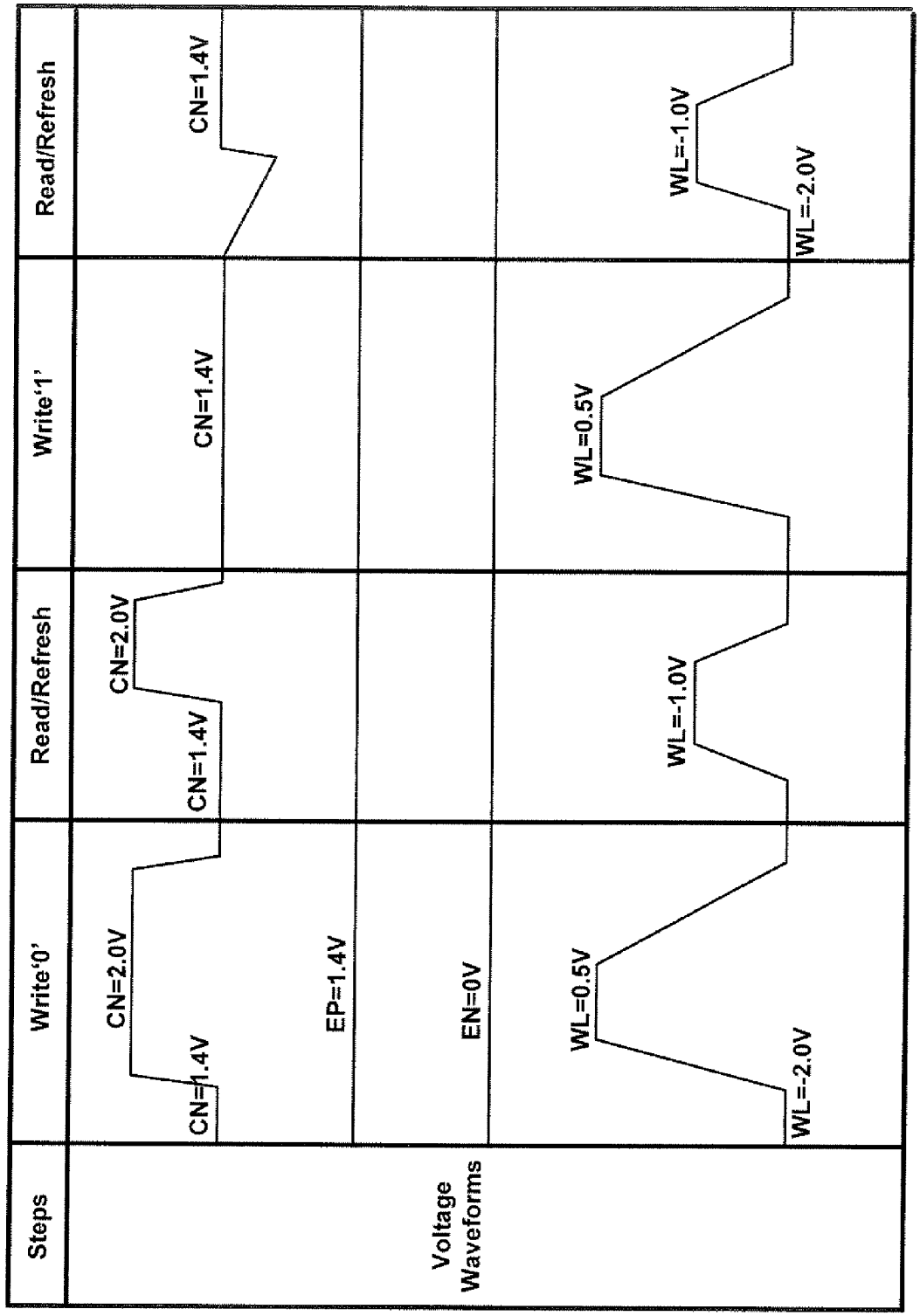
FIG. 12 shows control signal voltage waveforms for performing various operations on memory cells as shown in FIG. 11 in accordance with an alternate embodiment of the present disclosure.

Referring to FIG. 12, there are shown control signal voltage waveforms for performing a refresh operation on memory cells 12 as shown in FIG. 11 in accordance with an alternate embodiment of the present disclosure. For example, the refresh operation may include control signals configured to perform one or more operations. In an exemplary embodiment, the refresh operation may include control signals to perform a write logic low (e.g., binary "0" data state) operation, a read operation, a write logic high (e.g., binary "1" data state) operation, and/or a read operation. Prior to performing a refresh operation, the control signals may be configured to perform a hold operation in order to maintain a data state (e.g., a logic high (binary "1" data state) or a logic low (binary "0" data state)) stored in the memory cell 12. In particular, the control signals may be configured to perform a hold operation in order to maximize a retention time of a data state (e.g., a logic low (binary "0" data state) and/or a logic high (binary "1" data state)) stored in the memory cell 12. Also, the control signals for the hold operation may be configured to eliminate or reduce activities or field (e.g., electrical fields between junctions which may lead to leakage of charges) within the memory cell 12. In an exemplary embodiment, during hold operation, a negative voltage potential may be applied to the word line (WL) 28 that may be capacitively coupled to the first portion of the P− body region 122 of the memory cell 12, while a positive voltage potential may be applied to the bit line (CN) 30 to the second portion of the P− body region 122 and/or the P+ drain region 124. The voltage potentials applied to the N+ source region 120 may be coupled to an electrical ground (Vss). For example, the negative voltage potential applied to the word line (WL) 28 (e.g., capacitively coupled to the P− region 122 of the memory cell 12) may be −2.0V. The positive voltage potential applied to the first portion of the P− body region 122 may be 1.4V. Also, the positive voltage potential applied to the P+ drain region 124 may be 1.4V. During the hold operation, the junction between the N+ source region 120 and first portion of the P− body region 122 and the junction between the P+ drain region 124 and the second portion of the P− body region 122 may be reverse biased in order to retain a data state (e.g., a logic high (binary "1" data state) or a logic low (binary "0" data state)) stored in the memory cell 12.

In an exemplary embodiment, control signals may be configured to perform one or more write logic low (e.g., binary "0" data state) operations to one or more selected memory cells 12. For example, the write logic low (e.g., binary "0" data state) operation may be performed to one or more selected memory cells 12 in order to deplete majority charge carriers that may have accumulated/stored in the P− body regions 122 of the one or more selected memory cells 12. Various voltage potentials may be applied to the various regions of the memory cell 12. The voltage potential applied to the N+ source region 120 may be maintained at the holding operation voltage potential (e.g., electrical ground (Vss)). The voltage potential applied to the P+ drain region 124 may be maintained at a constant voltage potential by the constant power source 1002 (e.g., at 1.4V). The voltage potential applied to the word line (WL) 28 that may be capacitively coupled to a first portion of the P− body region 122 may be raised from a voltage potential applied during the hold operation. The voltage potential applied to the bit line (CN) 30 to the second portion of the P− body region 122 may be raised from a voltage potential applied during the hold operation. In an exemplary embodiment, the voltage potential applied to the word line (WL) 28 that may be capacitively coupled to the first portion of the P− body region 122 may be raised to 0.5V from −2.0V. The voltage potential applied to the bit line (CN) 30 to the second portion of the P− body region 122 may be raised to 2.0V from 1.4V.

Under such biasing, the junction between the N+ source region 120 and the first portion of the P− body region 122 and the junction between the first portion of the P– body region 122 and the second portion of the P– body region 122 may be forward biased. The junction between the second portion of the P– body region 122 and the P+ drain region 124 may be reverse biased. The majority charge carriers (e.g., holes) that may have accumulated/stored in the first portion of the P– body region 122 may flow to the second portion of the P– body region 122 and lower a voltage potential barrier at the junction between the second portion of the P– body region 122 and the P+ drain region 124. Also, the majority charge carrier (e.g., holes) that may have accumulated/stored in the first portion of the P– body region 122 may flow to the N+ source region 120. Thus, the majority charge carriers (e.g., hole) that may have accumulated/stored in the first portion of the P– body region 122 may be depleted via the second portion of the P– body region 122 and/or the N+ source region 120. By removing the majority charge carriers that may have accumulated/stored in first portion of the P– body region 122, a logic low (e.g., binary "0" data state) may be written to the memory cell 12.

In an exemplary embodiment, control signals may be configured to perform a read operation of a data state (e.g., a logic low (binary "0" data state) and/or a logic high (binary "1" data state)) stored in one or more selected memory cells 12 of one or more selected rows of the memory cell array 20. The controls signals may be also configured to perform a refresh operation of a data state (e.g., a logic low (binary "0" data state) and/or a logic high (binary "1" data state)) stored in one or more selected memory cells 12 of the one or more selected rows of the memory cell array 20. In an exemplary embodiment, the control signals may be configured to perform a read operation and a refresh operation simultaneously.

The control signals may be configured to a predetermined voltage potential to implement a read operation via the bit line (CN) 30 and/or a refresh operation. In an exemplary embodiment, the N+ source region 120 may be coupled to an electrical ground (Vss) via the source line (EN) 32 and the constant voltage potential applied to the P+ drain region 124 may be maintained at 1.4V. The voltage potential applied to the word line (WL) 28 that may be capacitively coupled to the first portion of the P– body region 122 and the voltage potential applied to the bit line (CN) 30 to the second portion of the P– body region 122 may be raised from the voltage potentials applied during the hold operation. In an exemplary embodiment, the voltage potential applied to the word line (WL) 28 that may be capacitively coupled to the first portion of the P– body region 122 may be raised to –1.0V from –2.0V. The voltage potential applied to the bit line (CN) 30 to the second portion of the P– body region 122 via the decoupling resistor 40 may be raised to 2.0V from 1.4V.

Under such biasing, when a logic low (e.g., binary "0" data state) is stored in the memory cell 12, the predetermined amount of majority charge carriers (e.g., holes) accumulated/stored in the first portion of the P– body region 122 may flow toward the second portion of the P– body region 122. The predetermined amount of majority charge carriers flown to the second portion of the P– body region 122 may lower a voltage potential at the second portion of the P– body region 122. Also, the predetermined amount of majority charge carriers flown to the second portion of the P– body region 122 may lower the voltage potential barrier at the junction between the second portion of the P– body region 122 and the P+ drain region 124. However, the junction between the second portion of the P– body region 122 and the P+ drain region 124 may remain reverse biased or become weakly forward biased (e.g., above a reverse bias voltage and below a forward bias threshold voltage potential). A small amount of voltage potential and current or no voltage potential and current (e.g., compared to a reference voltage potential or current) may be generated when the junction between the second portion of the P– body region 122 and the P+ drain region 124 is reverse biased or weakly forward biased. A data sense amplifier in the data write and sense circuitry 36 may detect the small amount of voltage potential or current (e.g., compared to a reference voltage potential or current) or no voltage potential or current via the bit line (CN) 30 coupled to the second portion of the P– body region 122.

Simultaneously to the read operation, the control signals may be configured to perform a refresh operation. Under the biasing during the read operation, the junction between the first portion of the P– body region 122 and the N+ source region 120 may be forward biased. A predetermined amount of residual majority charge carriers (e.g., holes) that may have accumulated/stored in the first portion of the P– body region 122 may be depleted from the first portion of the P– body region 122 via the N+ source region 120. Also, as discussed above, a predetermined amount of majority charge carriers (e.g., holes) accumulated/stored in the first portion of the P– body region 122 may flow from the first portion of the P– body region 122 to the second portion of the P– body region 122 and thus lowering the voltage potential at the second portion of the P– body region 122. Thus, the majority charge carriers (e.g., holes) accumulated/stored in the first portion of the P– body region 122 may be depleted from the first portion of the P– body region 122 and a logic low (e.g., binary "0" data state) may be refreshed.

In an exemplary embodiment, control signals may be configured to write a logic high (e.g., binary "1" data state) to one or more selected memory cells 12 of one or more selected rows of the memory cell array 20. For example, the write logic high (e.g., binary "1" data state) operation may be performed on one or more selected rows of the memory cell array 20 or the entire memory cell array 20. In another exemplary embodiment, write logic high (e.g., binary "1" data state) operation may have control signals configured to cause accumulation/storage of majority charge carriers in the P– body region 122.

In an exemplary embodiment, the N+ source region 120 of the memory cell 12 may be coupled to an electrical ground (Vss) via the source line (EN) 32 and a constant voltage potential applied to the P+ drain region 124 of the memory cells 12 via the carrier injection line (EP) 34 may be maintained at the same voltage potential as the voltage potential applied during the hold operation. For example, a voltage potential applied to the P+ drain region 124 may be maintained at 1.4V.

The voltage potential applied to the word line (WL) 28 that may be capacitively coupled to the first portion of the P– body region 122 may be raised from the voltage potentials applied during the hold operation. For example, the voltage potential applied to the word line (WL) 28 that may be capacitively coupled to the first portion of the P– body region 122 may be raised to 0.5V from –2.0V. The voltage potential applied to the bit line (CN) 30 to the second portion of the P– body region 122 may be maintained at the same voltage potential as the voltage potential applied during the hold operation. For example, the voltage potential applied to the bit line (CN) 30 to the second portion of the P– body region 122 may be maintained at 1.4V.

Under such biasing, the junction between the N+ source region 120 and the first portion of the P– body region 122, the junction between the first portion of the P– body region 122 and the second portion of the P– body region 122, and the junction between the second portion of the P– body region 122 and the P+ drain region 124 may become forward biased. For example, the majority charge carriers (e.g., holes) at the first portion of the P− body region 122 may flow toward the second portion of the P− body region 122. The flow of majority charge carriers to the second portion of the P− body region 122 may lower a voltage potential at the second portion of the P− body region 122 and thus lowering a voltage potential barrier at the junction between the second portion of the P− body region 122 and the P+ drain region 124. The junction between the second portion of the P− body region 122 and the P+ drain region 124 may become forward biased (e.g., above a forward bias threshold voltage potential). Additional majority charge carriers (e.g., holes) may flow through the forward biased junction between the P+ drain region 124 and the second portion of the P− body region 122 toward the first portion of the P− body region 122. Subsequently, the voltage potential applied on the word line (WL) 28 that may be capacitively coupled to the first portion of the P− body region 122 may be lowered to −2.0V from 0.5V. Thu, a predetermined amount of majority charge carriers (e.g., holes) may be accumulated/stored in the first portion of the P− body region 122 via the P+ drain region 124 and the second portion of the P− body region 122. The predetermined amount of charge carriers accumulated/stored in the first portion (e.g., capacitively coupled to word line (WL) 28 of the P− body region 122 may represent that a logic high (e.g., binary "1" data state) may be written in the memory cell 12.

Again, the control signals may be configured to perform a second read operation of a data state (e.g., a logic low (binary "0" data state) and/or a logic high (binary "1" data state)) stored in one or more selected memory cells 12 of one or more selected rows of the memory cell array 20. The controls signals may be also configured to perform a refresh operation of a data state (e.g., a logic low (binary "0" data state) and/or a logic high (binary "1" data state)) stored in one or more selected memory cells 12 of the one or more selected rows of the memory cell array 20. In an exemplary embodiment, the control signals may be configured to perform a read operation and a refresh operation simultaneously.

The control signals may be configured to a predetermined voltage potential to implement a read operation via the bit line (CN) 30 and/or a refresh operation. In an exemplary embodiment, the N+ source region 120 may be coupled to an electrical ground (Vss) via the source line (EN) 32 and the constant voltage potential applied to the P+ drain region 124 via the carrier injection line (EP) 34 may be maintained at 1.4V. Also, the voltage potential applied to the bit line (CN) 30 to the second portion of the P− body region 122 may be maintained at 1.4V. The voltage potential applied to the word line (WL) 28 that may be capacitively coupled to the first portion of the P− body region 122 may be raised from the voltage potentials applied during the hold operation. In an exemplary embodiment, the voltage potential applied to the word line (WL) 28 that may be capacitively coupled to the first portion of the P− body region 122 may be raised to −1.0V. The voltage potential applied to the P+ drain region 124 via the carrier injection line (EP) 34 may be raised to 1.4V.

Under such biasing, when a logic high (e.g., binary "1" data state) is stored in the memory cell 12, the predetermined amount of majority charge carriers (e.g., that may represent a logic high (e.g., binary "1" data state)) accumulated/stored in the first portion of the P− body region 122 may flow toward the second portion of the P− body region 122. The predetermined amount of majority charge carriers flown to the second portion of the P− body region 122 may lower a voltage potential at the second portion of the P− body region 122. The predetermined amount of majority charge carriers flown to the second portion of the P− body region 122 may lower the voltage potential barrier at the junction between the second portion of the P− body region 122 and the P+ drain region 124. The junction between the second portion of the P− body region 122 and the P+ drain region 124 may be forward biased (e.g., above a forward bias threshold voltage potential). A predetermined amount of voltage potential and/or current may be generated when the junction between the second portion of the P− body region 122 and the P+ drain region 124 is forward biased. A data sense amplifier in the data write and sense circuitry 36 may detect the generated voltage potential or current (e.g., compared to a reference voltage potential or current) via the bit line (ON) 30 and the decoupling resistor 40 coupled to the second portion of the P− body region 122.

Simultaneously to the read operation, the control signals may be configured to perform a refresh operation. Under the biasing during the read operation, the junction between the second portion of the P− body region 122 and the P+ drain region 124 may be forward biased. A predetermined amount of majority charge carriers (e.g., holes) may flow from the P+ drain region 124 to the first portion of the P− body region 122 via the second portion of the P− body region 122. The flow of predetermined amount of majority charge carriers from the P+ drain region 124 may cause a temporary lowering of the voltage potential at the P+ drain region 124. Also, the junction between first portion of the P− body region 122 and the N+ source region 120 may be forward biased and thus a predetermined amount of electrons may flow from the N+ source region 120 to the first portion of the P− body region 122. The flow of electrons may facilitate the flow of majority charge carriers (e.g., holes) to the first portion of the P− body region 122. The voltage potential applied to the word line (WL) 28 (e.g., that may be capacitively coupled to the first portion of the P− body region 122) may be lowered from −1.0V to −2.0V and thus a predetermined amount of majority charge carriers may be accumulated/stored in the first portion of the P− body region 122. Thus, the predetermined amount of majority charge carriers (e.g., holes) accumulated/stored in the first portion of the P− body region 122 may be restored to the first portion of the P− body region 122 and a logic low (e.g., binary "0" data state) may be refreshed.

Figure 13:
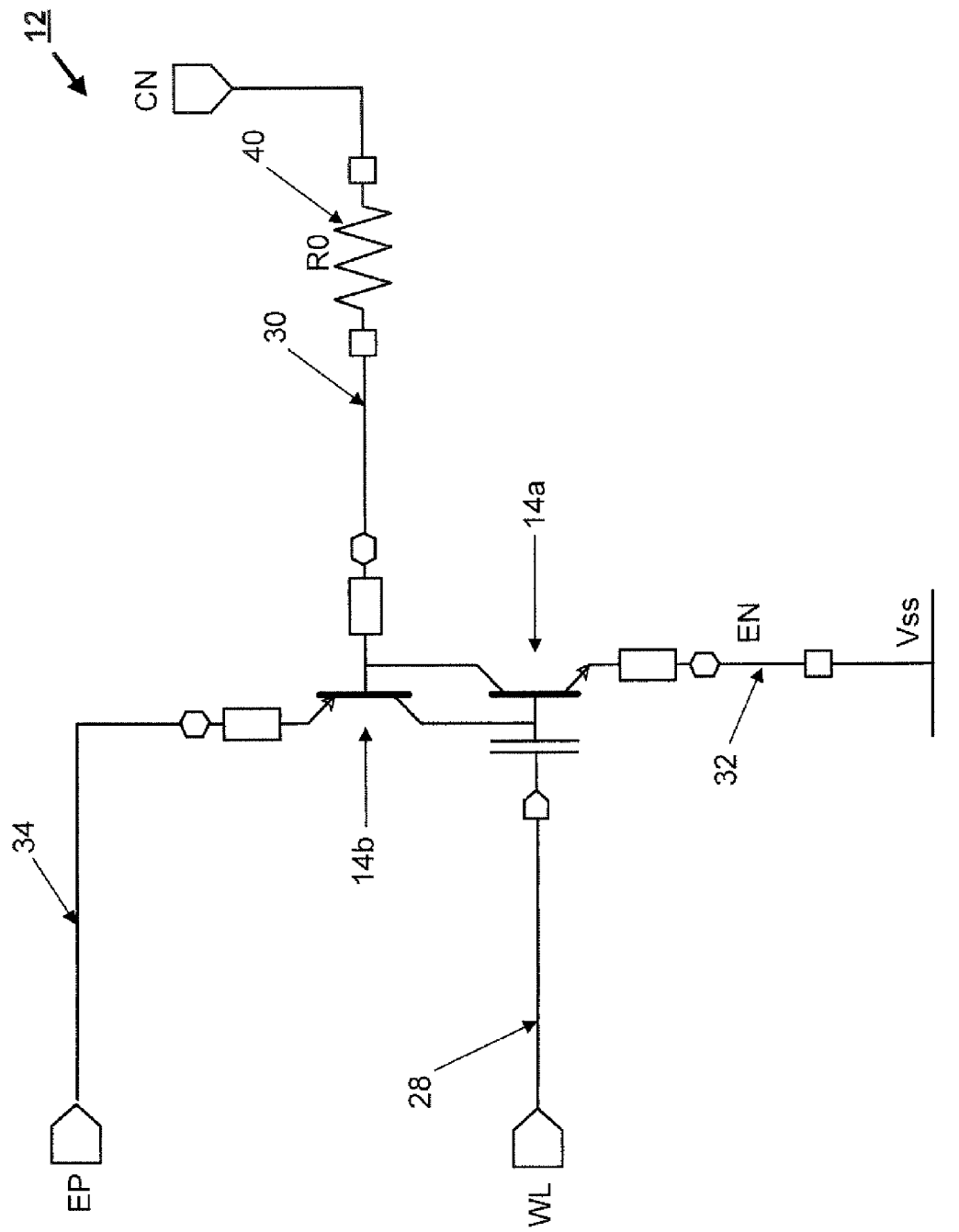
FIG. 13 shows a schematic diagram of a memory cell of the memory cell array in accordance with an alternate embodiment of the present disclosure.

Referring to FIG. 13, there is shown a schematic diagram of a memory cell 12 of the memory cell array 20 in accordance with an alternate embodiment of the present disclosure. The memory cell 12 illustrated in FIG. 13 may be similar to the memory cell 12 illustrated in FIG. 4, except that the bit line (CN) 30 may be coupled to a variable power source via the decoupling resistor 40. For example, various control signals may be applied to the bit line (CN) 30 via the decoupling resistor 40 in order to properly bias the memory cells 12 to perform various operations.

The respective bit line (CN) 30 may be coupled to a data sense amplifier circuit of the data write and sense circuitry 36. For example, the respective bit line (CN) 30 may be coupled to the data write and sense circuitry 36 via a decoupling resistor 40. The decoupling resistor 40 may have a predetermined resistance in order to lower a barrier voltage potential of the junction between the second portion of the P− body region 122 and the P+ drain region 124 during various operations (e.g., read or write operations). In an exemplary embodiment, the decoupling resistor 40 may have a resistance so that the voltage potential and/or current generated by the selected memory cells 12 may lower an energy barrier at the junction between the second portion of the P− body region 122 and the P+ drain region 124.

Figure 14:
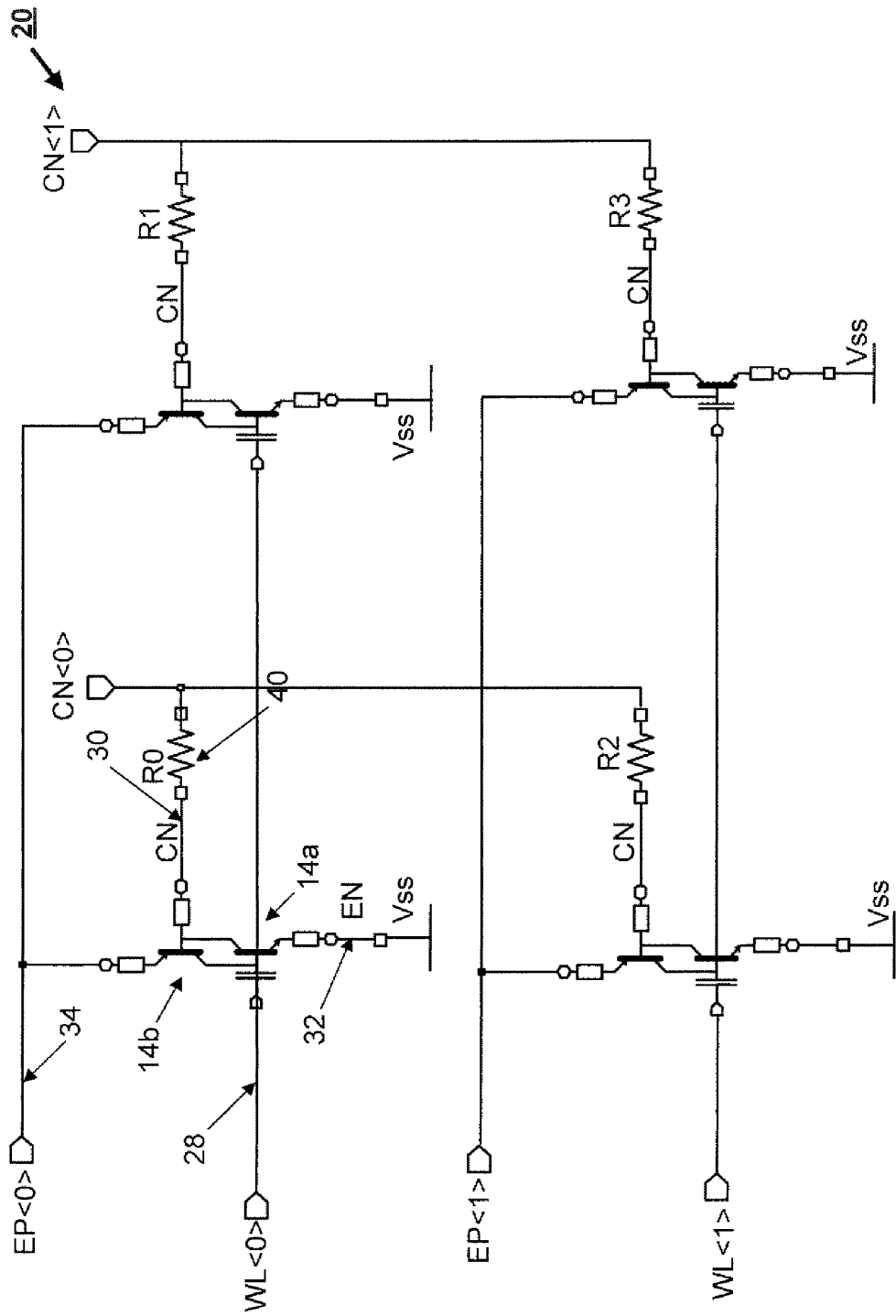
FIG. 14 shows a schematic diagram of at least a portion of a memory cell array having a plurality of memory cells as shown in FIG. 13 in accordance with an alternative embodiment of the present disclosure.

Referring to FIG. 14, there is shown a schematic diagram of at least a portion of a memory cell array 20 having a plurality of memory cells 12 as shown in FIG. 13 in accordance with an alternative embodiment of the present disclosure. The memory cell array 20 illustrated in FIG. 14 may be similar to the memory cell array 20 illustrated in FIG. 5, except that the bit line (CN) 30 may be coupled to a variable power source via the decoupling resistor 40. As discussed above, the memory cell 12 may be coupled to a respective word line (WL) 28, a respective bit line (CN) 30, a respective source line (EN) 32, and/or a respective carrier injection line (EP) 34. The respective bit line (CN) 30 may be coupled to a data sense amplifier circuit of the data write and sense circuitry 36. For example, the respective bit line (CN) 30 may be coupled to the data write and sense circuitry 36 via the decoupling resistor 40. The plurality of memory cells 12 configured in a row direction of the memory cell array 20 may be coupled to a respective carrier injection line (EP) 34.

Figure 15:
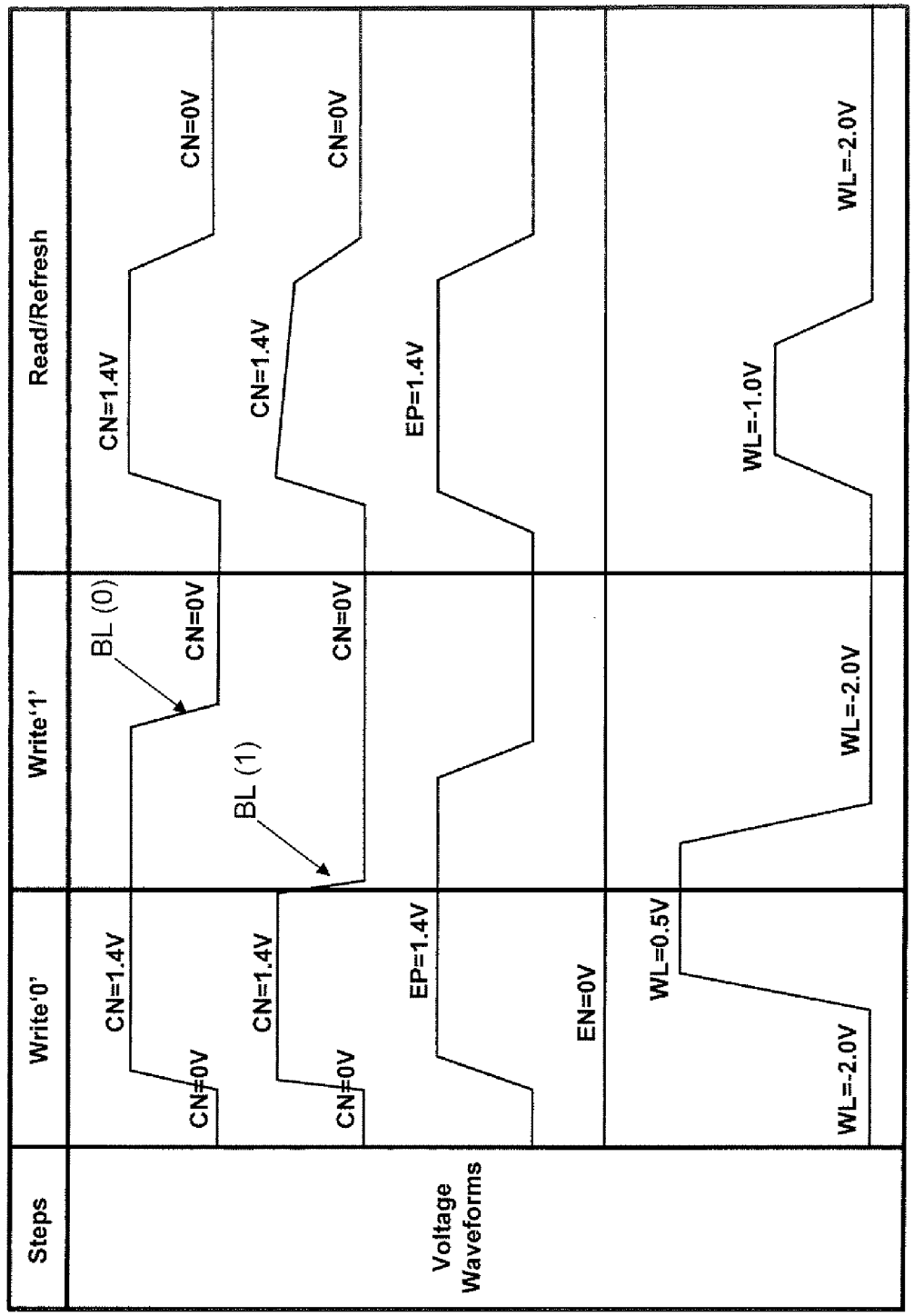
FIG. 15 shows control signal voltage waveforms for performing various operations on memory cells as shown in FIG. 14 in accordance with an embodiment of the present disclosure.

Referring to FIG. 15, there are shown control signal voltage waveforms for performing various operations on memory cells 12 as shown in FIG. 14 in accordance with an embodiment of the present disclosure. For example, the various operations may include control signals configured to perform a write logic low (e.g., binary "0" data state) operation, a write logic high (e.g., binary "1" data state) operation, a read operation, and/or a refresh operation. Prior to performing various operations, the control signals may be configured to perform a hold operation in order to maintain a data state (e.g., a logic high (binary "1" data state) or a logic low (binary "0" data state)) stored in the memory cell 12. In particular, the control signals may be configured to perform a hold operation in order to maximize a retention time of a data state (e.g., a logic low (binary "0" data state) and/or a logic high (binary "1" data state)) stored in the memory cell 12. Also, the control signals for the hold operation may be configured to eliminate or reduce activities or field (e.g., electrical fields between junctions which may lead to leakage of charges) within the memory cell 12. In an exemplary embodiment, during a hold operation, a negative voltage potential may be applied to the word line (WL) 28 that may be capacitively coupled to one or more portions of the P− body region 122 of the memory cell 12. The voltage potentials applied to other regions (e.g., the N+ source region 120 and/or P+ drain region 124) may be maintained at 0V.

For example, the negative voltage potential applied to the word line (WL) 28 (e.g., capacitively coupled to the P− region 122 of the memory cell 12) may be −2.0V. During the hold operation, the junction between the N+ source region 120 and first portion of the P− body region 122 and the junction between the P+ drain region 124 and the second portion of the P− body region 122 may be reverse biased in order to retain a data state (e.g., a logic high (binary "1" data state) or a logic low (binary "0" data state)) stored in the memory cell 12.

Control signals may be configured to perform one or more write logic low (e.g., binary "0" data state) operations to one or more selected memory cells 12. In an exemplary embodiment, a write logic low (e.g., binary "0" data state) operation may be performed on one or more selected rows of memory cells 12, whereby all of the memory cells 12 in the one or more selected rows of memory cells 12 are written to logic low (e.g., binary "0" data state). Thereafter, selected memory cells 12 in the one or more selected rows of memory cells 12 may be selectively written to a logic high (e.g., binary "1" data state).

For example, the write logic low (e.g., binary "0" data state) operation may be performed to one or more selected memory cells 12 in order to deplete charge carriers that may have accumulated/stored in the P− body regions 122 of the one or more selected memory cells 12. Various voltage potentials may be applied to the various regions of the memory cell 12. In an exemplary embodiment, the voltage potentials applied to the N+ source region 120 may be coupled to an electrical ground (Vss). The voltage potential applied to the word line (WL) 28 that may be capacitively coupled to a first portion of the P− body region 122 may be raised from a voltage potential applied during the hold operation. The voltage potential applied to the P+ drain region 124 and the voltage potential applied to the bit line (CN) 30 to the second portion of the P− body region 122 may be raised from a voltage potential applied during the hold operation. In an exemplary embodiment, the voltage potential applied to the word line (WL) 28 that may be capacitively coupled to the first portion of the P− body region 122 may be raised to 0.5V from −2.0V. The voltage potential applied to the P+ drain region 124 and the voltage potential applied to the bit line (CN) 30 to the second portion of the P− body region 122 may be raised to 1.4V from 0V.

Under such biasing, the junction between the N+ source region 120 and the first portion of the P− body region 122 and the junction between the first portion of the P− body region 122 and the second portion of the P− body region 122 may be forward biased. The junction between the second portion of the P− body region 122 and the P+ drain region 124 may be reverse biased. The majority charge carriers (e.g., holes) that may have accumulated/stored in the first portion of the P− body region 122 may flow to the second portion of the P− body region 122 and lower a voltage potential barrier at the junction between the second portion of the P− body region 122 and the P+ drain region 124. Also, the majority charge carrier (e.g., holes) that may have accumulated/stored in the first portion of the P− body region 122 may flow to the N+ source region 120. Thus, the majority charge carriers (e.g., holes) that may have accumulated/stored in first portion of the P− body region 122 may be depleted via the second portion of the P− body region 122 and/or the N+ source region 120. By removing the majority charge carriers that may have accumulated/stored in first portion of the P− body region 122, a logic low (e.g., binary "0" data state) may be written to the memory cell 12.

Subsequent to performing a write logic low (e.g., binary "0" data state) operation, control signals may be configured to write a logic high (e.g., binary "1" data state) to one or more selected memory cells 12 of one or more selected rows of the memory cell array 20. In an exemplary embodiment, a write logic high (e.g., binary "1" data state) operation may have control signals configured to cause accumulation/storage of majority charge carriers in the P− body region 122.

In an exemplary embodiment, a voltage potential applied to the N+ source region 120 of the memory cell 12 may be coupled to an electrical ground (Vss) via the source line (EN) 32. The voltage potential applied to the word line (WL) 28 that may be capacitively coupled to the first portion of the P− body region 122 and the voltage potential applied to P+ drain region 124 may be maintained as the same voltage potentials applied during the write logic low (e.g., binary "0" data state) operation. For example, the voltage potential applied to the word line (WL) 28 that may be capacitively coupled to the first portion of the P− body region 122 may be maintained at 0.5V. The voltage potential applied to the P+ drain region 124 via the carrier injection line (EP) 34 may be maintained at 1.4V. The voltage potential applied to the bit line (CN) 30 to the second portion of the P− body region 122 may be lowered from the voltage potential applied during the write logic low (e.g., binary "0" data state) operation. In an exemplary embodiment, the voltage potential applied to the bit line (CN) 30 to the second portion of the P− body region 122 may be lowered to 0V from 1.4V.

Under such biasing, the junction between the N+ source region 120 and the first portion of the P− body region 122, the junction between the first portion of the P− body region 122 and the second portion of the P− body region 122, and the junction between the second portion of the P− body region 122 and the P+ drain region 124 may become forward biased. For example, the majority charge carriers (e.g., holes) at the first portion of the P− body region 122 may flow toward the second portion of the P− body region 122. For example, majority charge carriers (e.g., holes) may flow through the forward biased junction between the P+ drain region 124 and the second portion of the P− body region 122 toward the first portion of the P− body region 122. Subsequently, the voltage potential applied on the word line (WL) 28 that may be capacitively coupled to the first portion of the P− body region 122 may be lowered to −2.0V from 0.5V. Thu, a predetermined amount of majority charge carriers (e.g., holes) may be accumulated/stored in the first portion of the P− body region 122 via the P+ drain region 124 and the second portion of the P− body region 122. The predetermined amount of charge carriers accumulated/stored in the first portion of the P− body region 122 may represent that a logic high (e.g., binary "1" data state) may be written in the memory cell 12.

In an exemplary embodiment, control signals may be configured to perform a read operation of a data state (e.g., a logic low (binary "0" data state) and/or a logic high (binary "1" data state)) stored in one or more selected memory cells 12 of one or more selected rows of the memory cell array 20. The controls signals may be also configured to perform a refresh operation of a data state (e.g., a logic low (binary "0" data state) and/or a logic high (binary "1" data state)) stored in one or more selected memory cells 12 of the one or more selected rows of the memory cell array 20. In an exemplary embodiment, the control signals may be configured to perform a read operation and a refresh operation simultaneously.

The control signals may be configured to a predetermined voltage potential to implement a read operation via the bit line (CN) 30 and/or a refresh operation. In an exemplary embodiment, the N+ source region 120 may be coupled to an electrical ground (Vss) via the source line (EN) 32. The voltage potential applied to the word line (WL) 28 that may be capacitively coupled to the first portion of the P− body region 122, the voltage potential applied to the P+ drain region 124, the voltage potential applied to the bit line (CN) 30 to the second portion of the P− body region 122 may be raised from the voltage potentials applied during the hold operation. In an exemplary embodiment, the voltage potential applied to the word line (WL) 28 that may be capacitively coupled to the first portion of the P− body region 122 may be raised to −1.0V. The voltage potential applied to the P+ drain region 124 via the carrier injection line (EP) 34 may be raised to 1.4V. The voltage potential applied to the bit line (CN) 30 to the second portion of the P− body region 122 may be raised to 1.4V.

Under such biasing, when a logic low (e.g., binary "0" data state) is stored in the memory cell 12, the predetermined amount of majority charge carriers (e.g., holes) accumulated/stored in the first portion of the P− body region 122 may flow toward the second portion of the P− body region 122. The predetermined amount of majority charge carriers (e.g., represent a logic low (e.g., binary "0" data state)) flown to the second portion of the P− body region 122 may lower a voltage potential at the second portion of the P− body region 122. Also, the predetermined amount of majority charge carriers flown to the second portion of the P− body region 122 may lower the voltage potential barrier at the junction between the second portion of the P− body region 122 and the P+ drain region 124. However, the junction between the second portion of the P− body region 122 and the P+ drain region 124 may remain reverse biased or become weakly forward biased (e.g., above a reverse bias voltage and below a forward bias threshold voltage potential). A small amount of voltage potential and current or no voltage potential and current (e.g., compared to a reference voltage potential or current) may be generated when the junction between the second portion of the P− body region 122 and the P+ drain region 124 is reverse biased or weakly forward biased. A data sense amplifier in the data write and sense circuitry 36 may detect the small amount of voltage potential or current (e.g., compared to a reference voltage potential or current) or no voltage potential or current via the bit line (CN) 30 coupled to the second portion of the P− body region 122.

In another exemplary embodiment, when a logic high (e.g., binary "1" data state) is stored in the memory cell 12, the predetermined amount of majority charge carriers (e.g., that may represent a logic high (e.g., binary "1" data state)) accumulated/stored in the first portion of the P− body region 122 may flow toward the second portion of the P− body region 122. The predetermined amount of majority charge carriers flown to the second portion of the P− body region 122 may lower a voltage potential at the second portion of the P− body region 122. The predetermined amount of majority charge carriers flown to the second portion of the P− body region 122 may lower the voltage potential barrier at the junction between the second portion of the P− body region 122 and the P+ drain region 124. The junction between the second portion of the P− body region 122 and the P+ drain region 124 may be forward biased (e.g., above a forward bias threshold voltage potential). A predetermined amount of voltage potential and/or current may be generated when the junction between the second portion of the P− body region 122 and the P+ drain region 124 is forward biased. A data sense amplifier in the data write and sense circuitry 36 may detect the generated voltage potential or current (e.g., compared to a reference voltage potential or current) at the second portion of the P− body region 122 via the bit line (CN) 30 and the decoupling resistor 40 coupled to the second portion of the P− body region 122.

Simultaneously to the read operation, the control signals may be configured to perform a refresh operation. The refresh operation may refresh a data state (e.g., a logic low (e.g., binary "0" data state) or a logic high (e.g., binary "1" data state)) stored in the memory cell 12. In an exemplary embodiment, when a logic low is stored in the memory cell 12 and under the biasing during the read operation, the junction between the first portion of the P− body region 122 and the N+ source region 120 may be forward biased. A predetermined amount of residual majority charge carriers (e.g., holes) accumulated/stored in the first portion of the P− body region 122 may be depleted from the first portion of the P− body region 122 via the N+ source region 120. Also, as discussed above, a predetermined amount of majority charge carriers (e.g., holes) accumulated/stored in the first portion of the P− body region 122 may flow from the first portion of the P− body region 122 to the second portion of the P− body region 122 and thus lowering the voltage potential at the second portion of the P− body region 122. Thus, the majority charge carriers (e.g., holes) accumulated/stored in the first portion of the P− body region 122 may be depleted from the first portion of the P− body region 122 and a logic low (e.g., binary "0" data state) may be refreshed.

In another exemplary embodiment, when a logic high (e.g., binary "1" data state) is stored in the memory cell 12 and under the biasing during the read operation, the junction between the second portion of the P– body region 122 and the P+ drain region 124 may be forward biased. A predetermined amount of majority charge carriers (e.g., holes) may flow from the P+ drain region 124 to the first portion of the P– body region 122 via the second portion of the P– body region 122. The flow of predetermined amount of majority charge carriers from the P+ drain region 124 may gradually lower the voltage potential at the P+ drain region 124. The voltage potential at the second portion of the P– body region 122 may be also gradually lowered. Also, the junction between first portion of the P– body region 122 and the N+ source region 120 may be forward biased and thus a predetermined amount of electrons may flow from the N+ source region 120 to the first portion of the P– body region 122. The flow of electrons may facilitate the flow of majority charge carriers (e.g., holes) to the first portion of the P– body region 122. The voltage potential applied to the word line (WL) (e.g., that may be capacitively coupled to the first portion of the P– body region 122) may be lowered from –1.0V to –2.0V and thus a predetermined amount of majority charge carriers may be accumulated/stored in the first portion of the P– body region 122. Thus, the predetermined amount of majority charge carriers (e.g., holes) accumulated/stored in the first portion of the P– body region 122 may be restored to the first portion of the P– body region 122 and a logic low (e.g., binary "0" data state) may be refreshed.

At this point it should be noted that providing techniques for refreshing a semiconductor memory device in accordance with the present disclosure as described above may involve the processing of input data and the generation of output data to some extent. This input data processing and output data generation may be implemented in hardware or software. For example, specific electronic components may be employed in a semiconductor memory device or similar or related circuitry for implementing the functions associated with providing techniques for refreshing a semiconductor memory device in accordance with the present disclosure as described above. Alternatively, one or more processors operating in accordance with instructions may implement the functions associated with providing techniques for refreshing a semiconductor memory device in accordance with the present disclosure as described above. If such is the case, it is within the scope of the present disclosure that such instructions may be stored on one or more processor readable media (e.g., a magnetic disk or other storage medium), or transmitted to one or more processors via one or more signals embodied in one or more carrier waves.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. A semiconductor memory device comprising:
a plurality of memory cells arranged in an array of rows and columns, each memory cell comprising:
a first region coupled to a source line;
a second region coupled to a carrier injection line;
a body region capacitively coupled to at least one word line and disposed between the first region and the second region; and
a bit line coupled to at least a portion of the body region via a decoupling resistor.

2. The semiconductor memory device according to claim 1, wherein the first region is an N-doped region and the second region is a P-doped region.

3. The semiconductor memory device according to claim 1, wherein the body region is an undoped region.

4. The semiconductor memory device according to claim 1, wherein the body region comprises a first portion and a second portion.

5. The semiconductor memory device according to claim 4, wherein the first portion of the body region and the second portion of the body region are different portions of the body region.

6. The semiconductor memory device according to claim 4, wherein the decoupling resistor is coupled to the second portion of the body region.

7. The semiconductor memory device according to claim 6, wherein the decoupling resistor is coupled to the second portion of the body region via the bit line.

8. The semiconductor memory device according to claim 1, wherein the at least one word line comprises a plurality of word lines that are capacitively coupled to the body region.

9. The semiconductor memory device according to claim 8, wherein the plurality of word lines are capacitively coupled to a plurality of side portions of the body region.

10. The semiconductor memory device according to claim 8, wherein each of the plurality of word lines are capacitively coupled to different portions on a common side of the body region.

11. The semiconductor memory device according to claim 8, wherein the each of the plurality of word lines are capacitively coupled to opposite side portions of the body region.

12. The semiconductor memory device according to claim 8, wherein the plurality of word lines comprise a first word line and a second word line.

13. The semiconductor memory device according to claim 12, wherein the first word line is capacitively coupled to a first portion of the body region and the second word line is capacitively coupled to a second portion of the body region.

14. The semiconductor memory device according to claim 1, wherein the decoupling resistor has a resistance that causes a current flow through the decoupling resistor between a current that represents a logic low and a current that represents a logic high.

15. A method for biasing a semiconductor memory device comprising the steps of:
applying a plurality of voltage potentials to a plurality of memory cells arranged in an array of rows and columns, wherein applying the plurality of voltage potentials to the plurality of memory cells comprises:
applying a first voltage potential to a first region via a respective source line of the array;
applying a second voltage potential to a second region via a respective carrier injection line of the array;
applying a third voltage potential to a first portion of a body region via at least one respective word line of the array that is capacitively coupled to the body region; and applying a fourth voltage potential to a second portion of the body region via a respective bit line of the array and a decoupling resistor;

wherein the body region is disposed between the first region and the second region.

16. The method according to claim 15, wherein the respective source line is coupled to an electrical ground.

17. The method according to claim 16, wherein the fourth voltage potential applied to the second portion of the body region is a constant voltage potential.

18. The method according to claim 17, further comprising increasing the third voltage potential applied to the at least one respective word line during a hold operation in order to perform a write logic low operation.

19. The method according to claim 17, further comprising maintaining the second voltage potential applied to the respective carrier injection line during a hold operation in order to perform a write logic low operation.

20. The method according to claim 17, further comprising increasing the second voltage potential applied to the respective carrier injection line and the third voltage potential applied to the at least one respective word line during a hold operation in order to perform a write logic high operation.

21. The method according to claim 17, further comprising increasing the second voltage potential applied to the respective carrier injection line and the third voltage potential applied to the at least one respective word line during a hold operation in order to perform a read operation.

22. The method according to claim 16, wherein the decoupling resistor and the respective bit line are coupled to the respective carrier injection line.

23. The method according to claim 22, further comprising increasing the third voltage potential applied to the at least one respective word line during a hold operation in order to perform a write logic low operation.

24. The method according to claim 22, further comprising maintaining the second voltage potential applied to the respective carrier injection line during a hold operation in order to perform a write logic low operation.

25. The method according to claim 22, further comprising increasing the second voltage potential applied to the respective carrier injection line and the third voltage potential applied to the at least one respective word line during a hold operation in order to perform a write logic high operation.

26. The method according to claim 22, further comprising increasing the second voltage potential applied to the respective carrier injection line and the third voltage potential applied to the at least one respective word line during a hold operation in order to perform a read operation.

27. The method according to claim 16, wherein the second voltage potential applied to the second region is a constant voltage potential.

28. The method according to claim 27, further comprising increasing the third voltage potential applied to the at least one respective word line and the fourth voltage potential applied to the respective bit line during a hold operation in order to perform a write logic low operation.

29. The method according to claim 27, further comprising maintaining the fourth voltage potential applied to the respective bit line during a hold operation in order to perform a write logic high operation.

30. The method according to claim 27, further comprising increasing the third voltage potential applied to the at least one respective bit line during a hold operation to perform a write logic high operation.

31. The method according to claim 27, further comprising increasing the third voltage potential applied to the at least one respective word line and the fourth voltage potential applied to the respective bit line during a hold operation in order to perform a read operation.

32. The method according to claim 16, further comprising increasing the second voltage potential applied to the respective carrier injection line, the third voltage potential applied to the at least one respective word line, and the fourth voltage potential applied to the respective bit line during a hold operation in order to perform a write logic low operation.

33. The method according to claim 16, further comprising increasing the second voltage potential applied to the respective carrier injection line and the third voltage potential applied to the at least one respective word line during a hold operation in order to perform a write logic high operation.

34. The method according to claim 16, further comprising increasing the second voltage potential applied to the respective carrier injection line and the third voltage potential applied to theat least one respective word line during a hold operation in order to perform a write logic high operation.

35. The method according to claim 17, further comprising increasing the second voltage potential applied to the respective carrier injection line, the third voltage potential applied to the at least one respective word line, and the fourth voltage potential applied to the respective bit line during a hold operation in order to perform a read operation.

* * * * *